(12) United States Patent
Nakagawa et al.

(10) Patent No.: US 7,964,288 B2
(45) Date of Patent: Jun. 21, 2011

(54) SEMICONDUCTOR DEVICE AND METHOD FOR MANUFACTURING THE SAME

(75) Inventors: Shinichi Nakagawa, Kawasaki (JP); Itsuro Sannomiya, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/947,275

(22) Filed: Nov. 16, 2010

(65) Prior Publication Data

US 2011/0059603 A1    Mar. 10, 2011

Related U.S. Application Data

(60) Division of application No. 12/139,720, filed on Jun. 16, 2008, now Pat. No. 7,859,045, which is a continuation of application No. PCT/JP2005/022917, filed on Dec. 14, 2005.

(51) Int. Cl.
   *H01L 21/28* (2006.01)
(52) U.S. Cl. .................................................. 428/594
(58) Field of Classification Search .......... 438/591–594, 438/266, 201; 257/315–316
   See application file for complete search history.

(56) References Cited

U.S. PATENT DOCUMENTS

| | | | |
|---|---|---|---|
| 6,667,511 B1 * | 12/2003 | Fang | 257/321 |
| 7,075,140 B2 | 7/2006 | Spadea | |
| 7,235,476 B2 | 6/2007 | Nakagawa | |
| 7,307,332 B2 | 12/2007 | Nakagawa | |
| 7,391,071 B2 | 6/2008 | Park et al. | |
| 7,504,688 B2 | 3/2009 | Nakagawa | |
| 7,642,592 B2 | 1/2010 | Koo et al. | |
| 7,652,324 B2 | 1/2010 | Liu | |
| 7,663,178 B2 | 2/2010 | Arai et al. | |
| 7,663,912 B2 | 2/2010 | Jeon | |
| 7,838,921 B2 * | 11/2010 | Willer et al. | 257/316 |
| 7,842,994 B2 * | 11/2010 | Yin et al. | 257/316 |
| 2001/0044184 A1 | 11/2001 | Tanaka | |
| 2001/0045590 A1 | 11/2001 | Kobayashi | |
| 2002/0011624 A1 | 1/2002 | Ishige | |
| 2003/0036234 A1 * | 2/2003 | Doi | 438/266 |
| 2003/0085421 A1 | 5/2003 | Takeuchi et al. | |
| 2005/0110071 A1 | 5/2005 | Ema et al. | |
| 2006/0226469 A1 | 10/2006 | Nakagawa | |
| 2007/0200166 A1 | 8/2007 | Nakagawa | |
| 2009/0191700 A1 | 7/2009 | Nakagawa | |

FOREIGN PATENT DOCUMENTS

JP    01-188857 A    7/1989

(Continued)

OTHER PUBLICATIONS

International Search Report of PCT/JP2005/022917, date of mailing Mar. 20, 2006.

*Primary Examiner* — Nathan W Ha
(74) *Attorney, Agent, or Firm* — Westerman, Hattori, Daniels & Adrian, LLP

(57) ABSTRACT

Disclosed is a method of manufacturing a semiconductor device, which includes exposing a photoresist using an exposing mask provided with a light-shielding pattern having two or more narrow width portions, developing the photoresist to form a plurality of stripe-shaped resist patterns, selectively etching a first conductive film using the resist pattern as a mask, forming an intermediate insulating film on the first conductive film, forming a second conductive film on the intermediate insulating film, and forming, by patterning the first conductive film, the intermediate insulating film, and the second conductive film, a flash memory cell and a structure constructed by forming a lower conductor pattern, a segment of the intermediate insulating film, and a dummy gate electrode in this stacking order.

8 Claims, 69 Drawing Sheets

FOREIGN PATENT DOCUMENTS

| | | |
|---|---|---|
| JP | 08-148658 A | 6/1996 |
| JP | 2000-286350 A | 10/2000 |
| JP | 2001-332708 A | 11/2001 |
| JP | 2005-129760 A | 5/2005 |
| JP | 2005-142362 A | 6/2005 |
| JP | 2005-244086 A | 9/2005 |

* cited by examiner

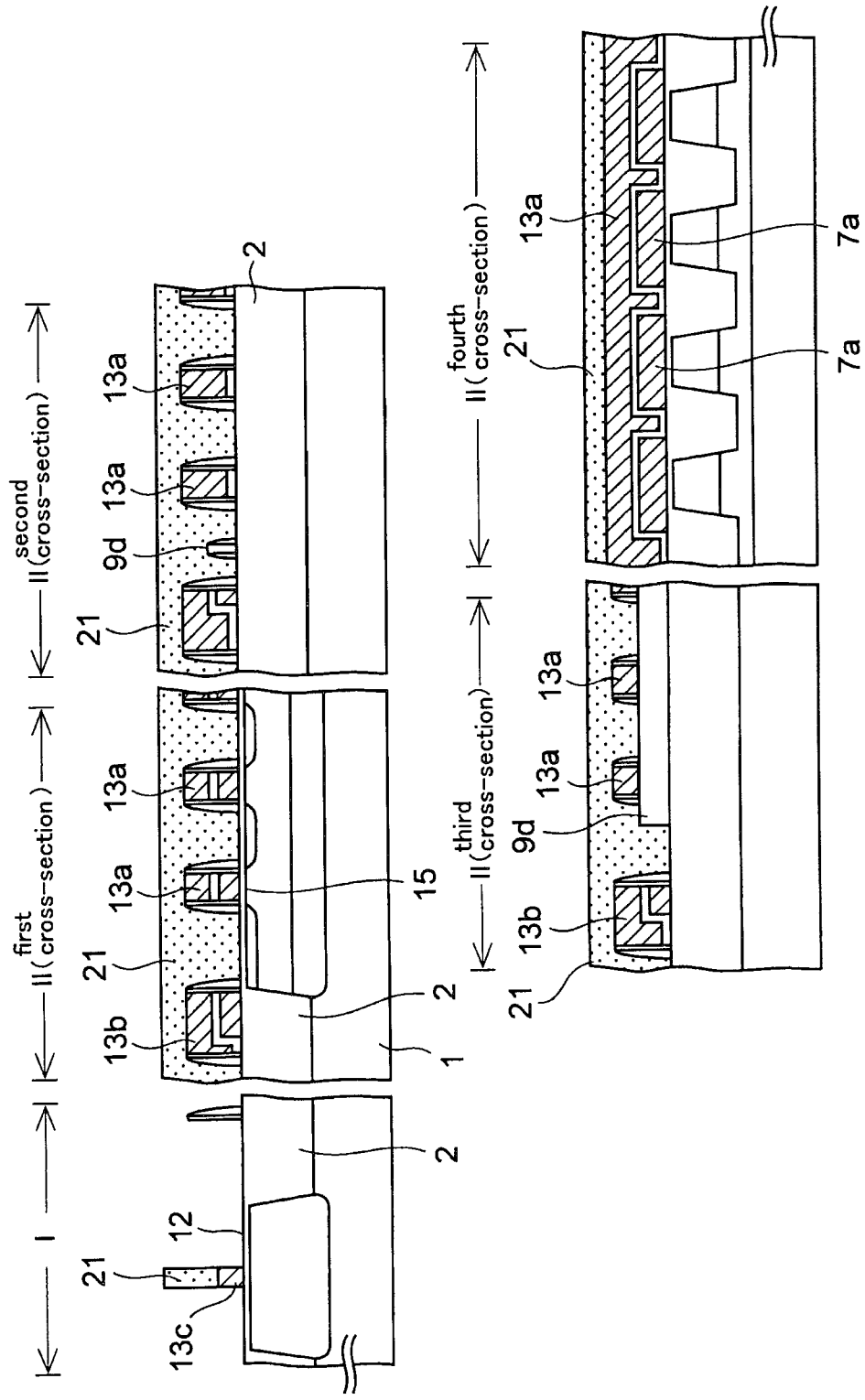

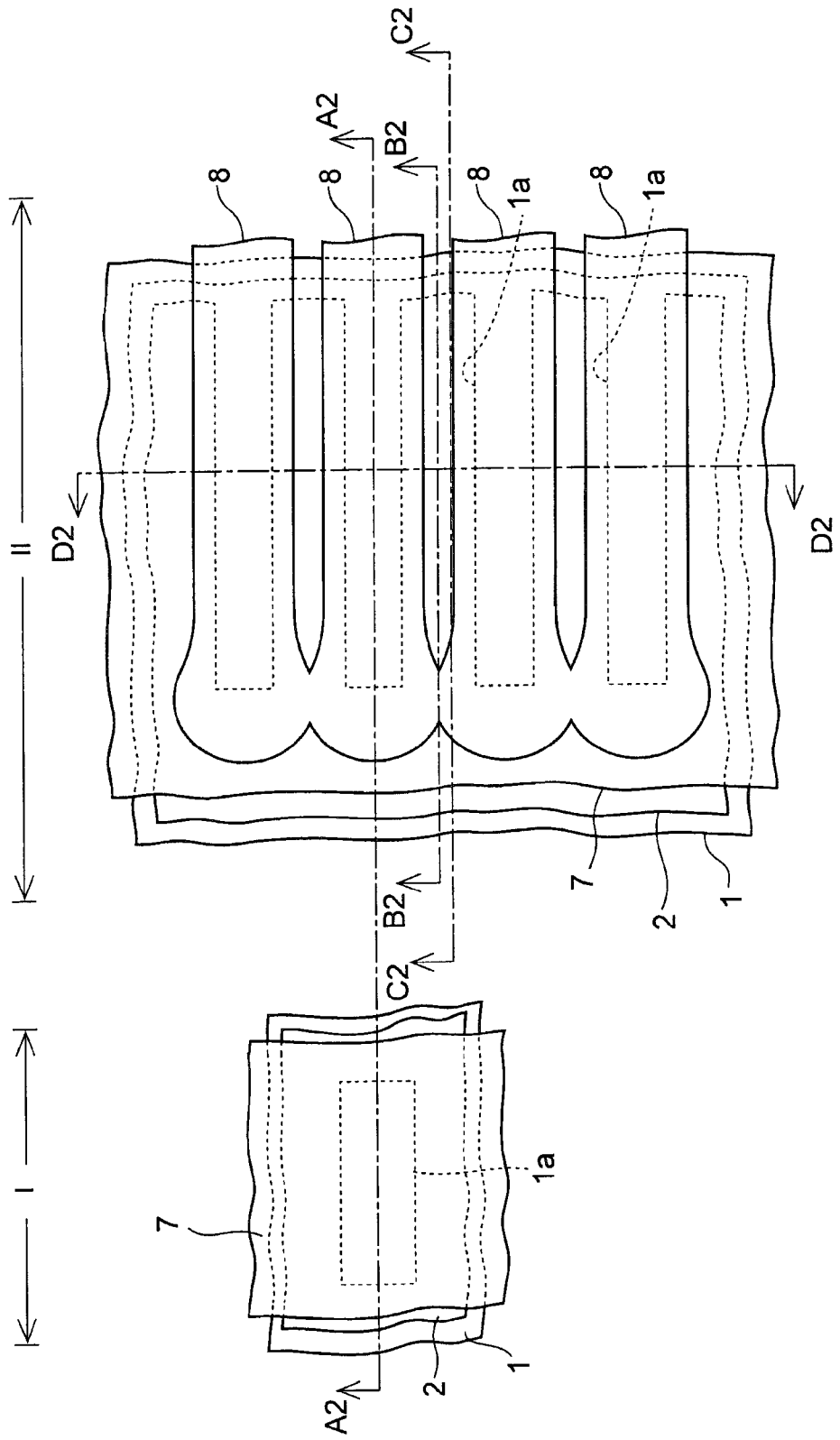

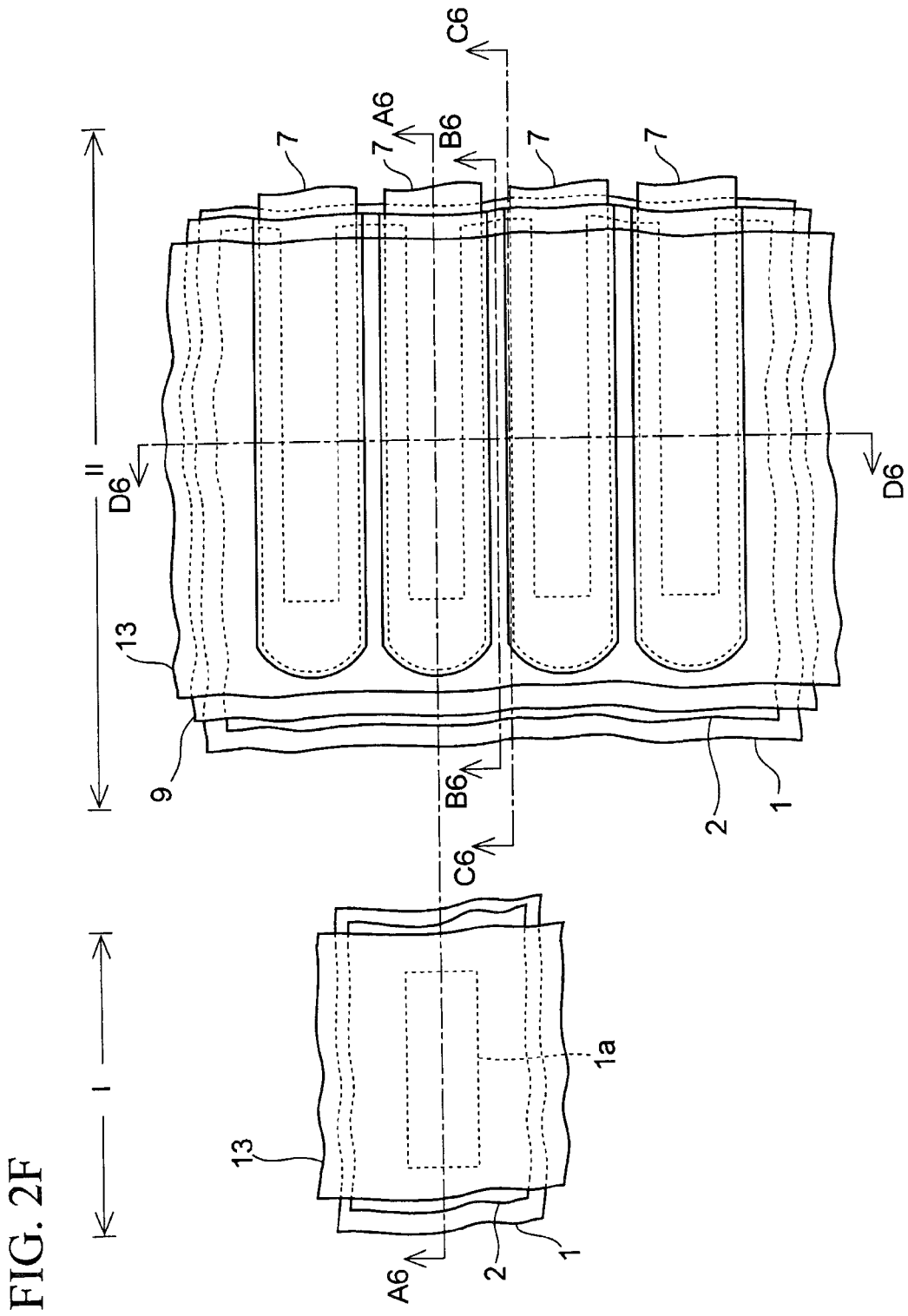

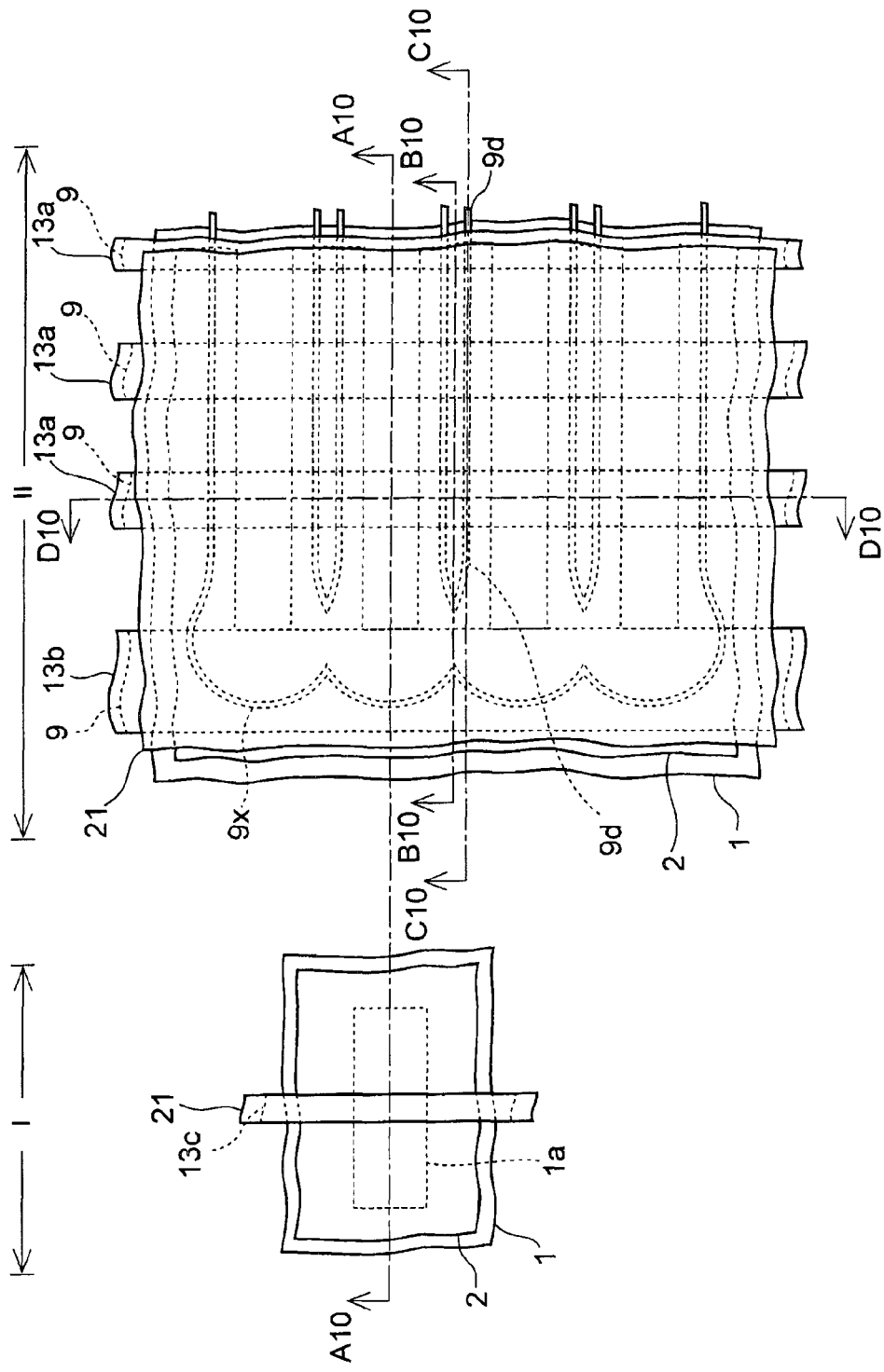

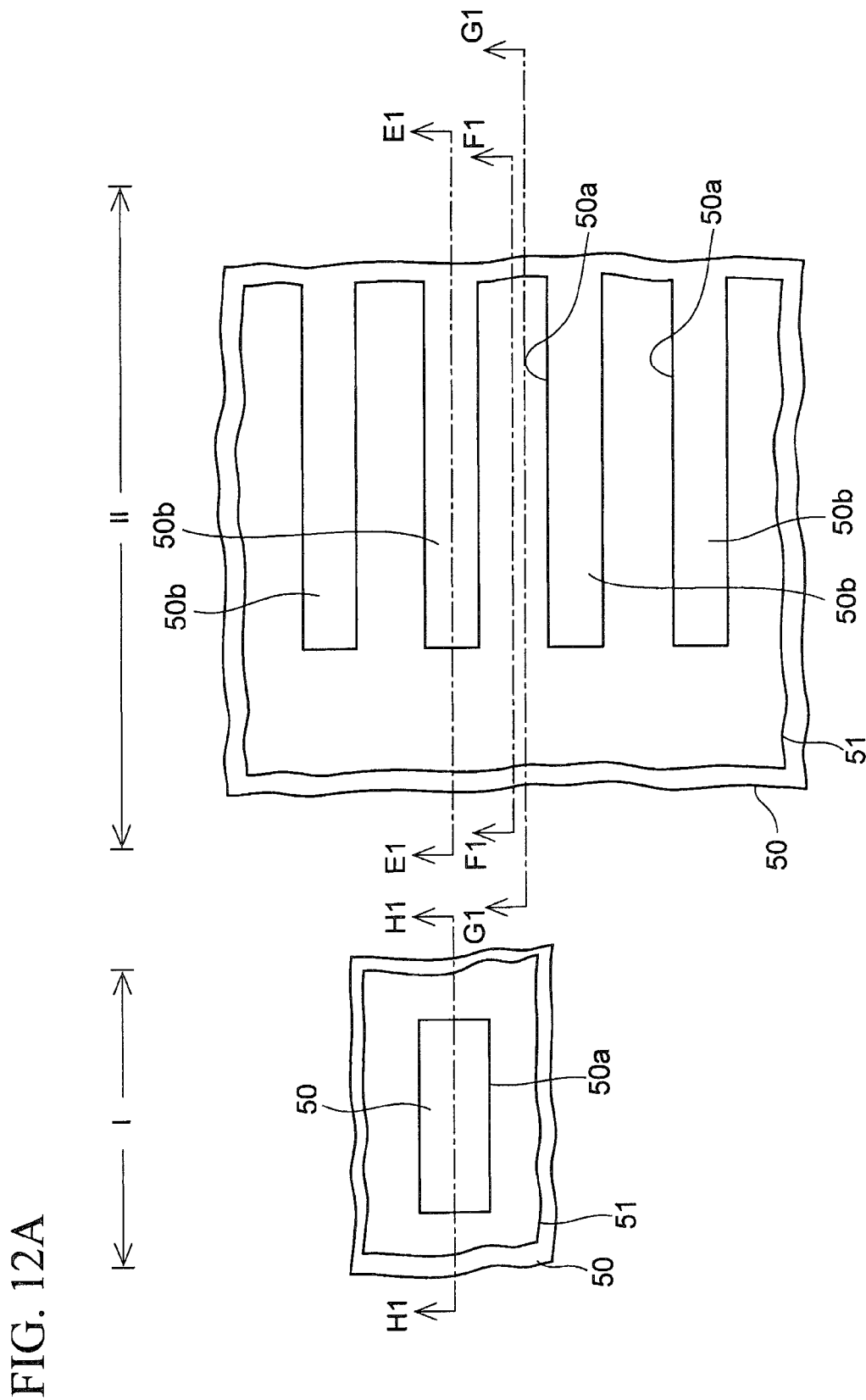

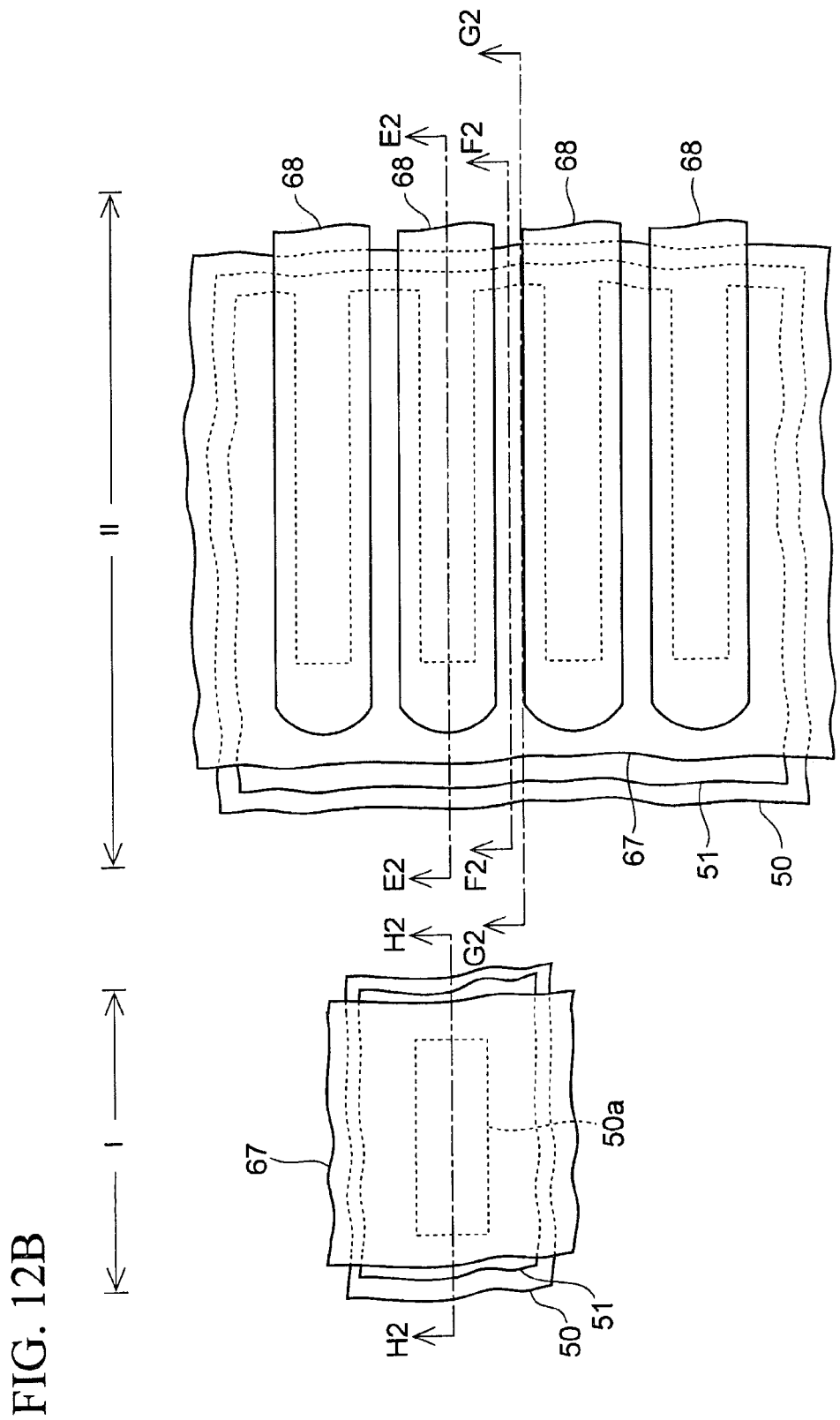

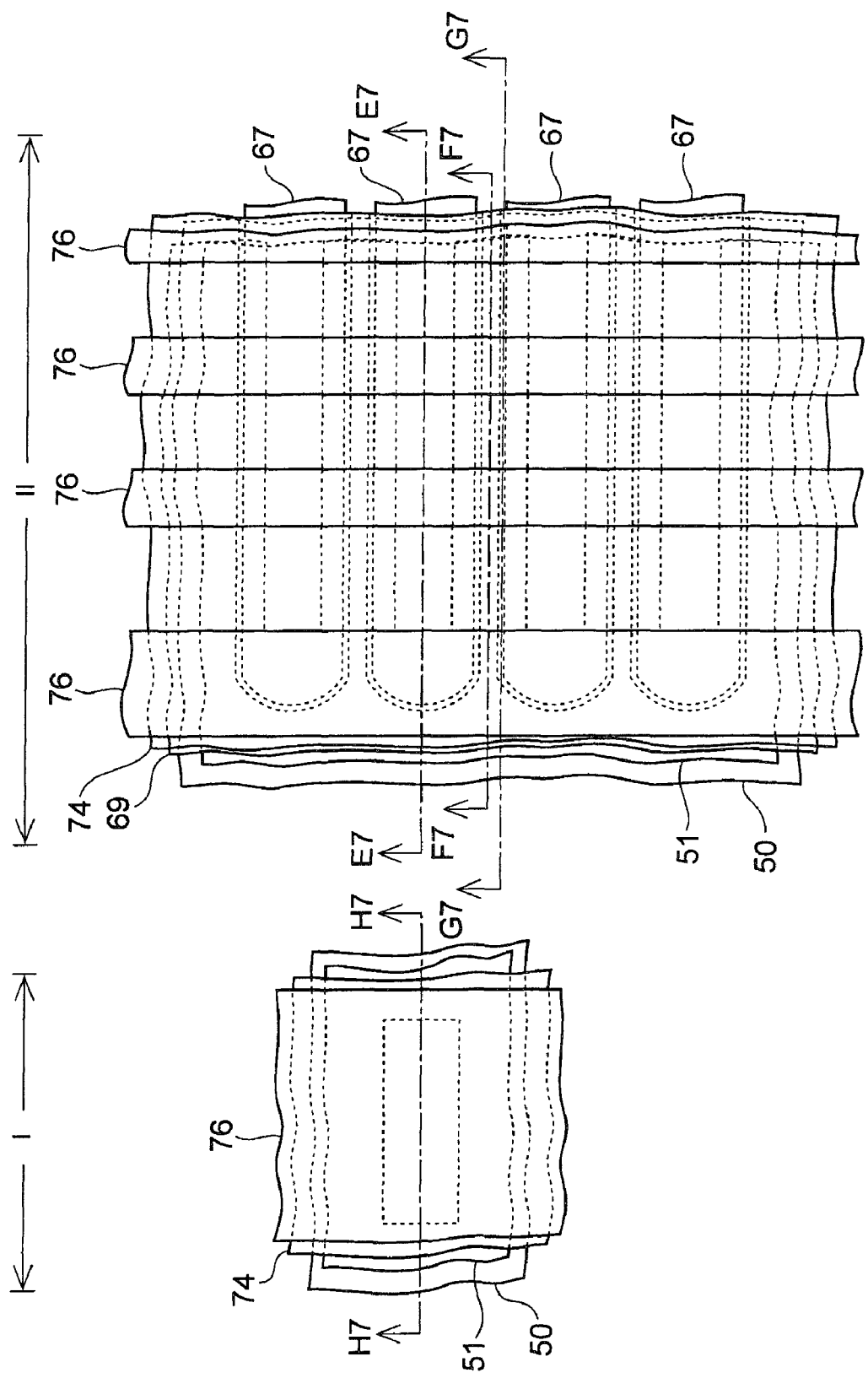

SEMICONDUCTOR DEVICE AND METHOD FOR MANUFACTURING THE SAME

CROSS-REFERENCE TO RELATED APPLICATIONS

This application is a divisional of U.S. application Ser. No. 12/139,720, filed on Jun. 16, 2008, which is a continuation of prior International Patent Application No. PCT/JP2005/022917, filed Dec. 14, 2005, the entire contents of which are incorporated herein by reference.

TECHNICAL FIELD

It is related to a semiconductor device and a method for manufacturing the same.

BACKGROUND

A flash memory capable of retaining memories even when a power supply is turned off is used in a mobile device such as a cellular phone, and is now widely used.

A memory cell of the flash memory is constructed by forming, on a semiconductor substrate, a tunnel insulating film, a floating gate, an intermediate insulating film, and a control gate in this order. Such memory cells are integrally formed on the semiconductor substrate along with a peripheral circuit to construct a flash memory.

Such a flash memory is disclosed, for example, in Japanese Patent Application Publication Nos. 2005-129760, 2005-142362, and 2005-244086.

Various patterning processes are performed in a flash memory manufacturing process. For example, a conductive film is patterned into the control gate. If an excessive film is left after patterning has been performed, the film is peeled off, and reattached to other area. Consequently, patterning defect occurs in that area, resulting in reduction in the production yield of the semiconductor device.

In a process of manufacturing not only a flash memory but also a common semiconductor device, the deformation of a device pattern of a floating gate and the like becomes notable due to an optical proximity effect in an exposing process as the pattern is increasingly miniaturized. In order to prevent such a pattern deformation, shape correction referred to as OPC (Optical Proximity Correction) is usually performed on the light-shielding pattern of a reticle (exposure mask), so that the projected image of the light-shielding pattern becomes a designed shape of the device pattern.

For example, repeated patterns of stripe patterns are subjected to the OPC in Japanese Patent Application Publication No. Hei 1-188857, where the corner of each pattern is obliquely cut off by the OPC.

SUMMARY

It is an aspect of the embodiment discussed herein to provide a semiconductor device including a semiconductor substrate, a plurality of stripe-shaped active regions which are defined in the semiconductor substrate and are arranged in parallel with each other, each of the active regions being arranged at a distance from each other, a device isolation insulating film which is formed on the semiconductor substrate and surrounds the active regions, a flash memory cell including a tunnel insulating film, a floating gate, an intermediate insulating film, and a control gate which are formed on the active region in this order, island-like lower conductor patterns made of the same material as the floating gate, where the lower conductor patterns being formed on the device isolation insulating film at an end of the active regions, and each of the lower conductor patterns being corresponding to each of the active regions, a segment of the intermediate insulating film which covers each of the lower conductor patterns and is shared by the lower conductor patterns, a dummy conductor pattern which is formed on the segment of the intermediate insulating film and is shared by the lower conductor patterns, the dummy conductor pattern being made of the same material as the control gate, and a fence of the intermediate insulating film which are formed on the device isolation insulating film and extends from a side surface of the floating gate to a side surface of the lower conductor pattern along the active region.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 2A to 2L are plan views showing processes of manufacturing the hypothetical semiconductor device.

FIGS. 12A to 12L are plan views showing processes of manufacturing the semiconductor device of the second embodiment.

DETAILED DESCRIPTION OF THE EMBODIMENTS (1) Preliminary Explanation

Prior to the explanation of an embodiment of the present semiconductor device, the preliminary explanation will be given.

Figure 1A:
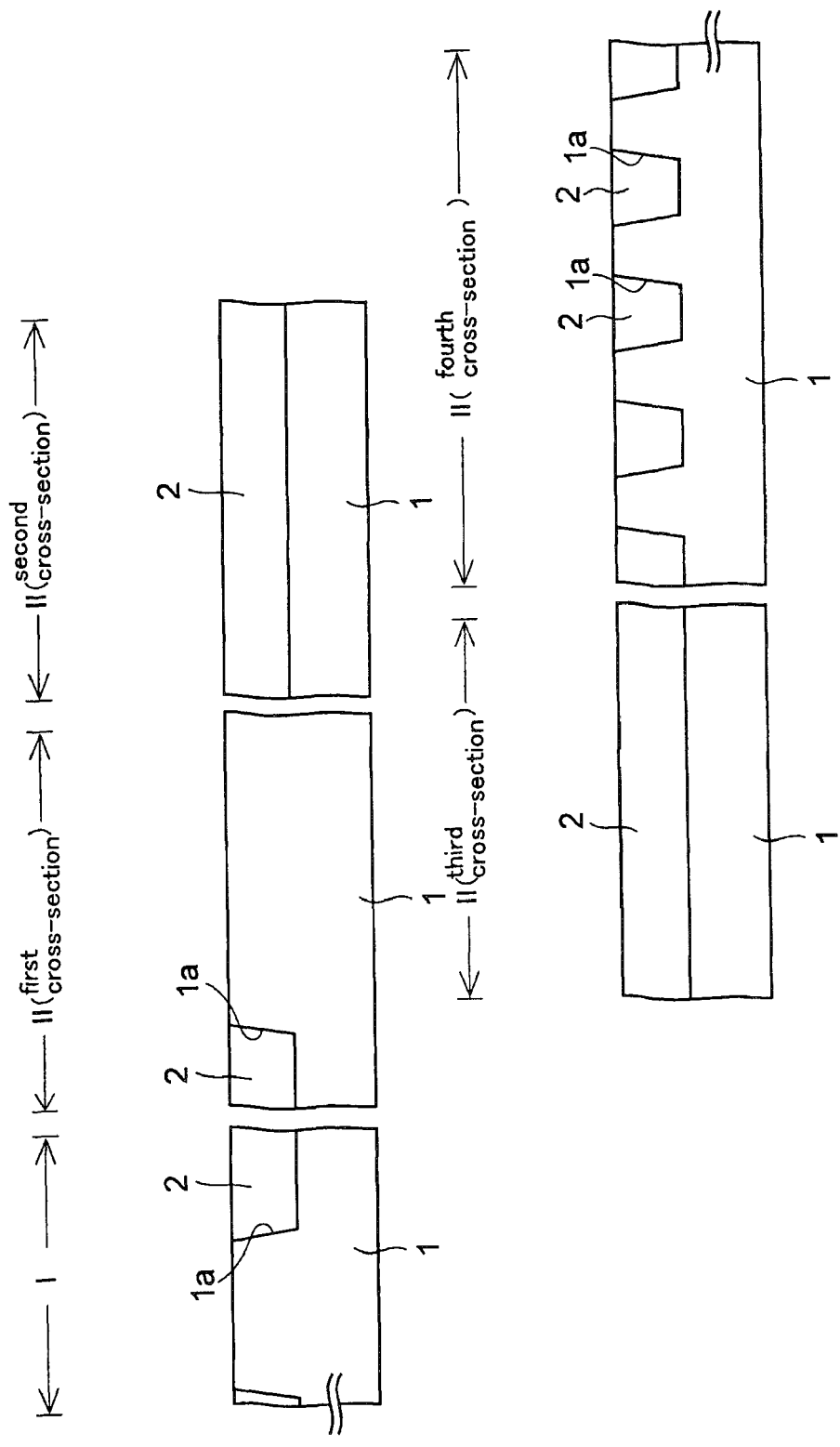
FIGS. 1A to 1P are cross-sectional views showing processes of manufacturing a hypothetical semiconductor device.
Figure 1B:
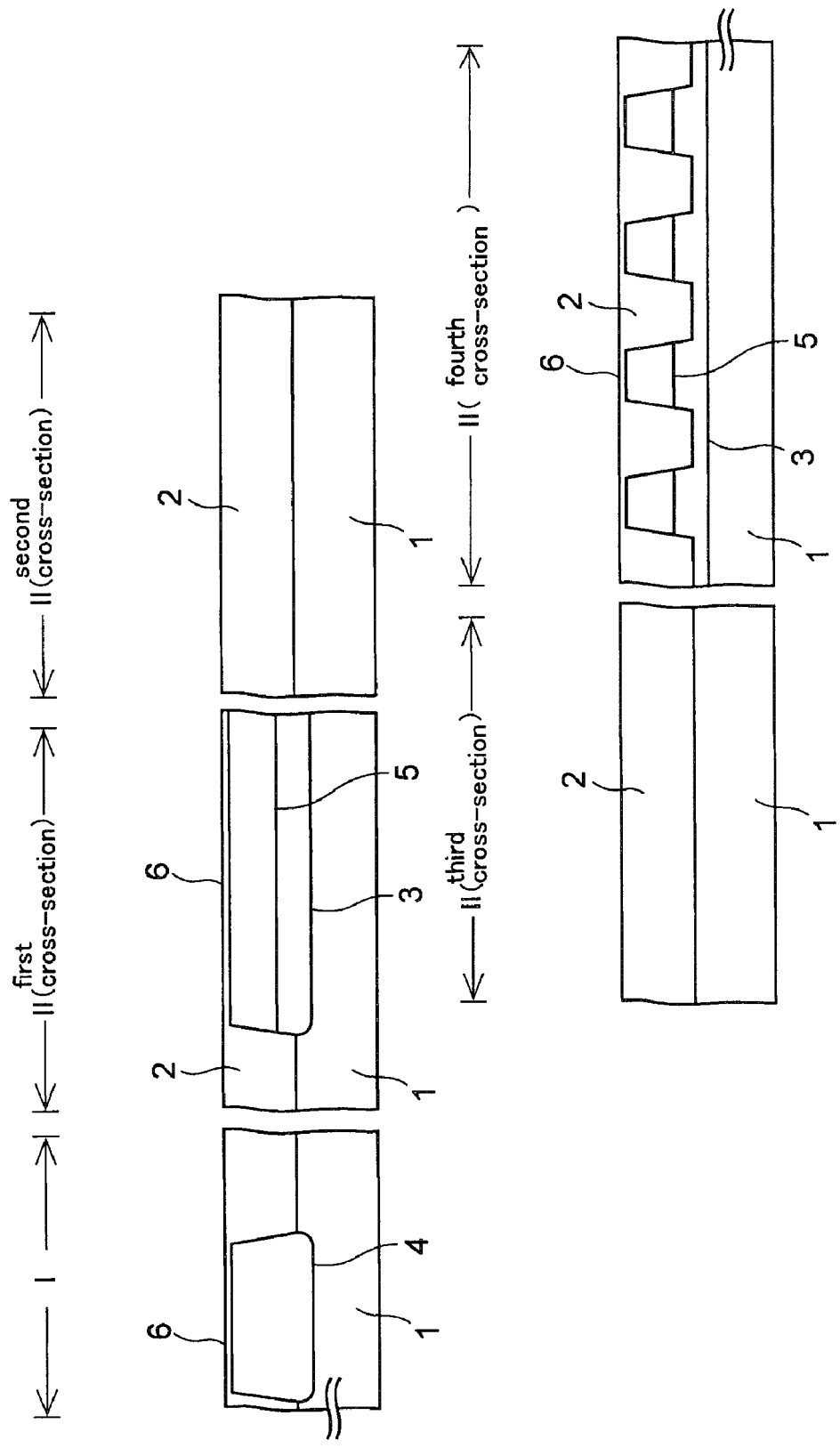
Figure 1C:
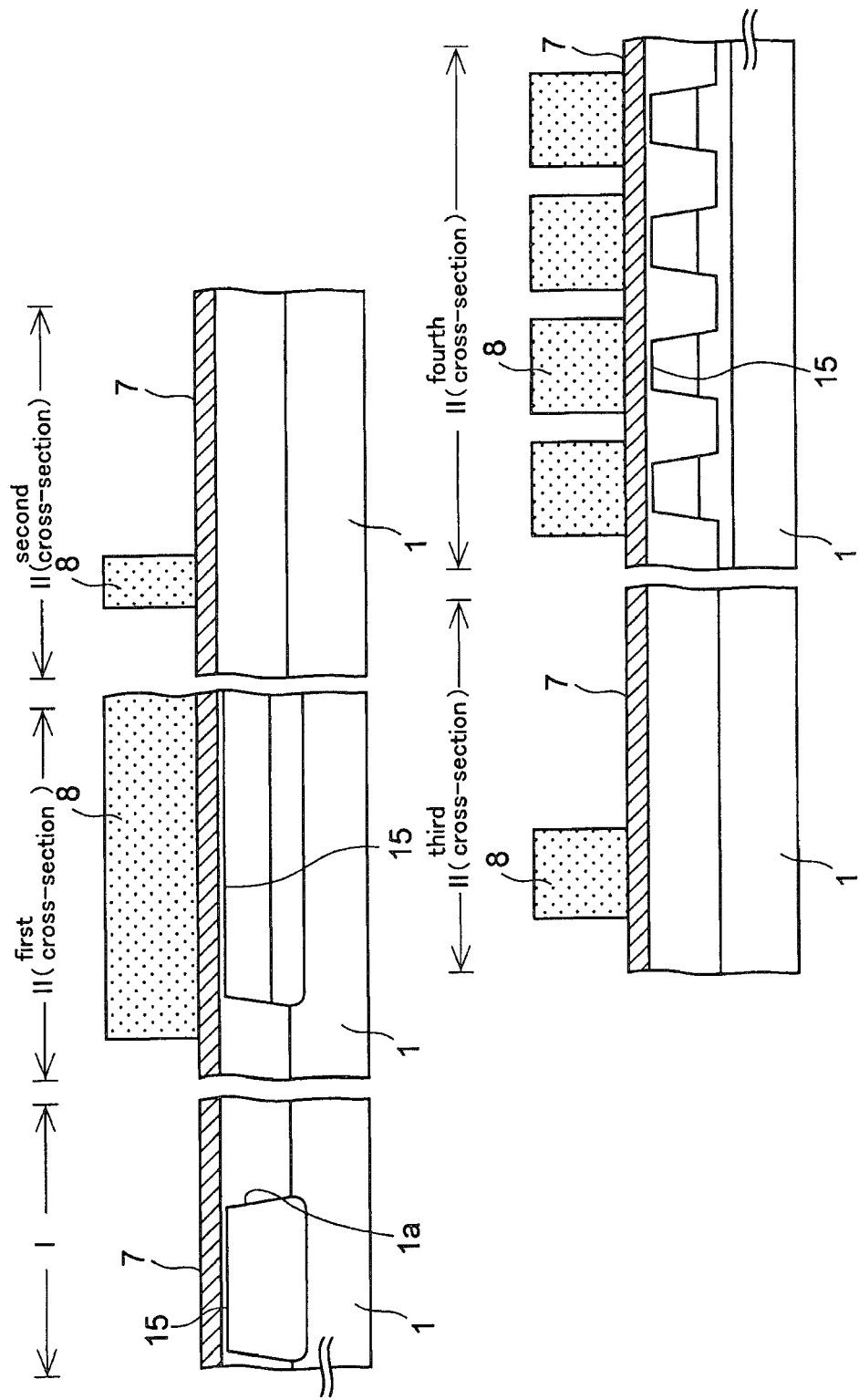
Figure 1D:
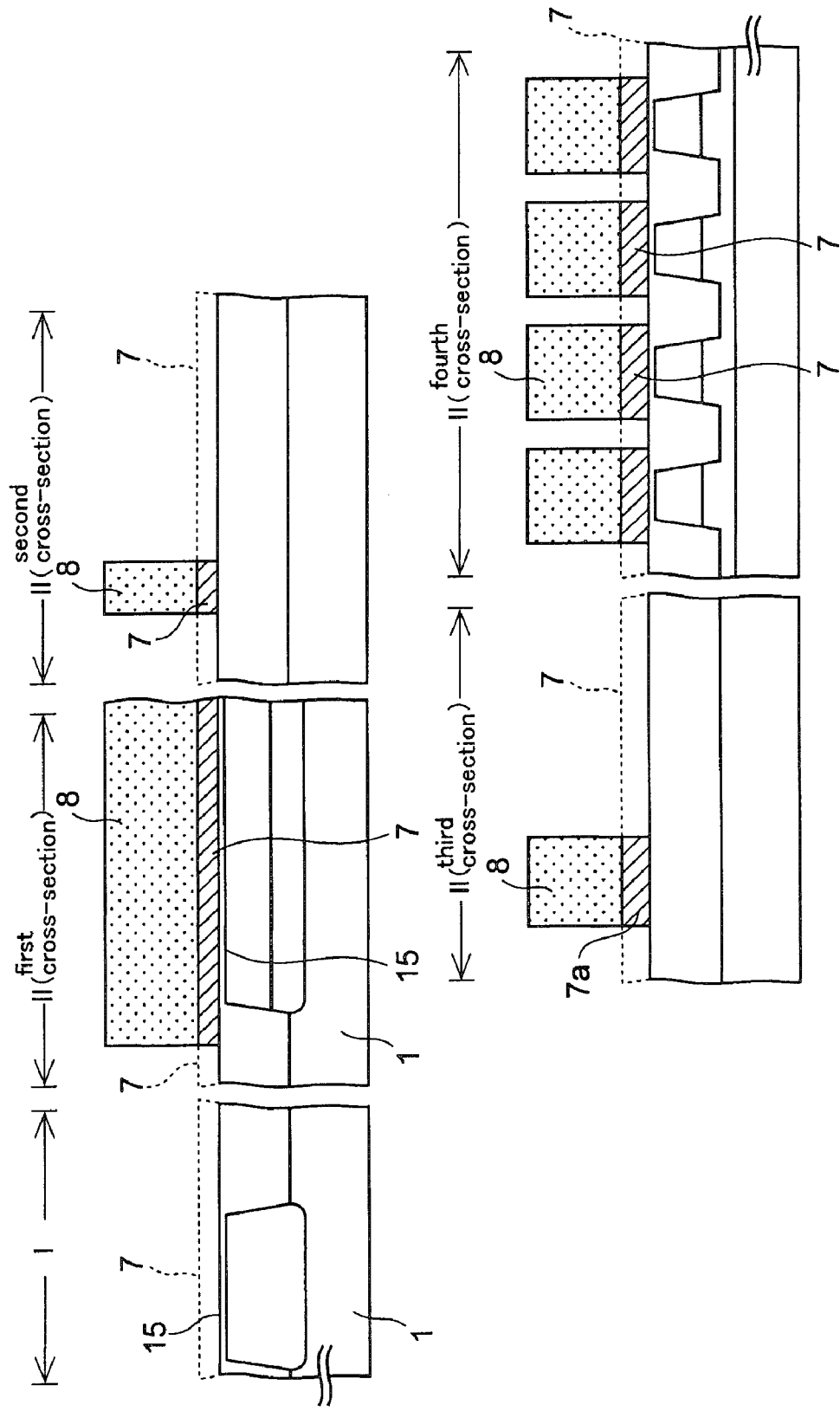
Figure 1E:
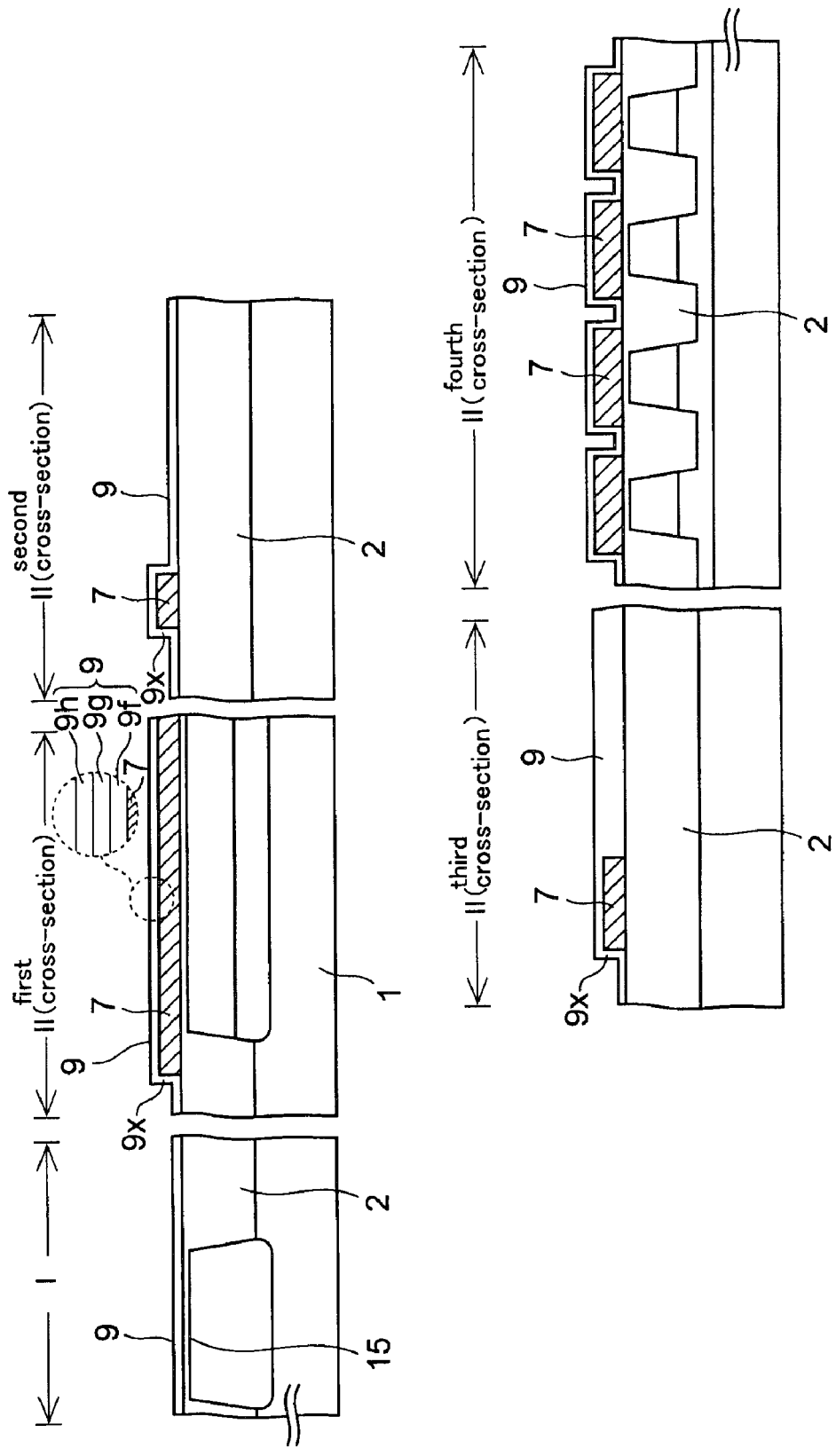
Figure 1F:
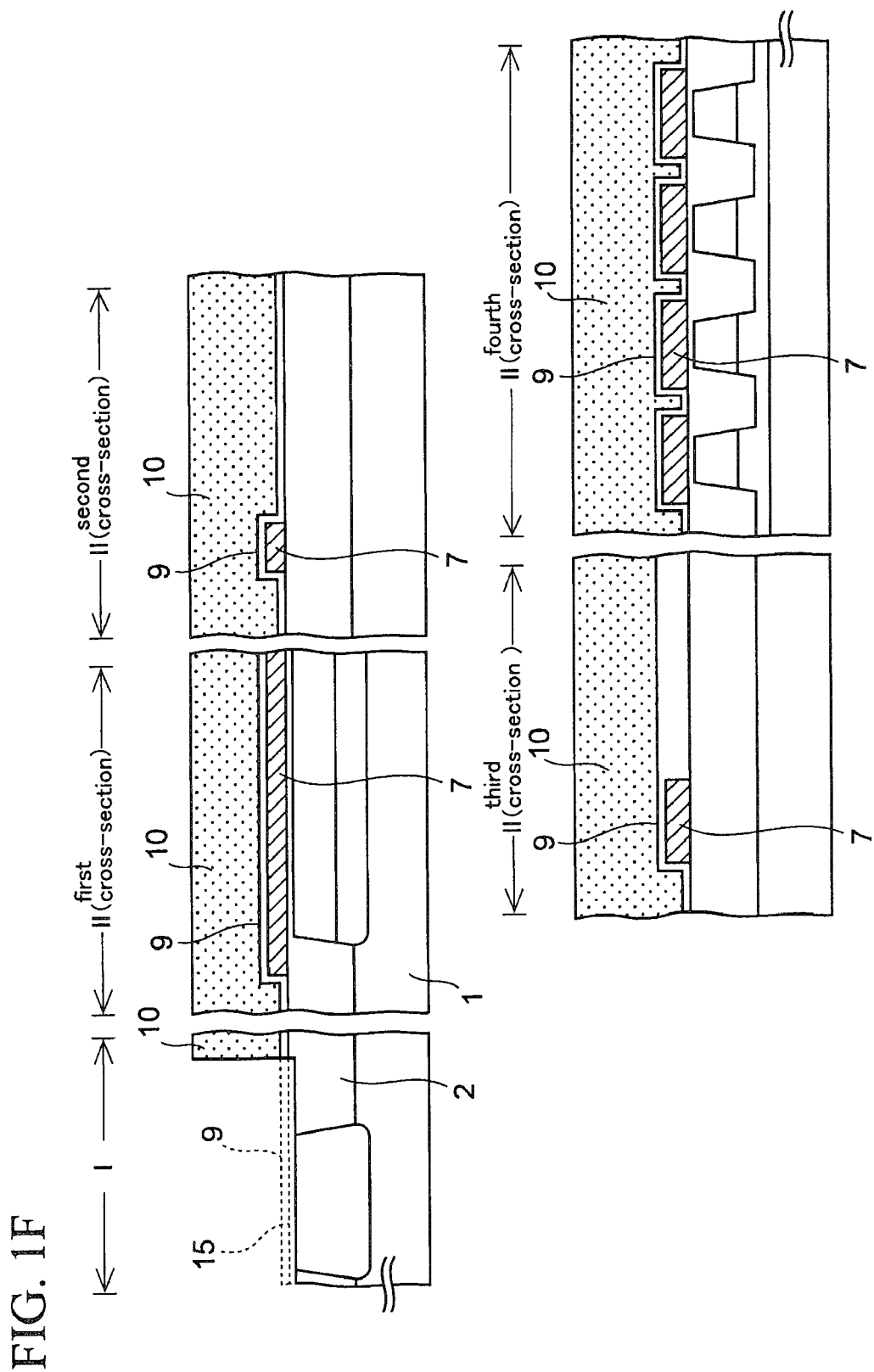
Figure 1G:
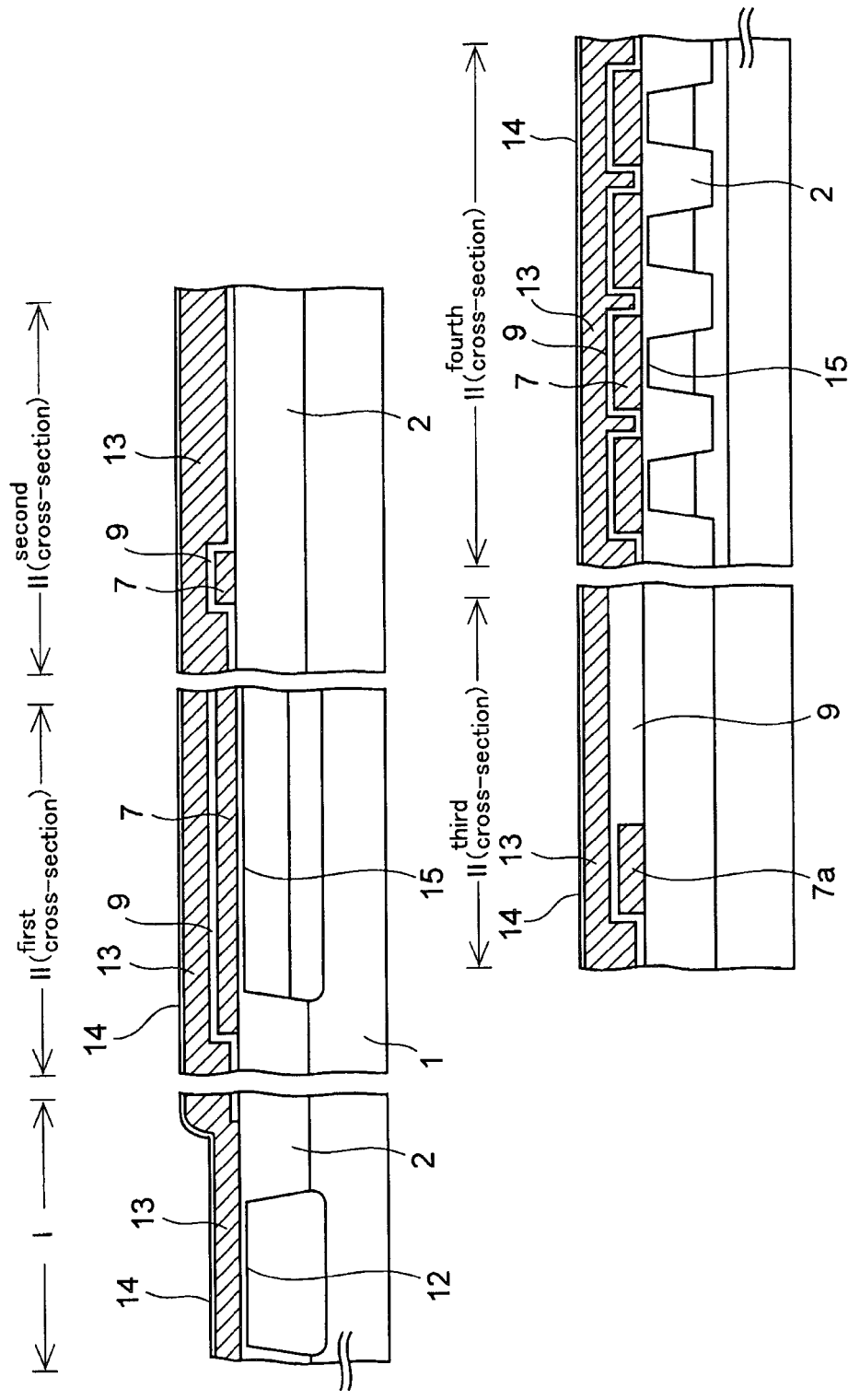
Figure 1H:
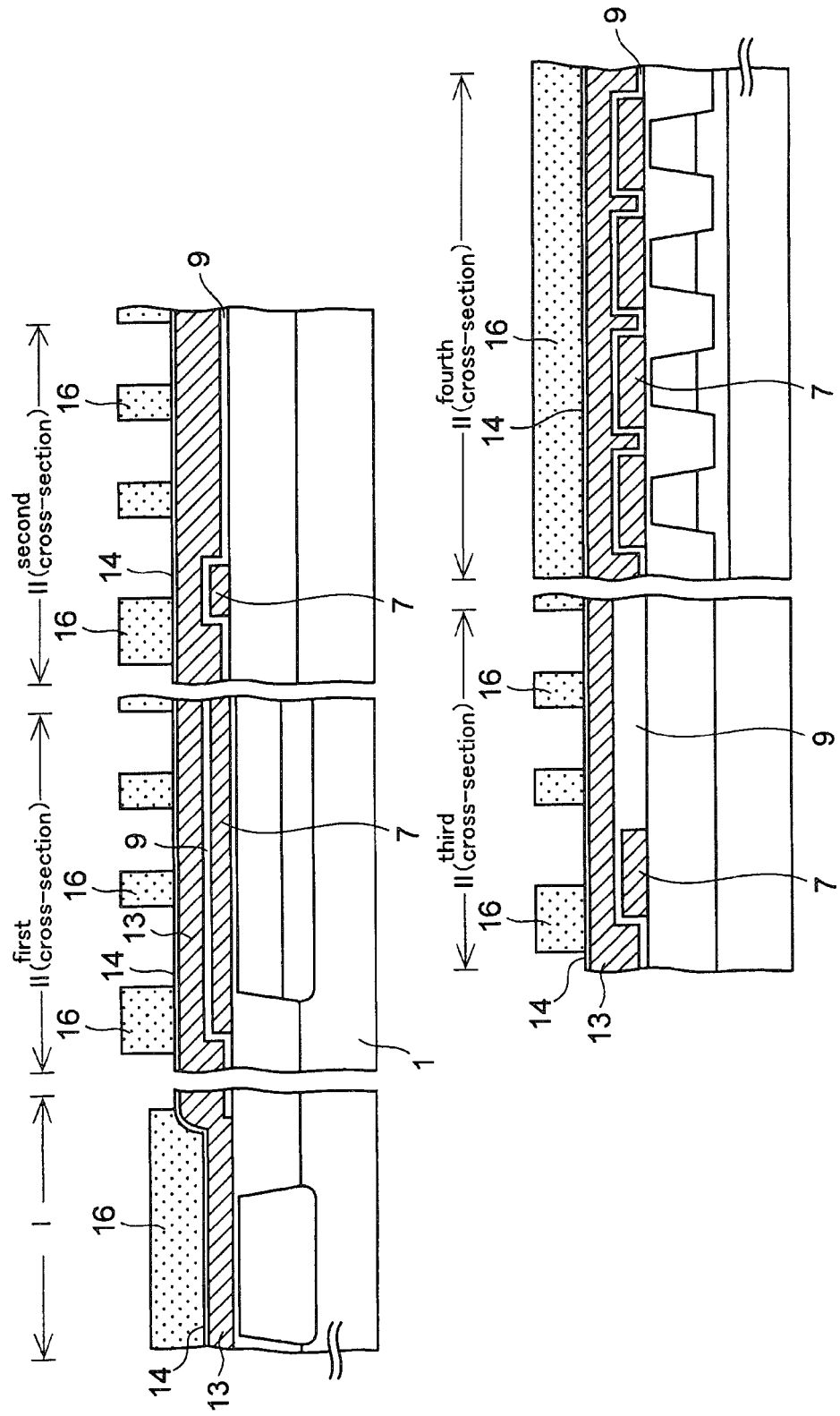
Figure 1I:
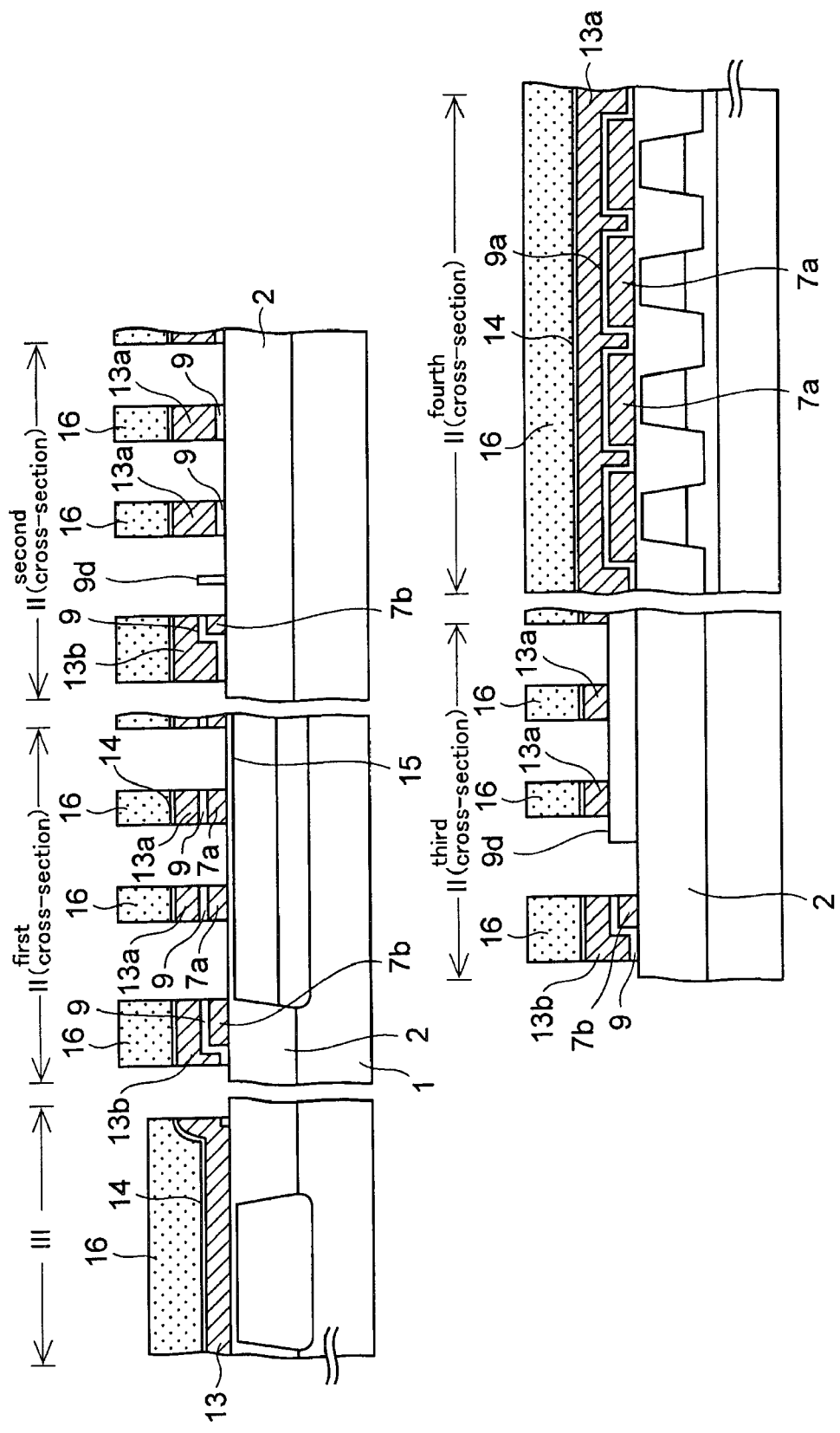
Figure 1J:
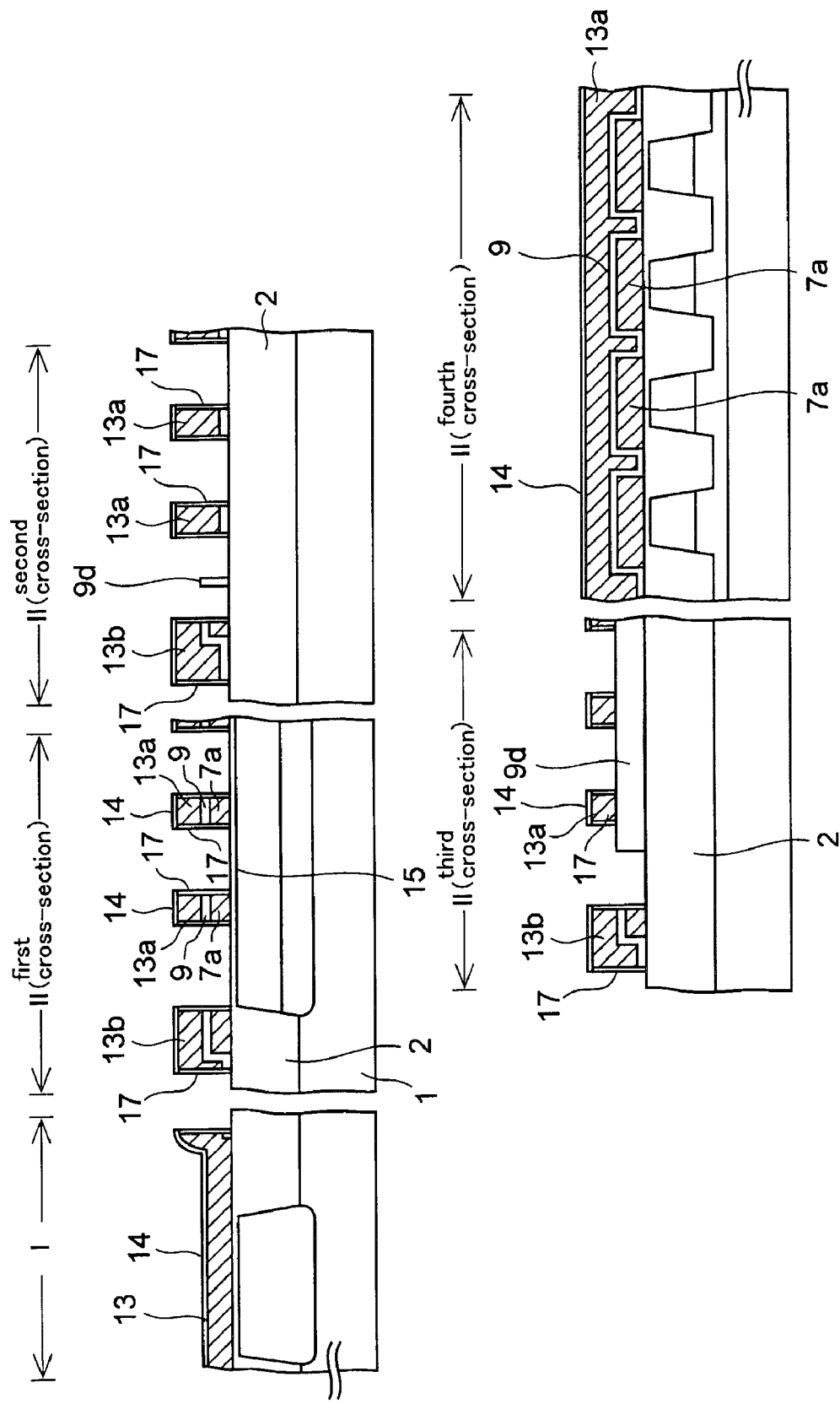
Figure 1K:
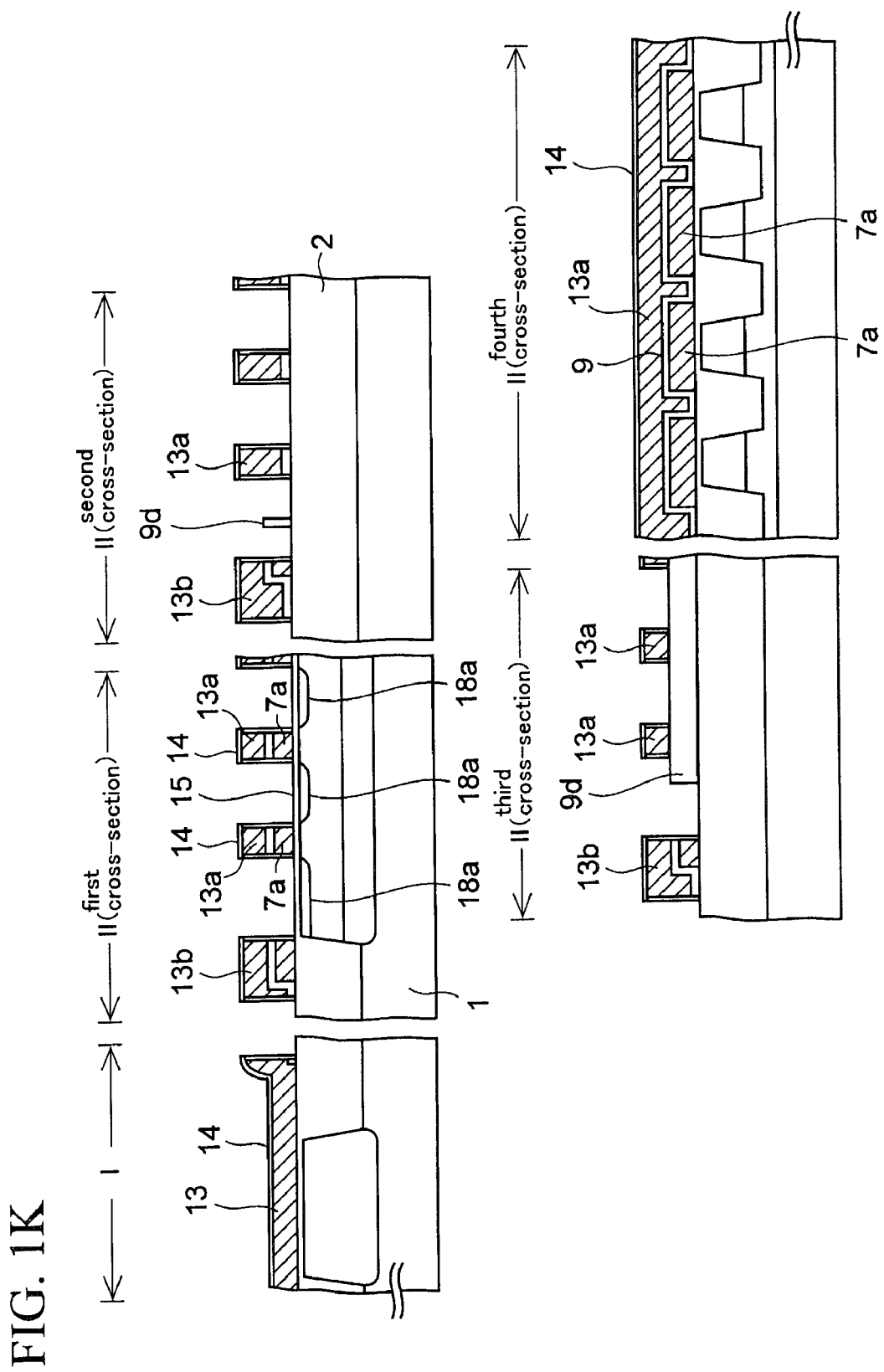
Figure 1L:
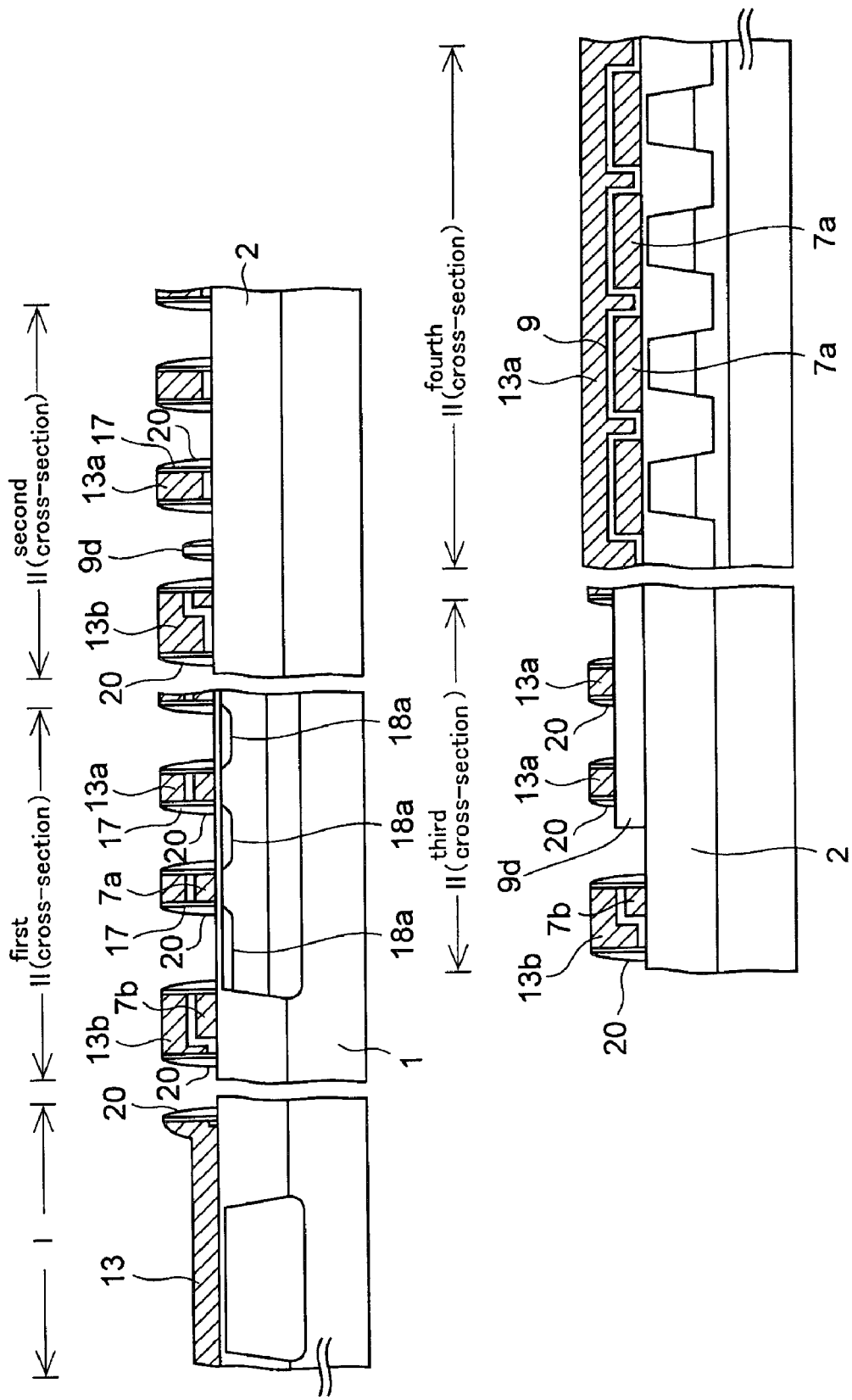
Figure 1N:
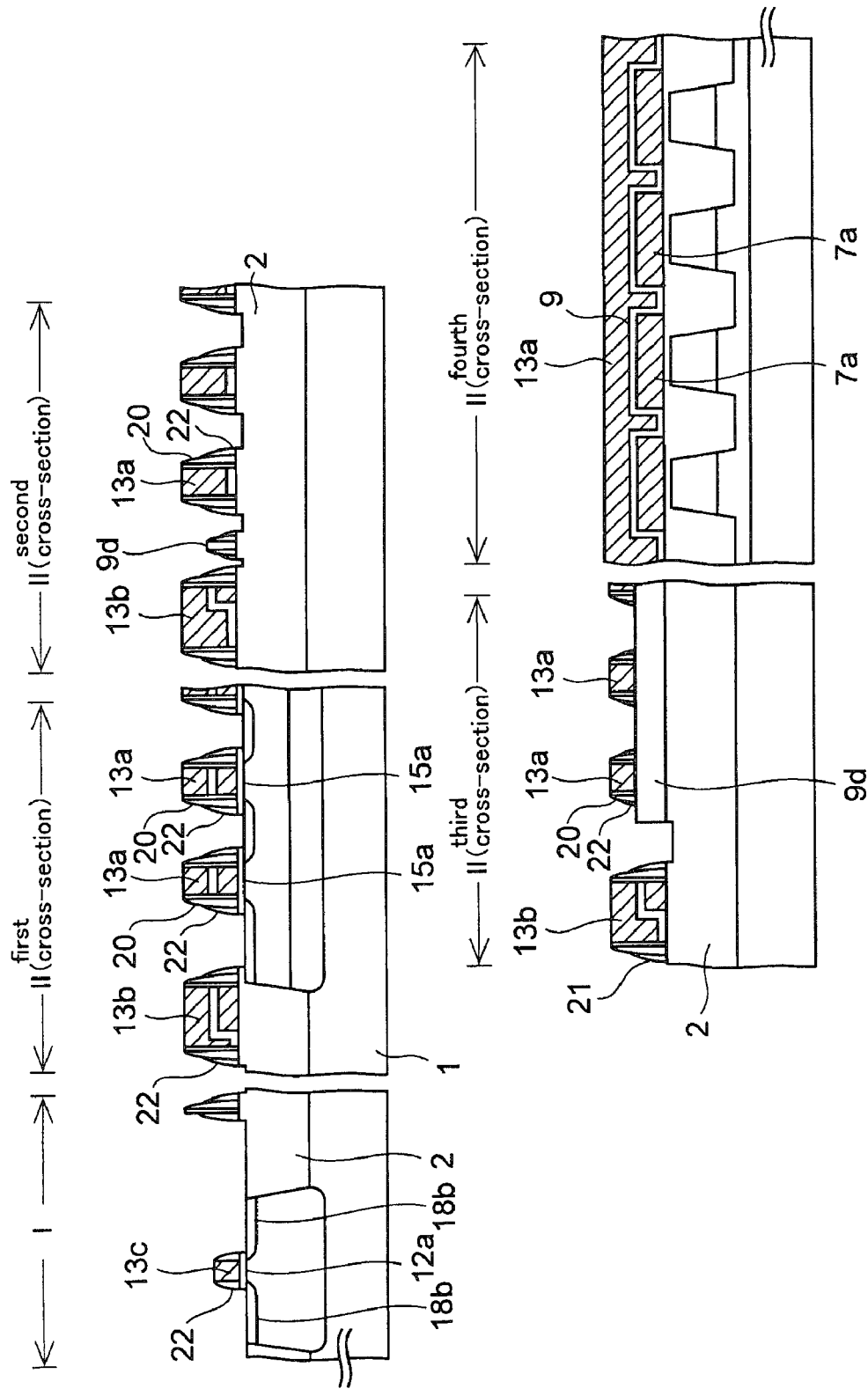
Figure 1P:
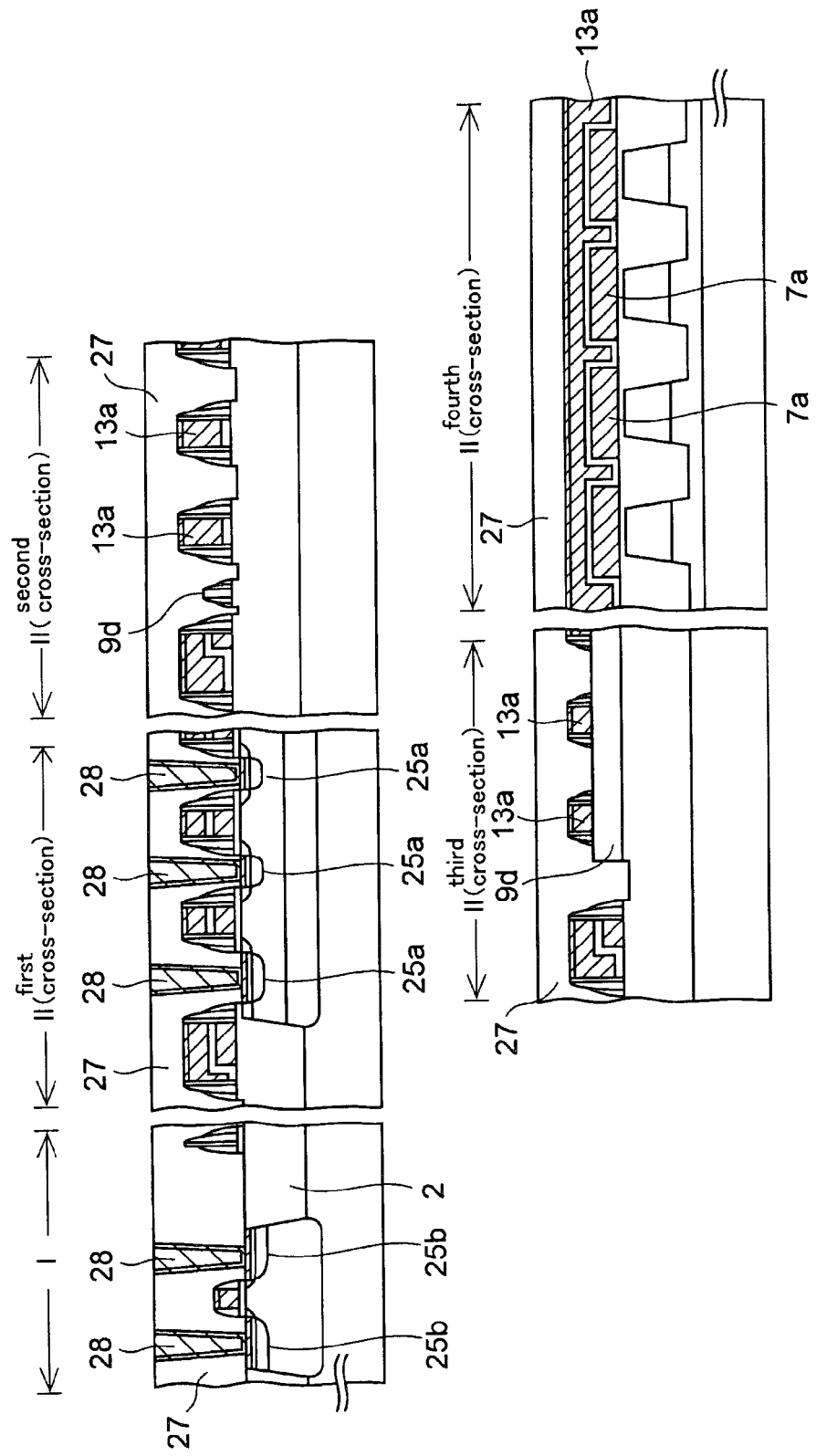

FIGS. 1A to 1P are cross-sectional views showing processes of manufacturing a hypothetical semiconductor device. FIGS. 2A to 2L are plan views showing processes of manufacturing the hypothetical semiconductor device. A method for manufacturing the hypothetical semiconductor device will be described below.

First, as shown in FIG. 1A, a device isolation groove 1a is formed in a silicon (semiconductor) substrate 1, and thereafter, a silicon oxide film is embedded in the device isolation groove 1a as a device isolation insulating film 2 by a CVD method.

Figure 2A:
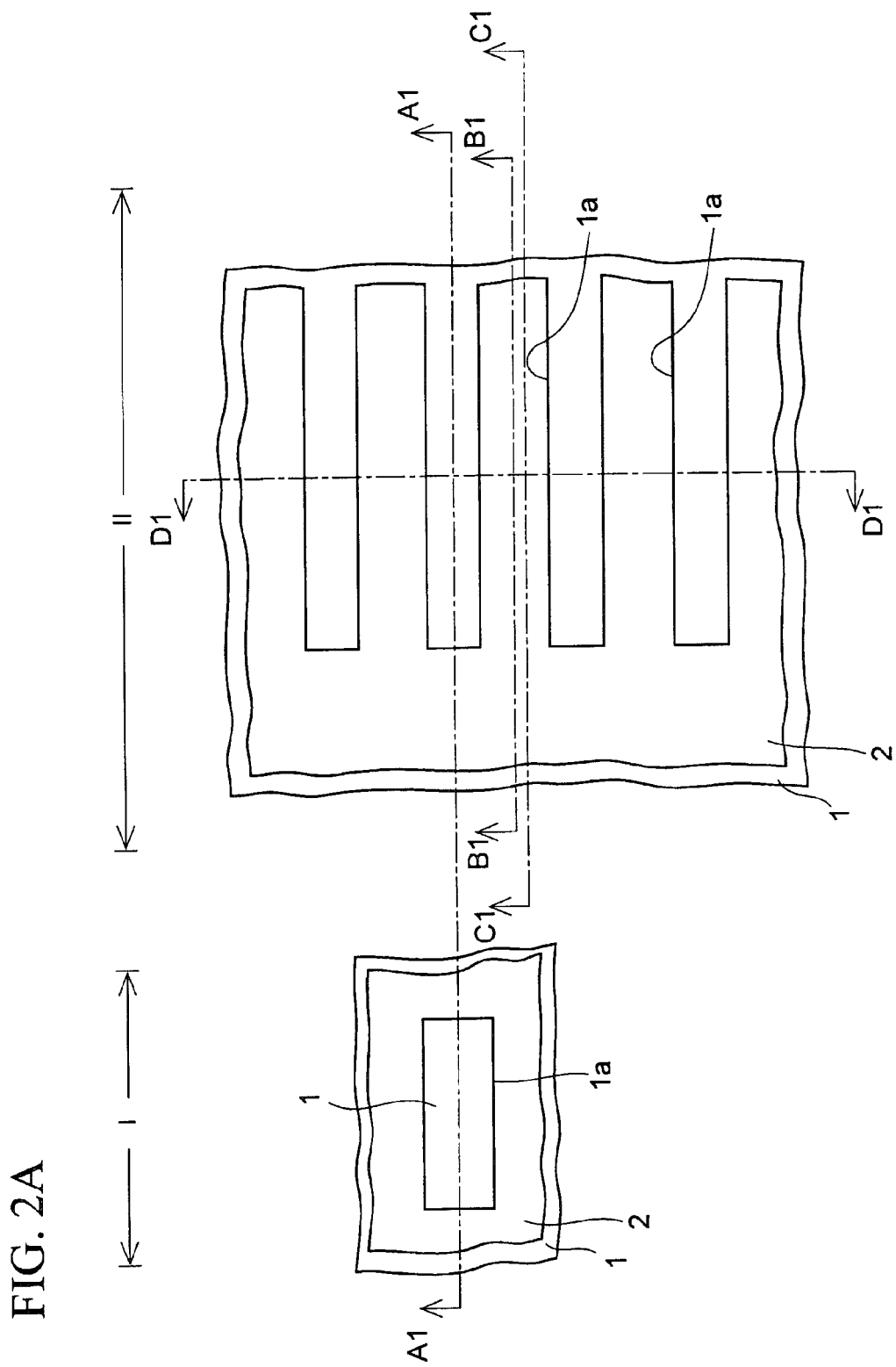

FIG. 2A is a plan view obtained after the device isolation insulating film 2 has been formed in this manner. The peripheral circuit region I and cell region II (first cross-section) of FIG. 1A are cross-sectional views taken along the line A1-A1 of FIG. 2A. Moreover, the second to fourth cross-sections of the cell region II of FIG. 1A correspond to cross-sectional views taken along the lines B1-B1, C1-C1, and D1-D1 of FIG. 2A, respectively.

As shown in FIG. 2A, the peripheral circuit region I and the cell region II are defined in the semiconductor substrate 1. Note that FIG. 2A shows an enlarged view of a portion of the cell region II, which is in the vicinity of an end portion of the active region that is surrounded by device isolation groove 1a.

Next, processes for obtaining a cross-sectional structure shown in FIG. 1B will be described.

First, the surface of the silicon substrate 1 on which no device isolation insulating film 2 is formed is thermally-oxidized to form a first thermal oxidation film 6. Then, an n well 3 is formed in the deep portion of the silicon substrate 1 in the cell region II by an ion implantation using the first thermal oxidation film 6 as a through film. Furthermore, a first p well 5 is formed in the silicon substrate 1 in a depth shallower than the n well 3 in the cell region II. At the same time, a second p well 4 is formed in the silicon substrate 1 in the peripheral circuit region I.

Then, processes for obtaining a cross-sectional structure shown in FIG. 1C will be described.

First, the first thermal oxidation film 6 used as a through film is removed. Then, the silicon substrate 1 is thermally oxidized again to form a tunnel insulating film 15 on the silicon substrate 1 in the peripheral circuit region I and the cell region II. Thereafter, a polysilicon film is formed as a first conductive film 7 on the tunnel insulating film 15. Subsequently, the first conductive film 7 is coated with a positive-type photoresist. The photoresist is then exposed and developed to form a first resist pattern 8 of a stripe-shaped planar shape.

FIG. 2B is a plan view obtained after the above processes completes. The peripheral circuit region I and cell region II (the first cross-section) of FIG. 1C are cross-sectional views taken along the line A2-A2 of FIG. 2B. Moreover, the second to fourth cross-sections of the cell region II of FIG. 1C correspond to cross-sectional views taken along the lines B2-B2, C2-C2, and D2-D2 of FIG. 2B, respectively.

The multiple first resist patterns 8 should desirably be stripe-shaped and isolated from each other. However, in this example, as shown in FIG. 2B, the first resist patterns 8 are formed to be connected with each other near their ends in the cell region II due to an optical proximity effect of exposure.

Figure 3:
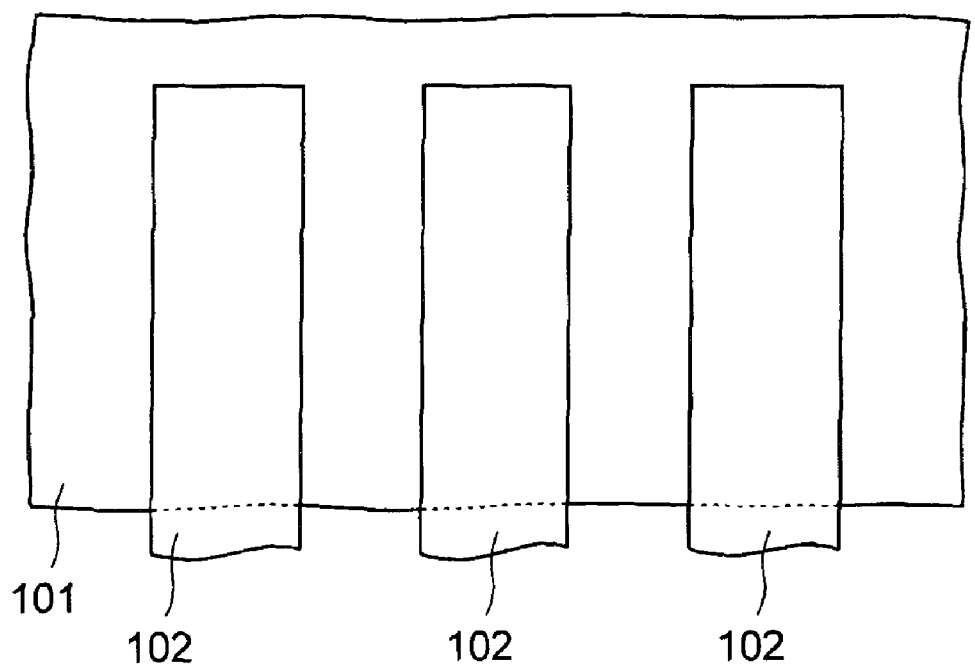
FIG. 3 is an enlarged plan view of a reticle used to manufacture the hypothetical semiconductor device.

FIG. 3 is an enlarged plan view showing the reticle (exposure mask) used to form the first resist pattern 8.

The reticle 100 is a half-tone reticle constructed from a transparent substrate 101 made of quartz, and a light-shielding pattern 102 formed on the transparent substrate 101. The light-shielding pattern 102 is made of MoSiN which shields exposure light such as KrF laser beam and ArF laser beam.

The light-shielding pattern 102 is configured of a plurality of stripes arranged at a distance from each other. The shape of each stripe corresponds to that of corresponding one of the first resist patterns 8 shown in FIG. 2B. Note in FIG. 3 that the extending direction of the light-shielding pattern 102 is rotated by 90° from the extending direction of the first resist pattern 8 (see FIG. 2B) for convenience.

Although the light-shielding patterns 102 are isolated from each other in the reticle 100 as described above, the multiple first resist patterns 8 are connected with each other near their ends due to the above described optical proximity effect.

Thereafter, as shown in FIG. 1D, the first conductive film 7 is etched using the first resist pattern 8 as a mask to pattern the first conductive film 7 into a stripe shape.

The first resist pattern 8 is removed after the etching is finished.

Figure 2C:
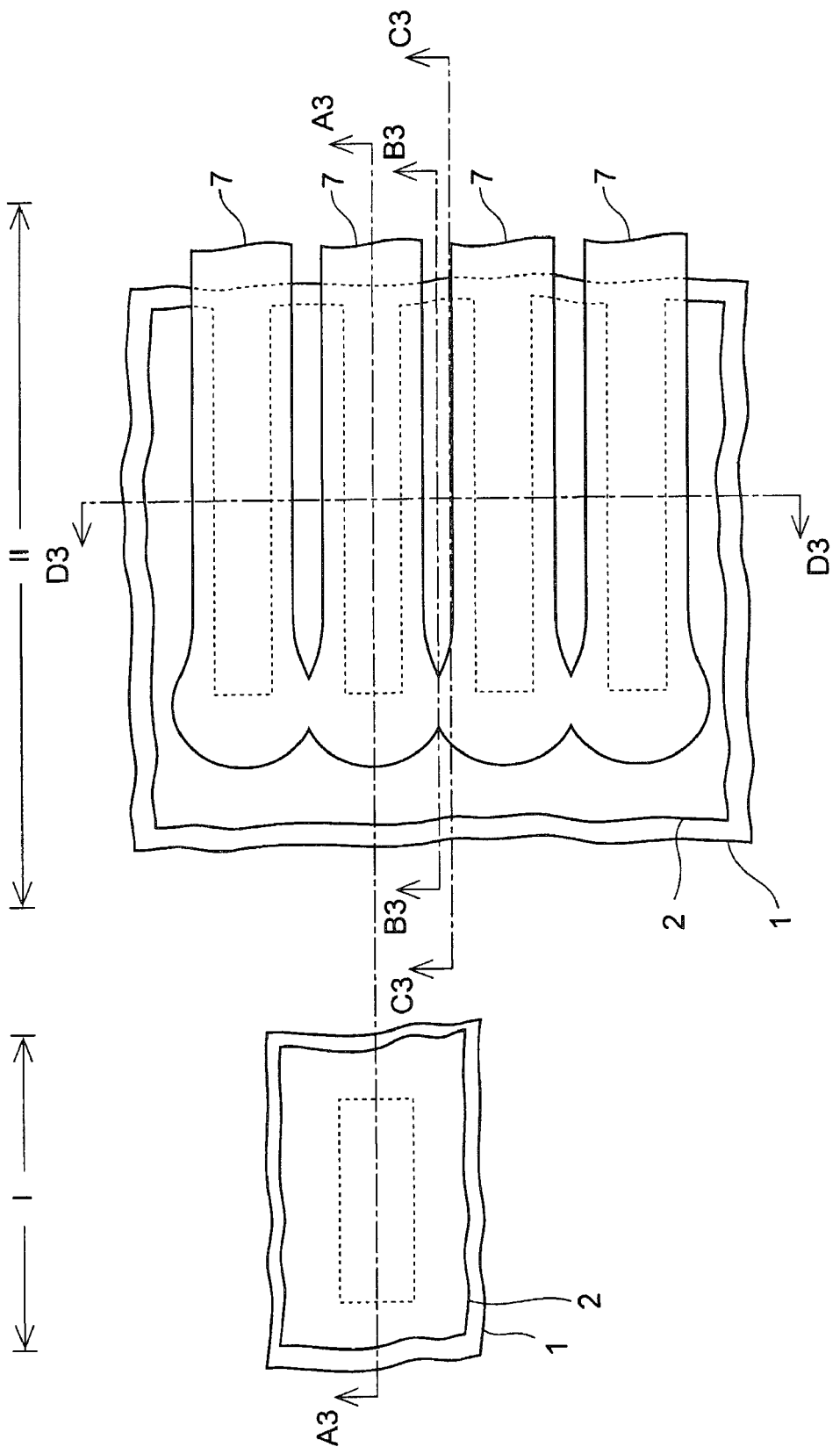

FIG. 2C is a plan view obtained after the first resist pattern 8 is removed in this manner. The peripheral circuit region I and cell region II (the first cross-section) of FIG. 1D are cross-sectional views taken along the line A3-A3 of FIG. 2C. The second to fourth cross-sections of the cell region II of FIG. 1D correspond to cross-sectional views taken along the lines B3-B3, C3-C3, and D3-D3 of FIG. 2C, respectively.

As shown in FIG. 2C, similar to the first resist pattern 8, each of the first conductive films 7 patterned in a stripe shape is formed in a manner that they are connected at their ends.

Next, as shown in FIG. 1E, an ONO film is formed as an intermediate insulating film 9 on the entire upper surface of the silicon substrate 1. The ONO film is formed by laminating a first silicon oxide film 9f, a silicon nitride film 9g, and a second silicon oxide film 9h in this order as shown in a dotted circle. Because of its low current leakage, and for the purpose of increasing a dielectric constant, the ONO film is suitably used as an intermediate insulating film of a flash memory.

Figure 2D:
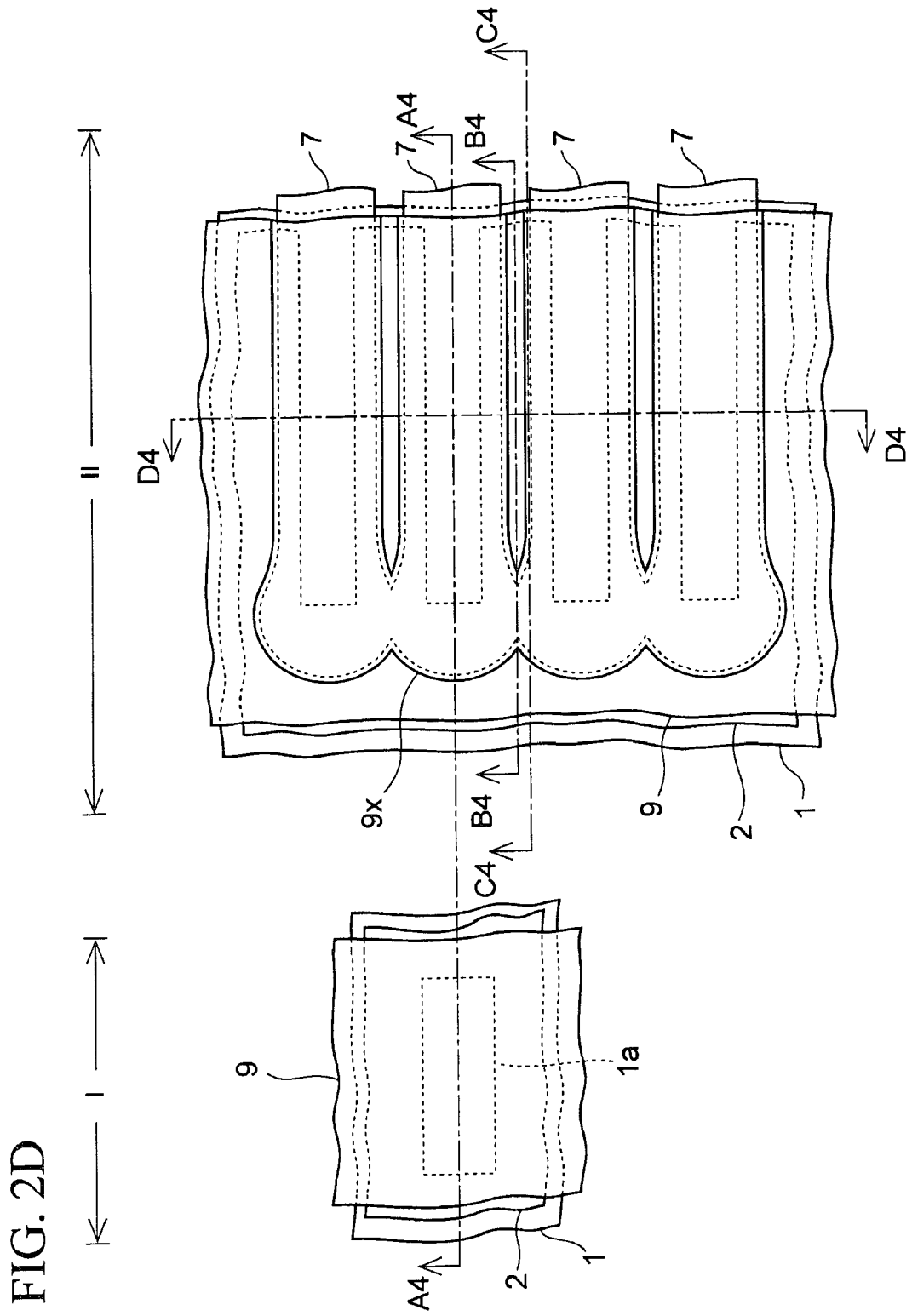

FIG. 2D is a plan view obtained after the above processes are finished. The peripheral circuit region I and cell region II (the first cross-section) of FIG. 1E are cross-sectional views taken along the line A4-A4 of FIG. 2D. The second to fourth cross-sections of the cell region II of FIG. 1E correspond to cross-sectional views taken along the lines B4-B4, C4-C4, and D4-D4 of FIG. 2D, respectively.

As shown in FIG. 2D, a step portion 9x reflecting the underlying first conductive film 7 is formed in the intermediate insulating film 9.

The intermediate insulating film 9 is not required in the peripheral circuit region I because the cell of the flash memory is not formed therein.

Accordingly, in the next process, as shown in FIG. 1F, a second resist pattern 10 is formed on the intermediate insulating film 9 to remove the intermediate insulating film 9 in the peripheral circuit region I by dry etching using the second resist pattern 10 as a mask. In this etching, a gas mixture of $C_4F_8$, Ar, CO, and $O_2$ is used as an etching gas. The tunnel insulating film 15 under the intermediate insulating film 9 is also etched to be removed, so that the underlying surface of the silicon substrate 1 is exposed.

Figure 2E:
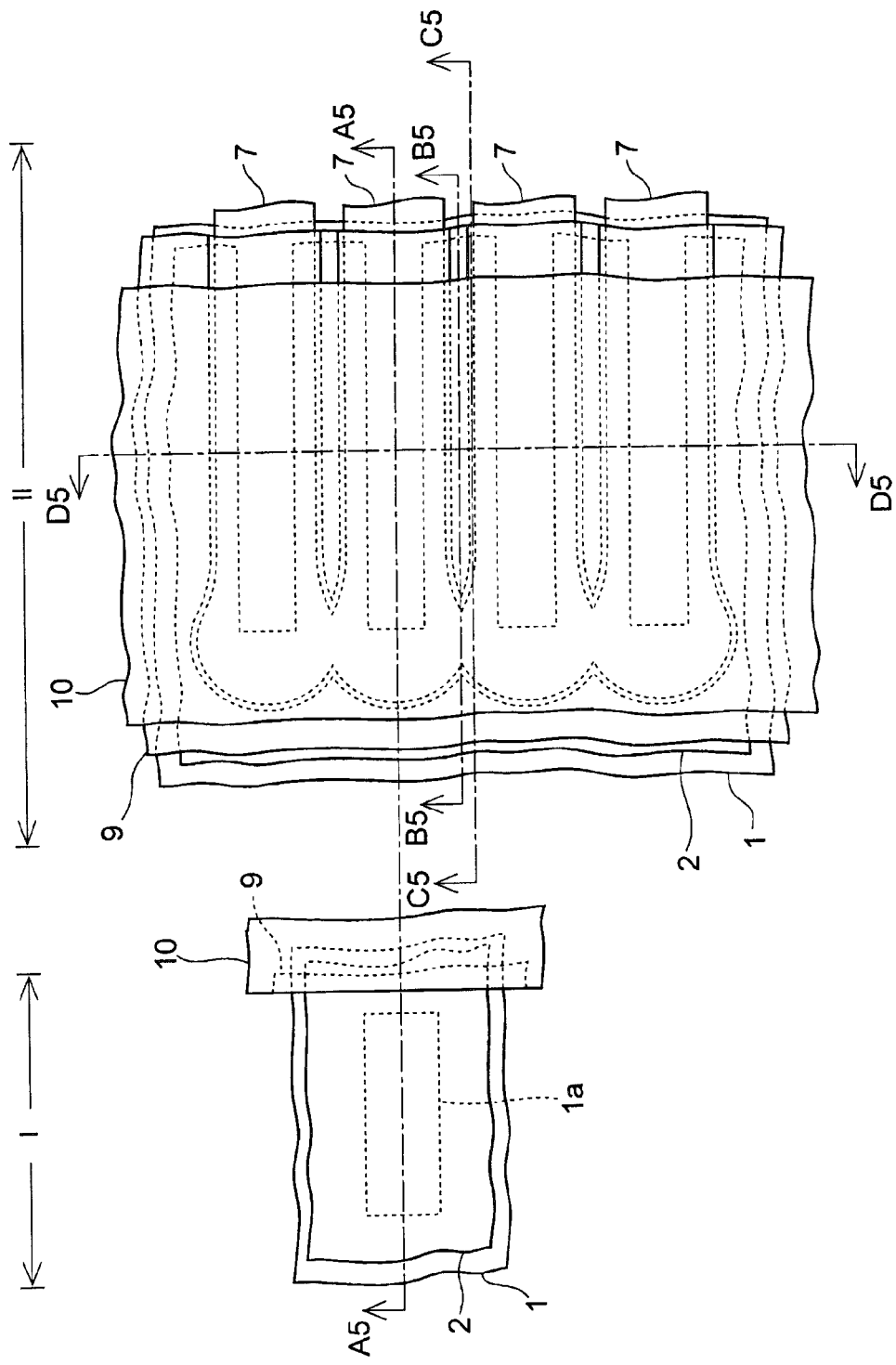

FIG. 2E is a plan view obtained after the above processes are finished. The peripheral circuit region I and cell region II (the first cross-section) of FIG. 1F are cross-sectional views taken along the line A5-A5 of FIG. 2E. The second to fourth cross-sections of the cell region II of FIG. 1F correspond to cross-sectional views taken along the lines B5-B5, C5-C5, and D5-D5 of FIG. 2E, respectively.

Thereafter, the second resist pattern 10 is removed by an oxygen asking. The surface of the silicon substrate 1 is then washed in a wet process.

Next, processes for obtaining a cross-sectional structure shown in FIG. 1G will be described.

First, the surface of the silicon substrate 1 exposed in the peripheral circuit region I is thermally oxidized to form a thermal oxidation film with a thickness of approximately 12 mm. In this thermal oxidation, oxidizing conditions of a substrate temperature of 850° C. and a processing time of 40 minutes are used. The obtained oxidized film is then used as a gate insulating film 12.

Then, a polysilicon film, with a thickness of approximately 180 nm and in-situ doped with phosphorus, is further formed as a second conductive film 13 on the insulating films 9 and 12 by a reduced pressure CVD method using $SiH_4$ and $PH_3$ as a reaction gas. A silicon nitride film with a thickness of approximately 30 nm is then formed on the second conductive film 13 by a plasma CVD method. The silicon nitride film thus formed is used as an antireflection film 14.

FIG. 2F is a plan view obtained after the above processes are finished. The peripheral circuit region I and cell region II (the first cross-section) of FIG. 1G are cross-sectional views taken along the line A6-A6 of FIG. 2F. The second to fourth cross-sections of the cell region II of FIG. 1G correspond to cross-sectional views taken along the lines B6-B6, C6-C6, and D6-D6 of FIG. 2F, respectively.

Next, as shown in FIG. 1H, the antireflection film 14 is then coated with a photoresist. The photoresist is exposed and developed to form a third resist pattern 16

Figure 2G:
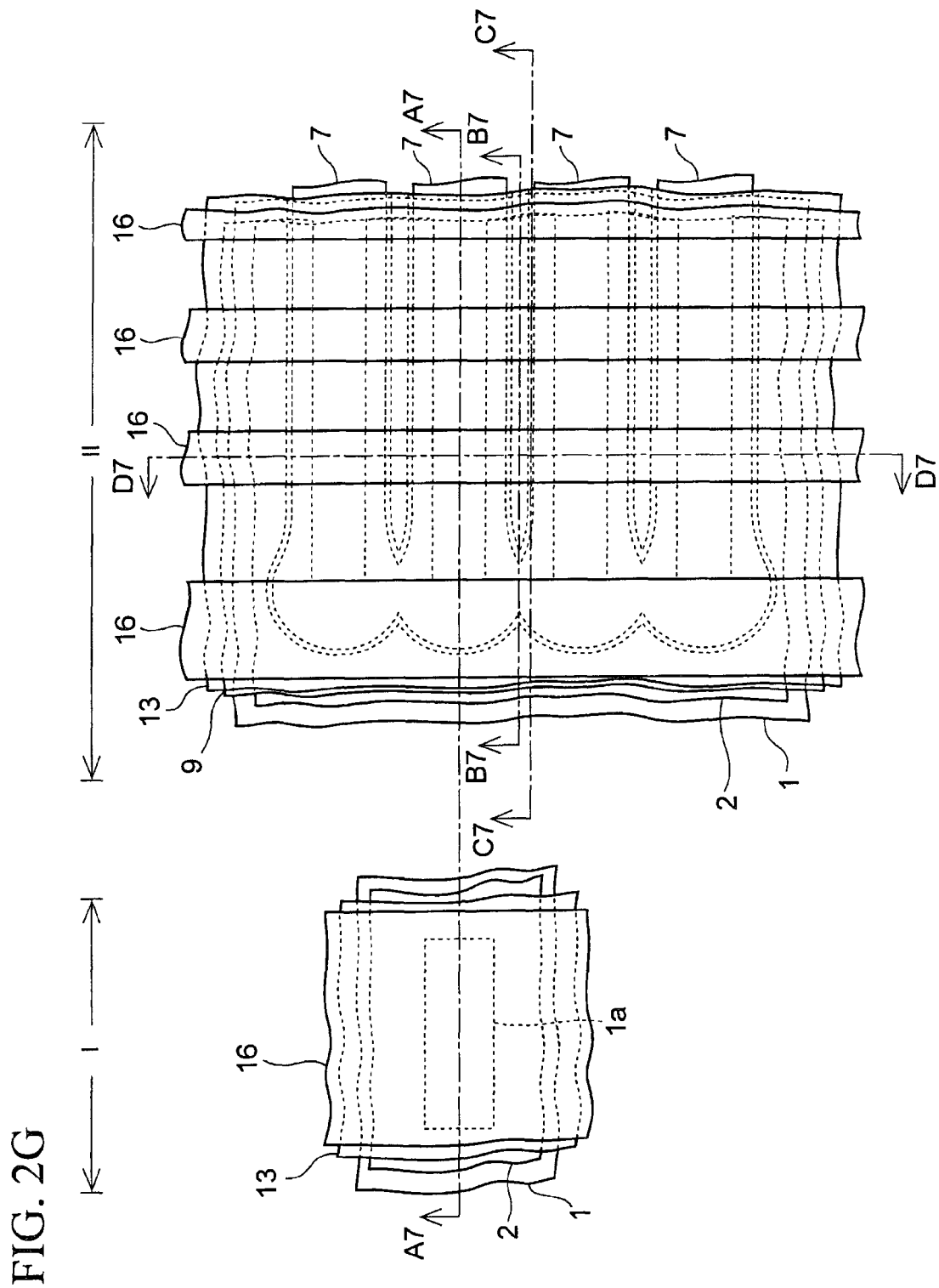

FIG. 2G is a plan view obtained after the third resist pattern 16 is formed in this manner. The peripheral circuit region I and cell region II (the first cross-section) of FIG. 1H are cross-sectional views taken along the line A7-A7 of FIG. 2G. The second to fourth cross-sections of the cell region II of FIG. 1H correspond to cross-sectional views taken along the lines B7-B7, C7-C7, and D7-D7 of FIG. 2G, respectively.

As shown in FIG. 2G, the third resist pattern 16 covers the peripheral circuit region I, and has stripe-shaped planar shape corresponding to the control gate in the cell region II.

Subsequently, as shown in FIG. 1I, the first and second conductive films 7 and 13, and the intermediate insulating film 9 are patterned using the third resist pattern 16 as an etching mask. This patterning process is performed in a plasma etching chamber. A gas mixture of $Cl_2$ and $O_2$ is used as the etching gas for the first and second conductive films 7 and 13 made of polysilicon. A gas mixture of $CH_3F$ and $O_2$ is used as the etching gas for the intermediate insulating film 9 made of an ONO film.

As a result of such a patterning, the first and second conductive films 7 and 13, and the intermediate insulating film 9 are made into floating gates 7a, control gates 13a, and an intermediate insulating film 9a in the cell region II, respectively, while the second conductive film 14 is left in the peripheral circuit region I.

Furthermore, as shown in the first cross-section in the cell region II, a dummy control gate 13b is formed on the device isolation insulating film 2 at the end of the cell region II. A lower conductor 7b formed of the first conductive film 7 is covered with the dummy control gate 13b.

Thereafter, the third resist pattern 16 is removed.

Figure 2H:
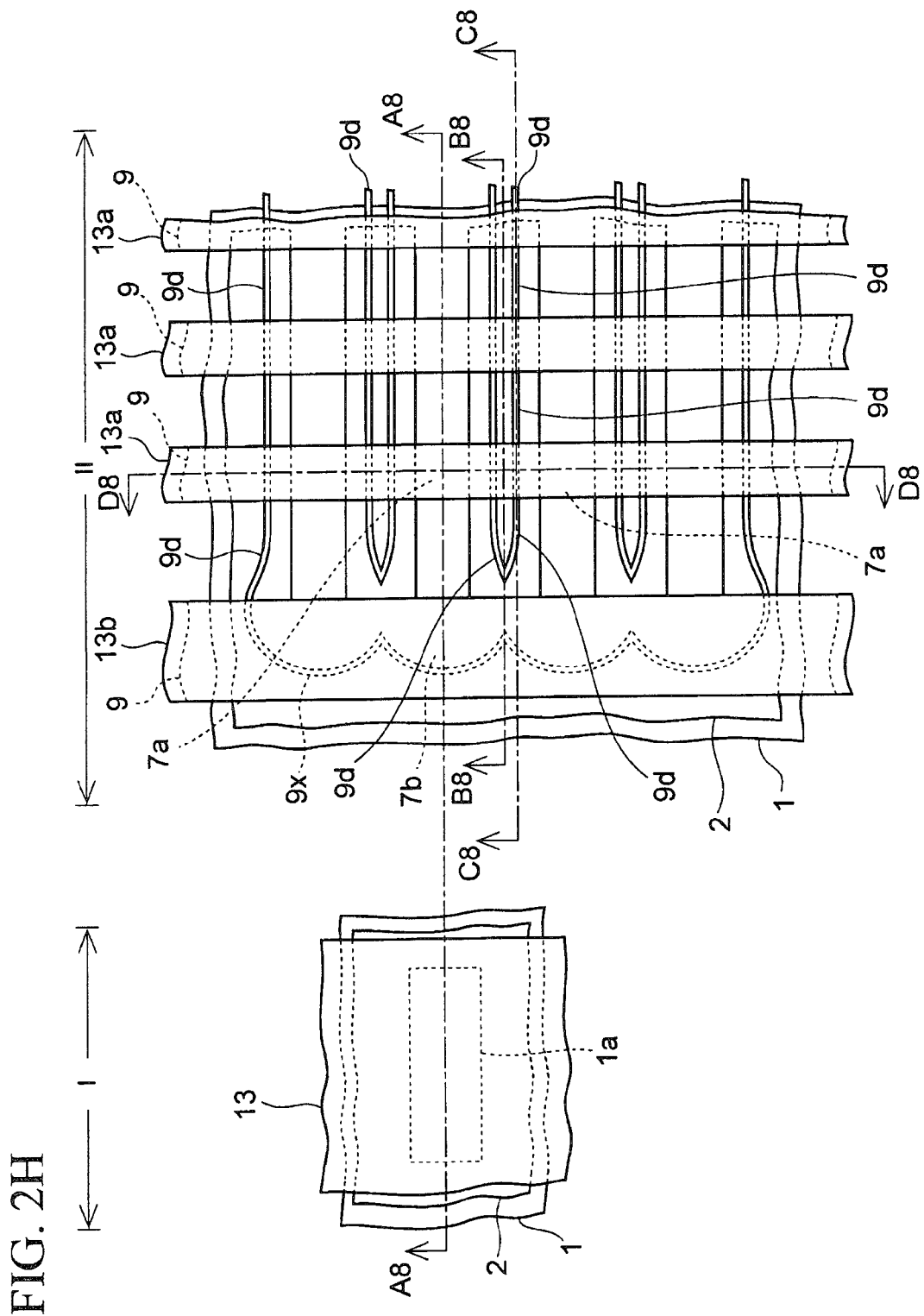

FIG. 2H is a plan view obtained after the third resist pattern 16 is removed. The peripheral circuit region I and cell region II (the first cross-section) of FIG. 1I are cross-sectional views taken along the line A8-A8 of FIG. 2H. The second to fourth cross-sections of the cell region II of FIG. 1I correspond to cross-sectional views taken along the lines B8-B8, C8-C8, and D8-D8 of FIG. 2H, respectively.

As shown in FIG. 2H, the intermediate insulating film 9 formed on the upper surface of the first conductive film 7 (see FIG. 2D) is etched to be removed in the space between the control gates 13a. However, the intermediate insulating film 9 formed on the side surface of the first conductive film 7 is formed in the thickness nearly equal to that of the first conductive film 7 in the thickness direction of the substrate 1. Therefore, the intermediate insulating film 9 on the side surface of the first conductive film 7 is not etched, and is left as a fence 9d.

Next, as shown in FIG. 1J, the side surfaces of the floating gates 7a and the control gates 13a are thermally oxidized to form thereon a thermal oxidation film 17 with a thickness of approximately 10 nm. The thermal oxidation film 17 plays a role of improving the retention properties of a flash memory cell finally formed, and is also formed on the side surface of the dummy control gate 13b.

Then, as shown in FIG. 1K, $As^-$ is ion-implanted as an n-type impurity in the silicon substrate 1 in the cell region II by an ion implantation using the floating gate 7a and the control gate 13a as a mask. The ion implantation conditions are, for example, acceleration energy of 50 KeV and a dose amount of $6.0 \times 10^{14}$ $cm^{-2}$. As a result of such ion implantation, first n-type source/drain extensions 18a are formed in the silicon substrate 1 beside the floating gate 7a.

Figure 2I:
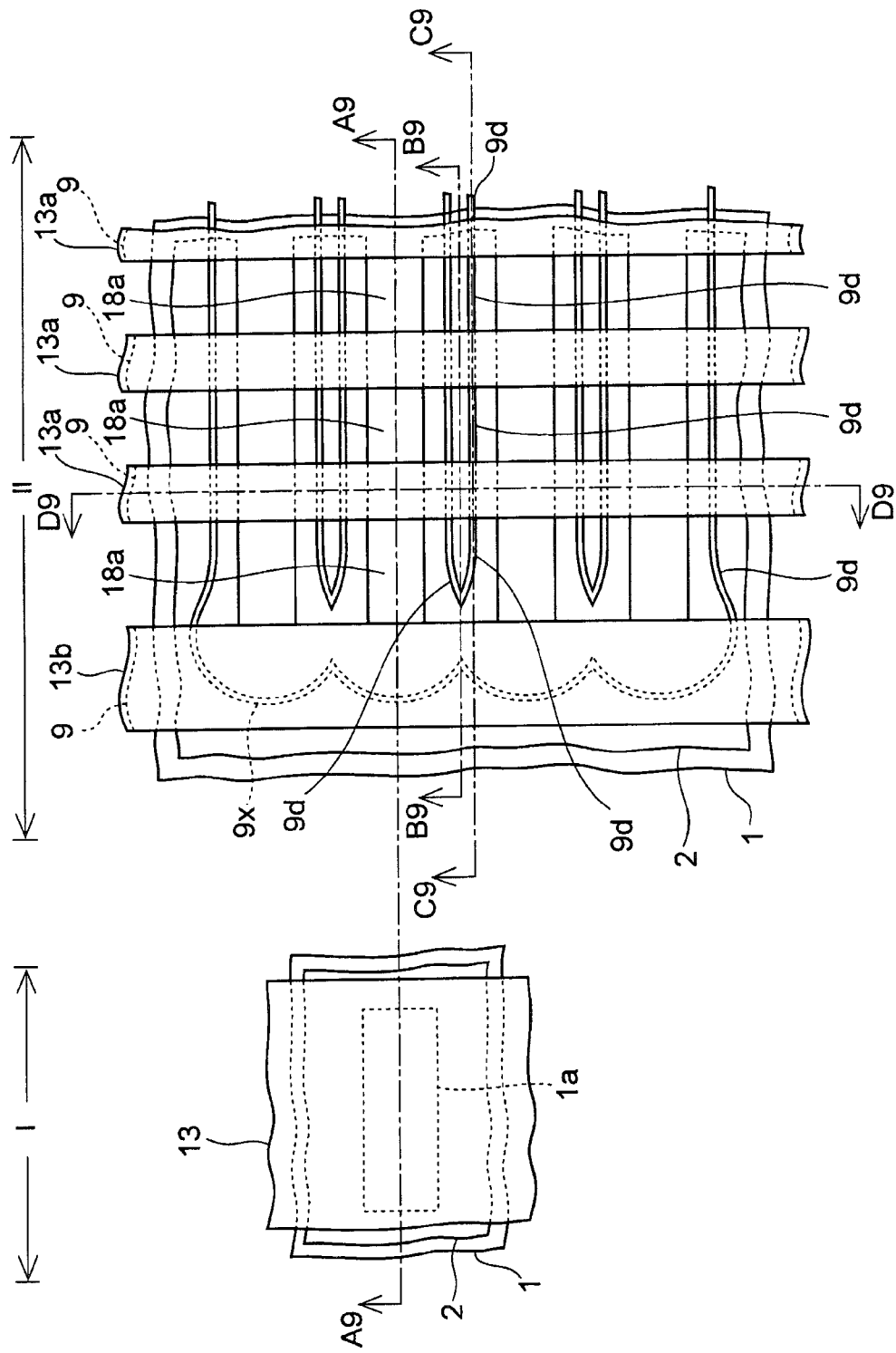

FIG. 2I is a plan view obtained after the above processes are finished. The peripheral circuit region I and cell region II (the first cross-section) of FIG. 1K are cross-sectional views taken along the line A9-A9 of FIG. 2I. The second to fourth cross-sections of the cell region II of FIG. 1K correspond to cross-sectional views taken along the lines B9-B9, C9-C9, and D9-D9 of FIG. 2I, respectively.

Next, processes for obtaining a cross-sectional structure shown in FIG. 1L will be described.

The side surfaces of the floating gates 7a and control gates 13a are thermally-oxidized again to further increase the thickness of the thermal oxidation film 17 by 9.5 nm. A silicon nitride film is then formed in the regions I and II by a plasma CVD method so that the thickness thereof on the flat surface of the silicon substrate 1 become about 115 nm. The silicon nitride film is etched back by an RIE so as to be left as first insulating side walls beside the floating gates 7a and the control gates 13a.

The first insulating side walls 20 are also formed beside the dummy control gate 13b.

Then, as shown in FIG. 1M, the second conductive film 13 in the peripheral circuit region I is etched using a fourth resist pattern 21 as a mask. The second conductive film 13 not etched and left under the fourth resist pattern 21 is made into a gate electrode 13c.

FIG. 2J is a plan view obtained after the above process is finished. The peripheral circuit region I and cell region II (the first cross-section) of FIG. 1M are cross-sectional views taken along the line A10-A10 of FIG. 2J. The second to fourth cross-sections of the cell region II of FIG. 1M correspond to cross-sectional views taken along the lines B10-B10, C10-C10, and D10-D10 of FIG. 2J, respectively.

Subsequently, as shown in FIG. 1N, a silicon oxide film is formed on the entire upper surface of the silicon substrate 1 by a plasma CVD method using TEOS as a reaction gas so that the thickness of the silicon oxide film on the flat surface of the silicon substrate 1 becomes 100 nm. Thereafter, the silicon oxide film is etched back to form second insulating side walls 22 on the side surfaces of the first insulating side walls 20 and the gate electrode 13c.

In this etching back, the tunnel insulating film 15 uncovered with the control gate 13a is etched, so that the tunnel insulating film 15 is left only under the control gate 13a.

Next, processes for obtaining a cross-sectional structure shown in FIG. 1O will be described.

Firstly, N-type source/drain regions 25a and p-type source/drain regions 25b are formed by an ion-implantation method using the second insulating side walls 22, the control gates 13a, and the gate electrode 13c as a mask. Unillustrated resist pattern is used in this ion-implantation process to separately implant the n-type impurity and the p-type impurity. Then, the resist pattern is removed after the ion-implantation process finishes.

Next, a $P^+$ ion is used as an n-type impurity, and is ion-implanted under conditions of acceleration energy of 10 KeV and a dose amount of $6.0 \times 10^{15}$ cm$^{-2}$. Then, a $B^+$ ion is used as a p-type impurity, and is ion-implanted under conditions of acceleration energy of 5 KeV and a dose amount of $4.0 \times 10^{15}$ cm$^{-2}$.

Next, a cobalt film with a thickness of 8 nm and a titanium nitride (TiN) film with a thickness of 10 nm are formed on the entire surface in this order by a sputtering method. These films are annealed to be reacted with silicon by RTA (Rapid Thermal Anneal) under the conditions of a substrate temperature of approximately 550° C. and a processing time of approximately 0.5 minutes. Then, the cobalt film and titanium nitride film left unreacted on the device isolation insulating film 2 and the like are wet-etched to be removed using a mixture solution of APM and SPM as an etching solution. A cobalt silicide layer 26 is thereby left on the surface layer of the silicon substrate 1. The above-described APM means a mixture solution of pure water, hydrogen peroxide solution and NH$_4$OH, whereas the SPM means a mixture solution of sulfuric acid and hydrogen peroxide solution.

The cobalt silicide layer 26 is also formed on the upper surface of the gate electrode 13c. Consequently, the gate electrode 13c has a salicide structure.

After that, the cobalt silicide layer 26 is annealed again by an RTA to lower the resistance of the cobalt silicide layer 26. For example, a substrate temperature of 800° C. and a processing time of 0.5 minutes are employed as conditions of the RTA.

Through the processes described so far, a MOS transistor TR is formed in the peripheral circuit region I.

On the other hand, in the cell region II, a flash memory FL constructed from the control gate 13a, the intermediate insulating film 9a, floating gate 7a, tunnel insulating film 15, and the n-type source/drain region 25a is formed.

Figure 2K:
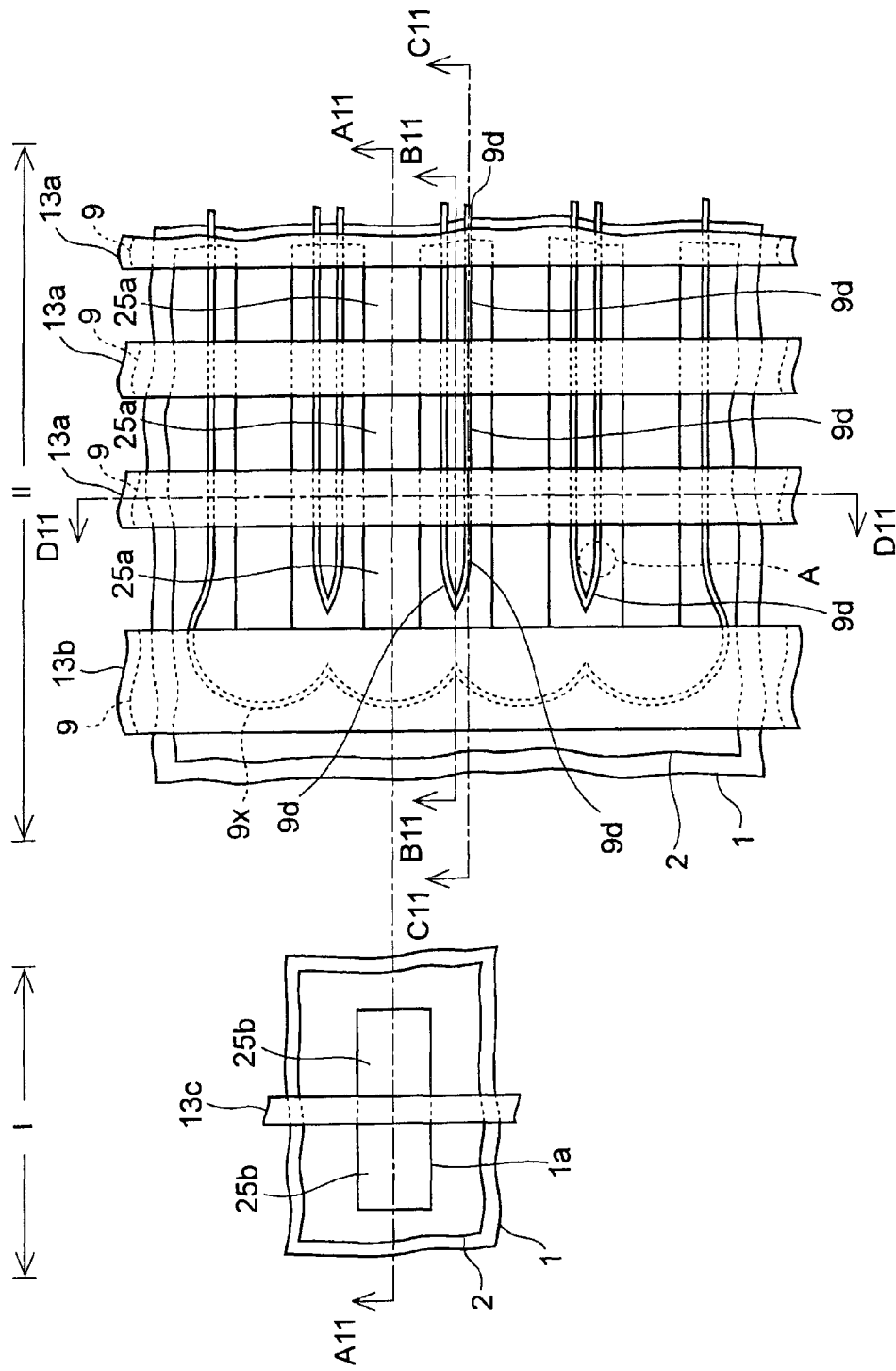

FIG. 2K is a plan view obtained after the above processes are finished. The peripheral circuit region I and cell region II (the first cross-section) of FIG. 1O are cross-sectional views taken along the line A11-A11 of FIG. 2K. The second to fourth cross-sections of the cell region II of FIG. 2K correspond to cross-sectional views taken along the lines B11-B11, C11-C11, and D11-D11 of FIG. 2K, respectively.

Next, processes for obtaining a cross-sectional structure shown in FIG. 1P will be described.

A silicon oxide film is formed as an interlayer insulating film 27 on the entire upper surface of the silicon substrate 1 by a CVD method. Then, the interlayer insulating film 27 is planarized by a CMP method. Thereafter, the interlayer insulating film is patterned by photolithography to form contact holes in the interlayer insulating film 27 on the source/drain regions 25a and 25b.

Then, a titanium nitride film is formed as a glue film on the inner surfaces of the contact holes and on the upper surface of the interlayer insulating film 27 by a sputtering method. Thereafter, a tungsten film is formed on the glue film by a CVD method. The contact holes are completely filled with this tungsten film. Subsequently, the excessive glue film and tungsten film on the upper surface of the interlayer insulating film 27 are polished and removed by a CMP method. The glue film and the tungsten film are consequently left only in the contact holes as conductive plugs 28.

Figure 2L:
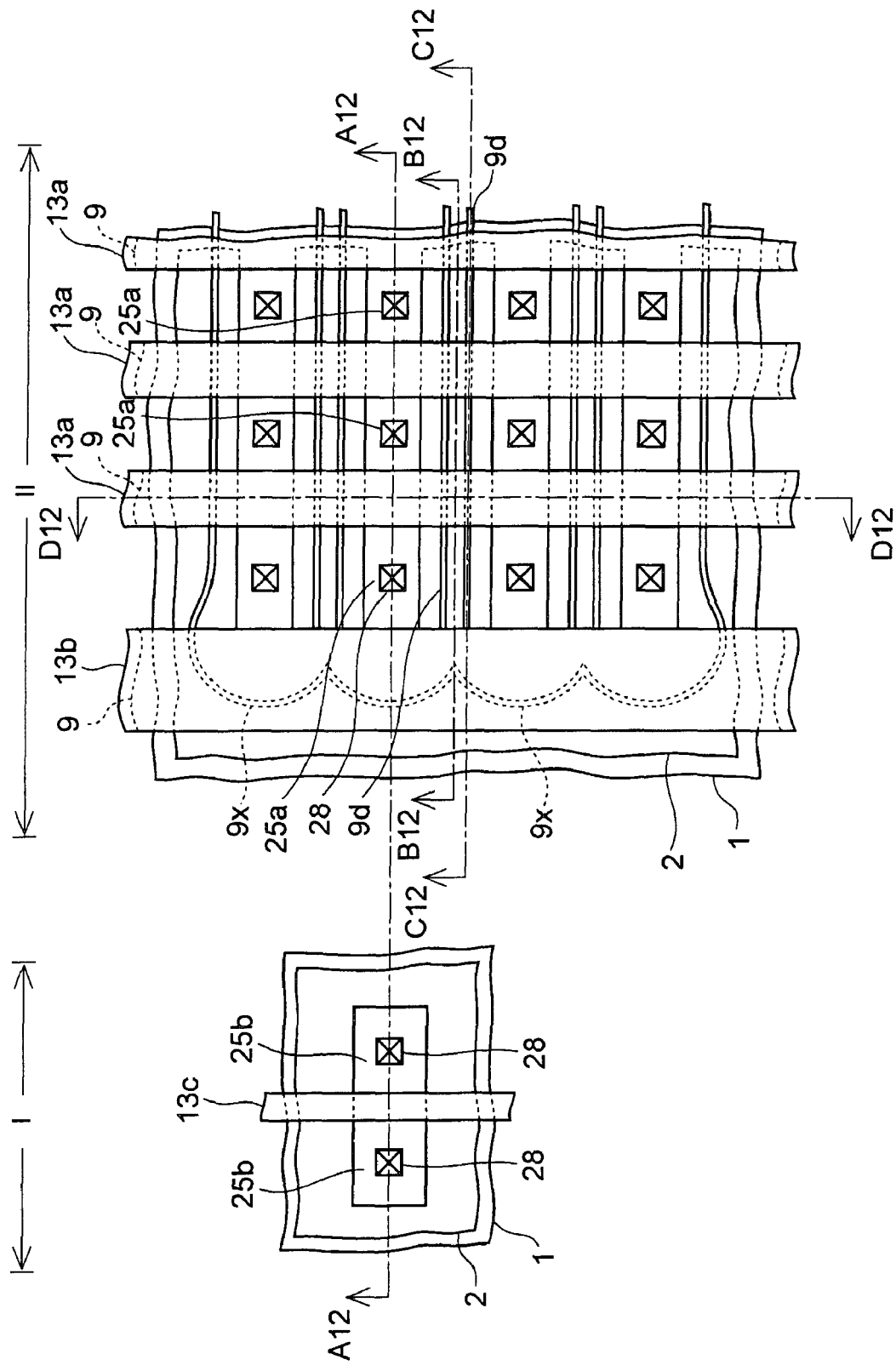

FIG. 2L is a plan view obtained after the above processes are finished. The peripheral circuit region I and cell region II (the first cross-section) of FIG. 1P are cross-sectional views taken along the line A12-A12 of FIG. 2L. The second to fourth cross-sections of the cell region II of FIG. 1P correspond to cross-sectional views taken along the lines B12-B12, C12-C12, and D12-D12 of FIG. 2L, respectively.

By the processes so far, the basic structure of the flash memory is completed.

According to this flash memory, as shown in the plan view of FIG. 2K, the intermediate insulating film 9, which is made of the ONO film and is not etched in patterning the control gates 13a, is left as the fence 9d in the space between the control gates 13a in the cell region II.

The fence 9d is physically unstable. However, the fence 9d formed between the control gates 13a is unlikely to be peeled off in the process, because the fence 9d is formed in a linear shape between the control gates 13a.

On the other hand, the shape of the patterned first conductive film 7 becomes rounded in a planar view at the end of the cell region II due to the optical proximity effect in exposing as described above. Consequently, the step portion 9x of the intermediate insulating film 9 also becomes rounded. If the dummy control gate 13b is not formed, the step portion 9x is not etched to be left as a curved fence.

Such a curved fence is more unstable than the linear fence 9d between the control gates 13a, and is likely to be peeled off in the process.

To deal with this problem, in this example, the dummy control gate 13b is provided at the end of the cell region II. The dummy control gate 13b covers the intermediate insulating film 9 so that a curved fence is not formed at the end of the cell region II.

This structure has a certain degree of effect of preventing the fence under the dummy control gate 13b from being peeled off.

However, the investigation made by the present inventors revealed that the fence 9d between the dummy control gate 13b and the real control gate 13a, i.e., the portion surrounded by a dotted-lined circle A in FIG. 2K, is also very likely to be peeled off. It is speculated that this is because the planar shape of the fence 9d in this area is in the transition from a linear shape to a curved shape, resulting in the extreme physical instability of the fence 9d due to the combination of such different kinds of shapes.

If the fence 9d is peeled off in the process, the fence 9d is reattached to another part of the silicon substrate 1 to cause patterning defect. As a result, a flash memory fails to function, resulting in the reduction in the production yield of a semiconductor device. Therefore, a new measure for preventing the fence 9d in the dotted-circle A from being peeled off is required.

In view of these problems, the inventors have reached the idea of the embodiment of the semiconductor device described below.

(2) First Embodiment

In the example of the above described preliminary explanation, the half-tone type reticle 100 described in FIG. 3 is used in forming the first resist pattern 8 shown in FIG. 2B by exposure.

As shown in FIG. 3, the light-shielding pattern 102 of the reticle 100 is obtained merely by a similar extension of the design shape of the first resist pattern 8 (see FIG. 2B) without considering the deformation of the projected image due to an optical proximity effect.

Figure 4:
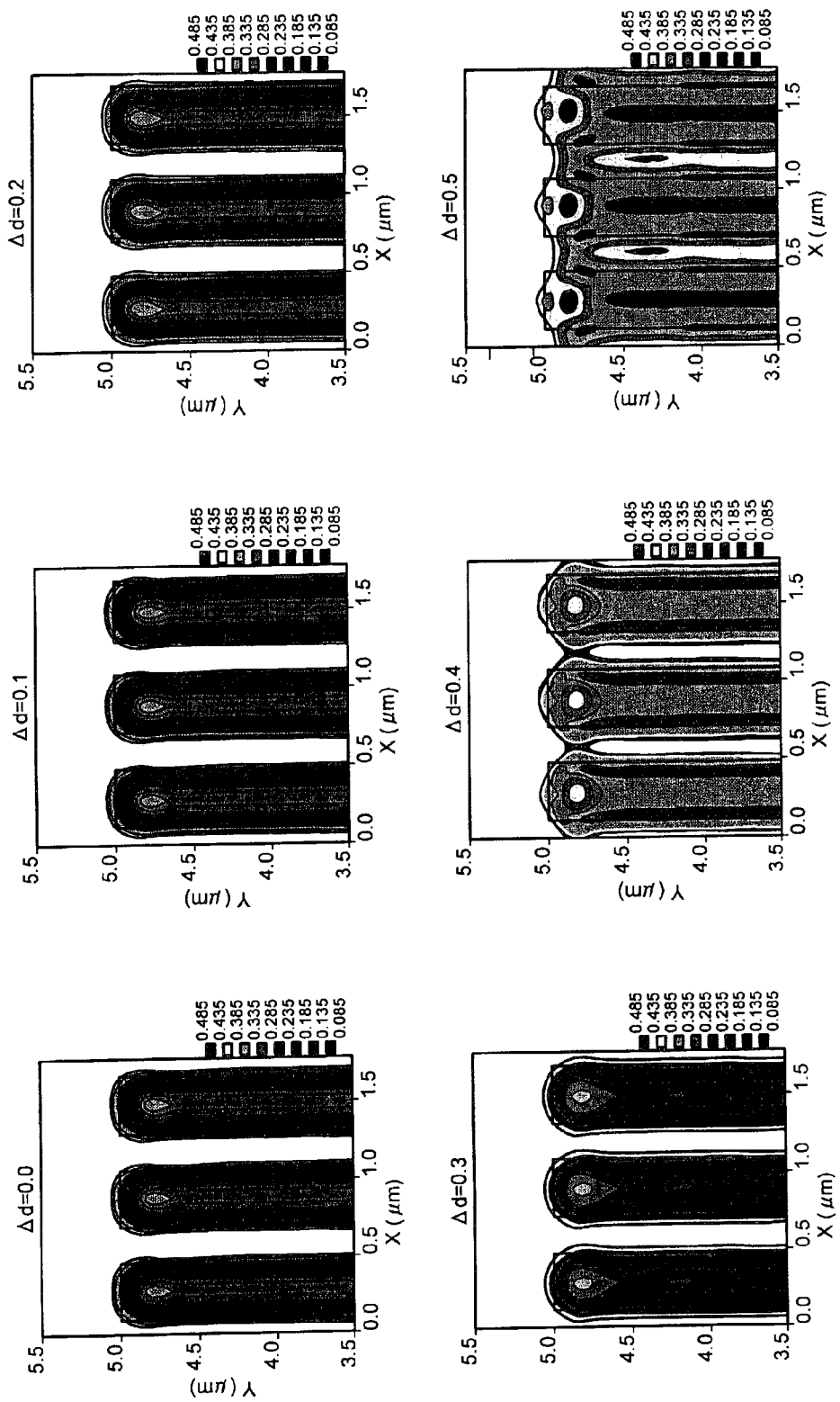
FIG. 4 is a plan view obtained by simulating how the planar shape of the first resist pattern formed by using the reticle shown in FIG. 3 changes due to the defocusing in an exposure apparatus.

FIG. 4 is a plan view obtained by simulating how the planar shape of the first resist pattern 8 obtained by using the reticle 100 is changed due to the defocusing Δd (μm) of the exposure apparatus.

Note that the pattern concentration in FIG. 4 indicates the intensity of light in the projected image of the light-shielding pattern 102.

It can be seen from FIG. 4 that, if the defocusing Δd is 0.4 or more, the first resist patterns 8 adjacent to each other are connected with each other due to the optical proximity effect.

Figure 5:
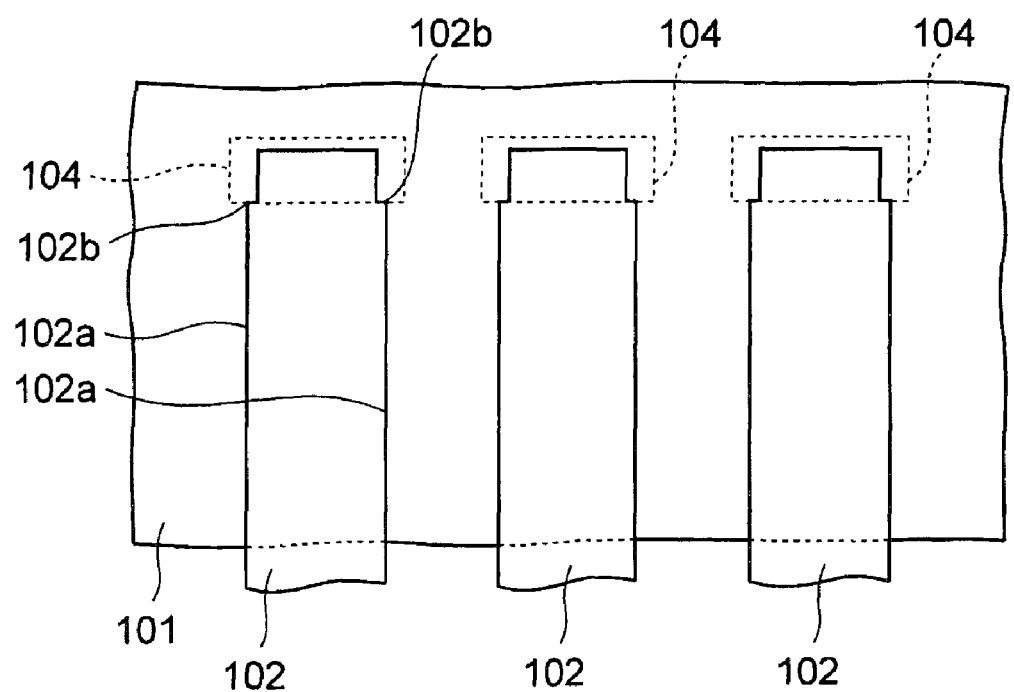
FIG. 5 is an enlarged plan view of a reticle devised to reduce the deformation of the projected image caused due to an optical proximity effect in a first embodiment.

FIG. 5 is an enlarged plan view of a reticle 103 devised to reduce such a deformation of the projected image caused due to such an optical proximity effect.

In this reticle 103, only a single edge 102b is provided in a long side 102a near the end of the light-shielding pattern 102. A portion extending beyond the edges 102b is hereinafter referred to as a narrow width portion 104.

Figure 6:
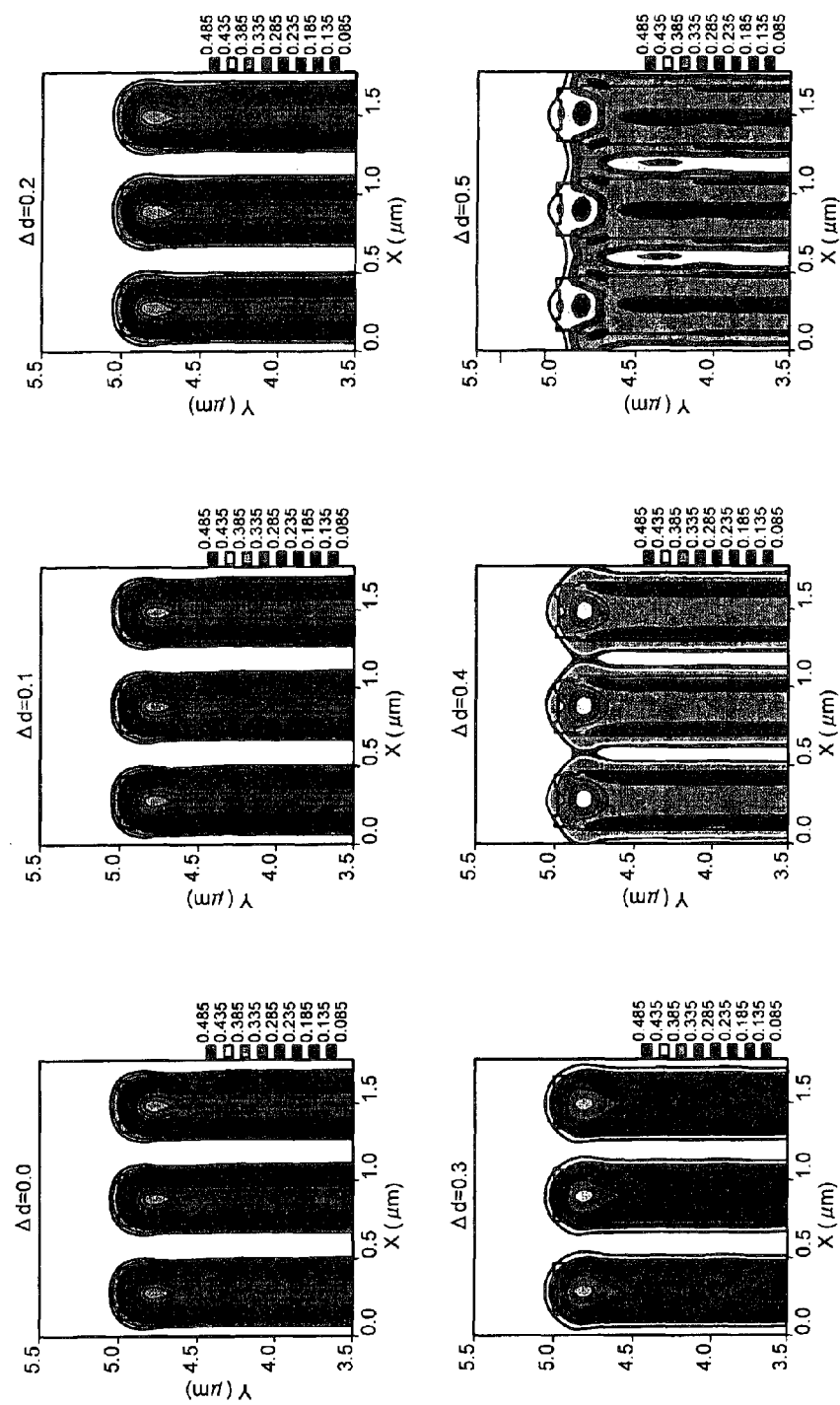
FIG. 6 is a plan view obtained by simulating how the planar shape of the first resist pattern formed by using the reticle shown in FIG. 5 changes due to the defocusing in the exposure apparatus.

FIG. 6 is a plan view obtained by simulating how the planar shape of the first resist pattern 8 obtained by using the reticle 103 in which the narrow width portion 104 is formed is changed due to the defocusing Δd of the exposure apparatus.

In FIG. 6, the width in which the first resist patterns 8 are connected with each other is smaller than that in FIG. 4 when a defocusing Δd is 0.4. Thus, the deformation of the first resist pattern 8 is improved to a certain extent. However, the fact remains that the first resist patterns 8 are connected with each other when the defocusing Δd is 0.4.

Figure 7:
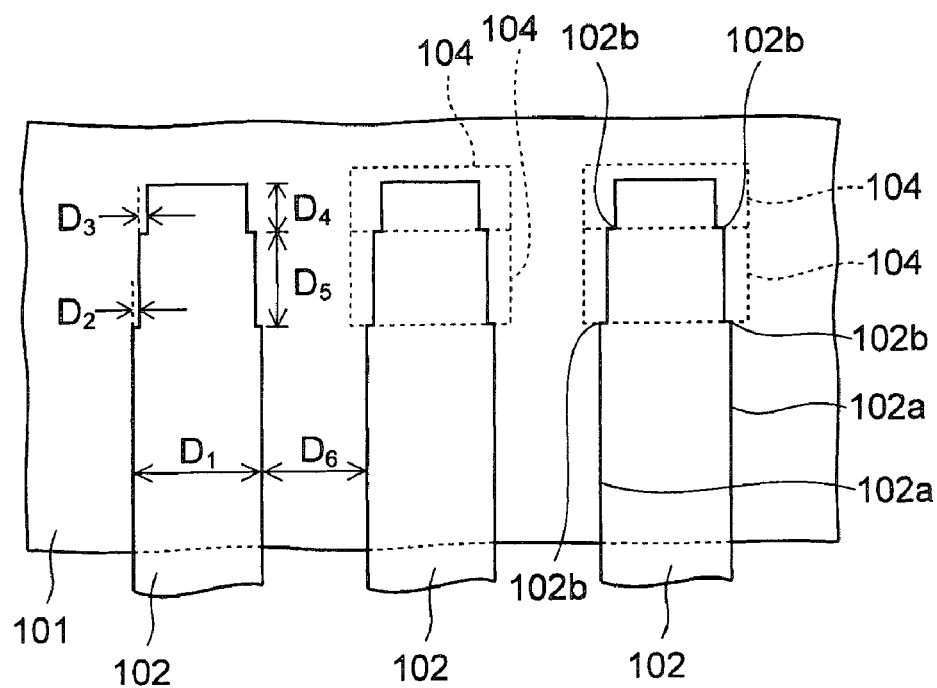
FIG. 7 is an enlarged plan view of a reticle devised to further reduce the deformation of the projected image caused due to an optical proximity effect in the first embodiment.

FIG. 7 is an expanded plan view of a reticle 105 devised to further reduce the deformation of the projected image caused due to the optical proximity effect.

In this reticle 105, the number of the edge 102b provided on the long sides 102a of the light-shielding pattern 102 is increased by one. Thereby, two narrow width portions, the widths of which become smaller in a stepwise fashion toward the end of the light-shielding pattern 102, are formed.

The values $D_1$ to $D_6$ shown in FIG. 7 are not particularly limited. In the present embodiment, the values are as follows.

$D_1$=400 nm
$D_2$=10 nm
$D_3$=10 nm
$D_4$=120 nm
$D_5$=150 nm
$D_6$=200 nm

Note that these values are values of the projected image of the light-shielding pattern 102 projected on the silicon substrate when it is assumed that the deformation of the image is not caused due to an optical proximity effect. The actual values of the light-shielding pattern 102 in the reticle 105 are given by multiplying these values by the reciprocal of the reduction ratio (1/4) of the exposure apparatus.

Figure 8:
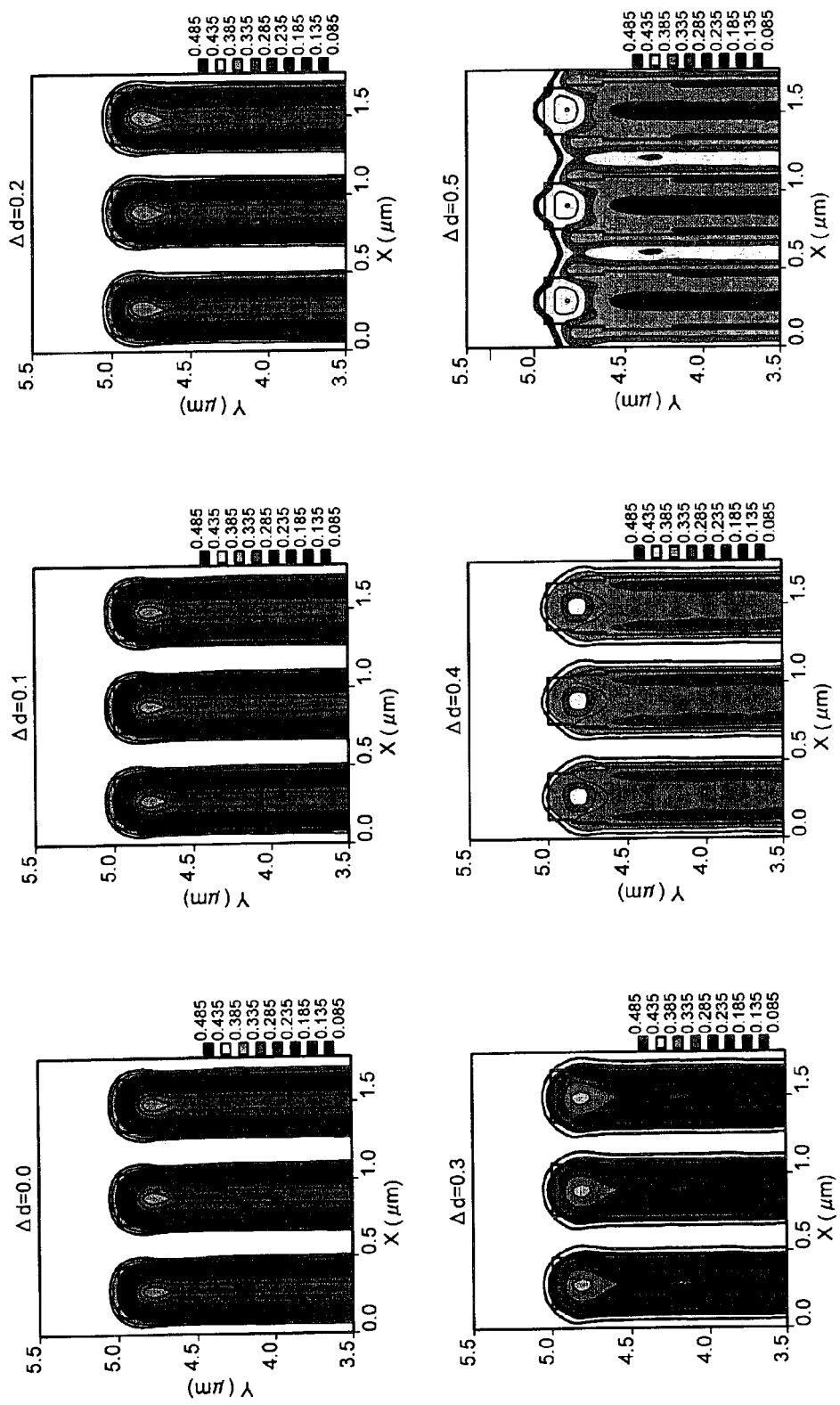
FIG. 8 is a plan view obtained by simulating how the planar shape of the first resist pattern formed by using the reticle shown in FIG. 7 changes due to the defocusing in the exposure apparatus.

FIG. 8 is a plan view obtained by simulating how the planar shape of the first resist pattern 8 obtained by using the reticle 105 provided with two narrow width portions 104 is changed due to the defocusing Δd of the exposure apparatus.

As shown in FIG. 8, when the reticle 105 is used, the first resist patterns 8 are not connected with each other at the defocusing Δd of 0.4. Thus, focus margin, which is defined as a margin of the defocusing by which the first resist patterns 8 are not connected, can be increased.

Figure 9:
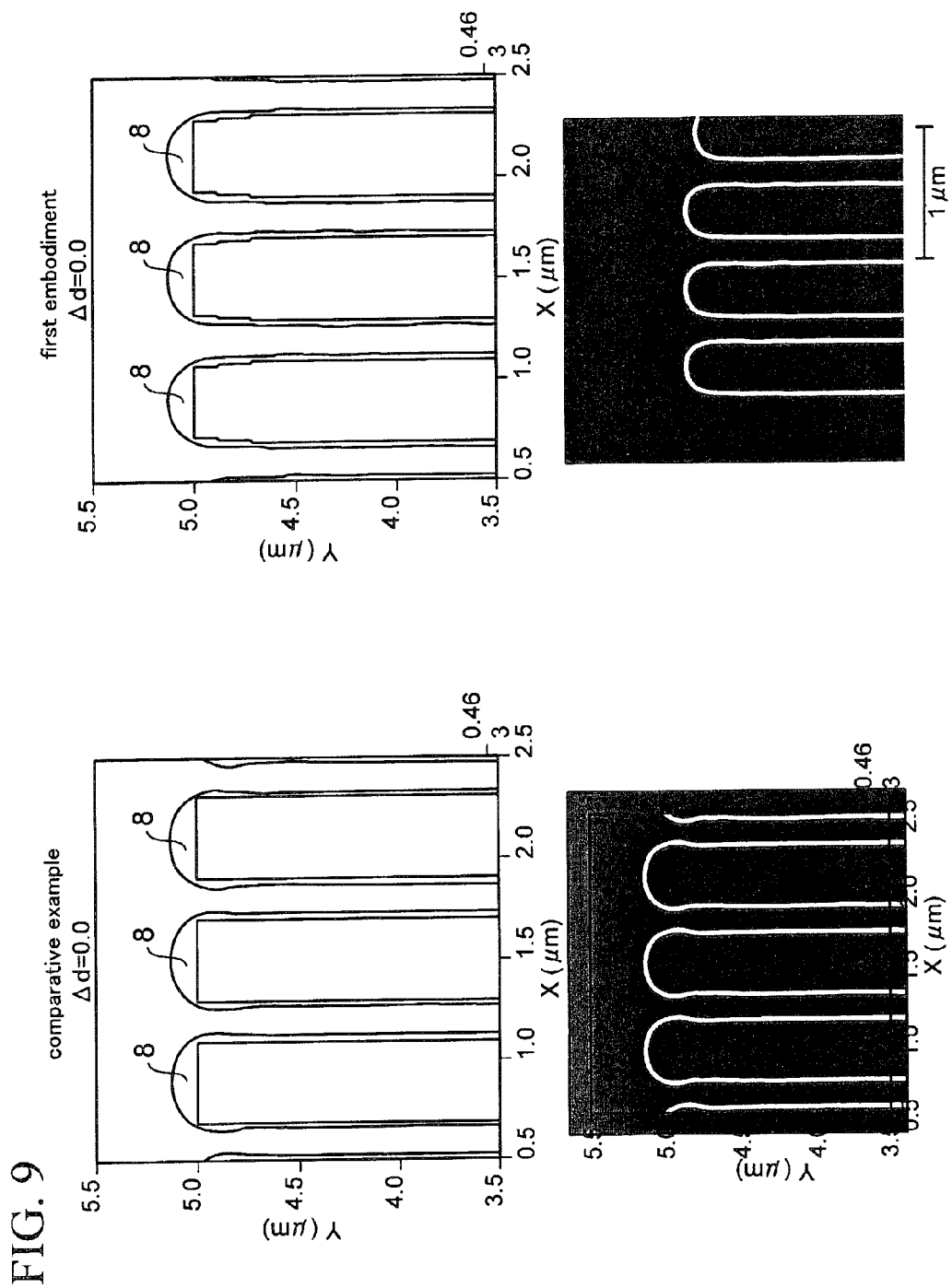
FIG. 9 is a drawing showing the simulation results of the planar shape of the first resist pattern obtained by respectively using the reticle shown in the preliminary explanation and the reticle of the first embodiment, and the SEM image of an actual resist pattern.
Figure 10:
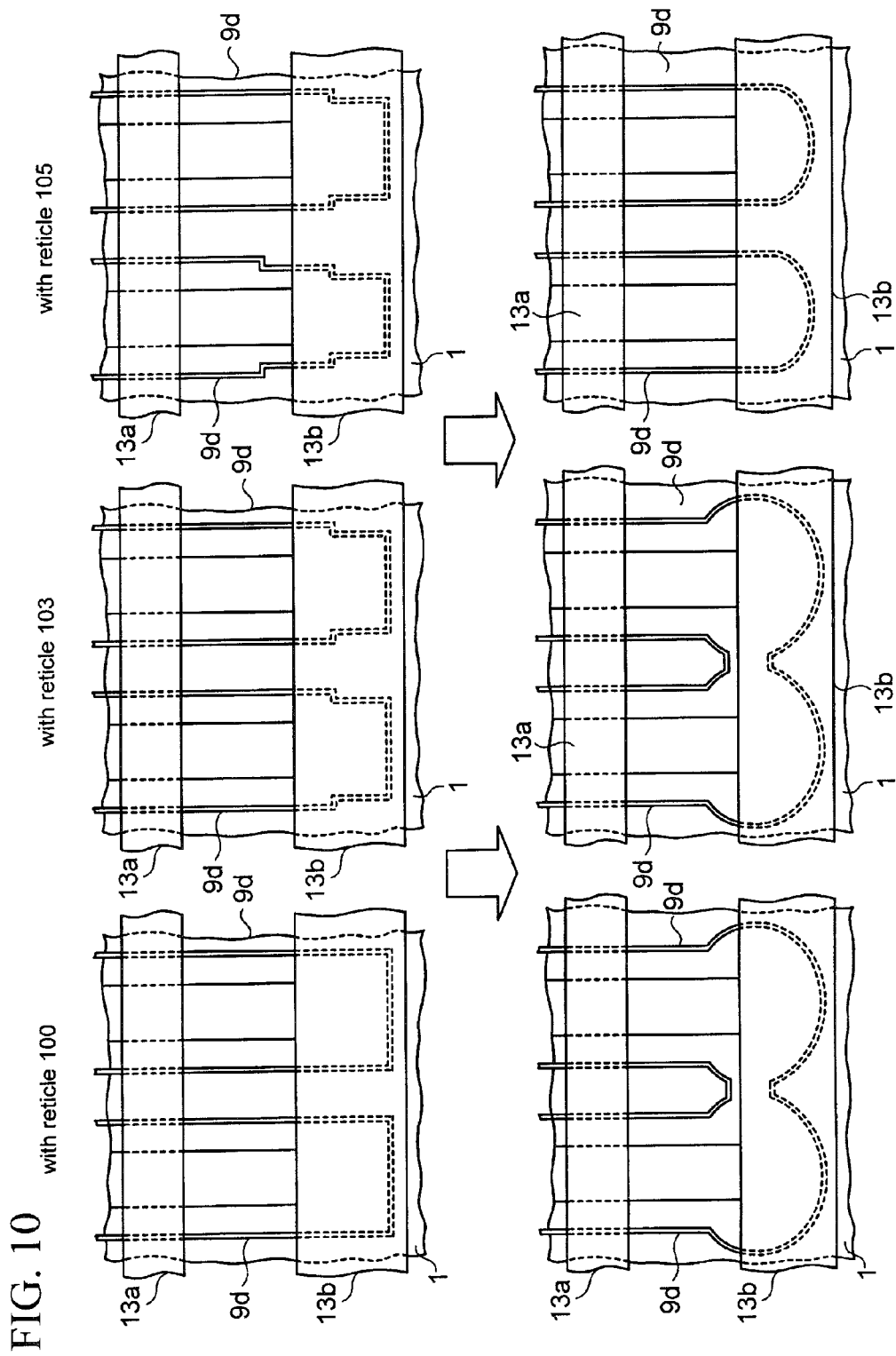

FIG. 9 shows the simulation results of the planar shape of the first resist patterns 8 obtained by respectively using the reticle 100 described in the preliminary explanation (comparative example) and the reticle 105. In FIG. 9, the SEM (Scanning Electron Microscope) images of the actual resist patterns 108 are also shown for the reticles 100 and 105. Note that the comparative example is shown in the left in FIG. 9, and the present embodiment in the right in FIG. 9.

As shown in FIG. 9, in SEM image of the comparative example, the end portions of the first resist patterns 8 are expanded, as is expected by the simulation. In contrast, in the SEM image of the present embodiment in which the two narrow width portions 104 are provided, the expansion of the end portions of the first resist patterns 8 is suppressed.

Figure 10:
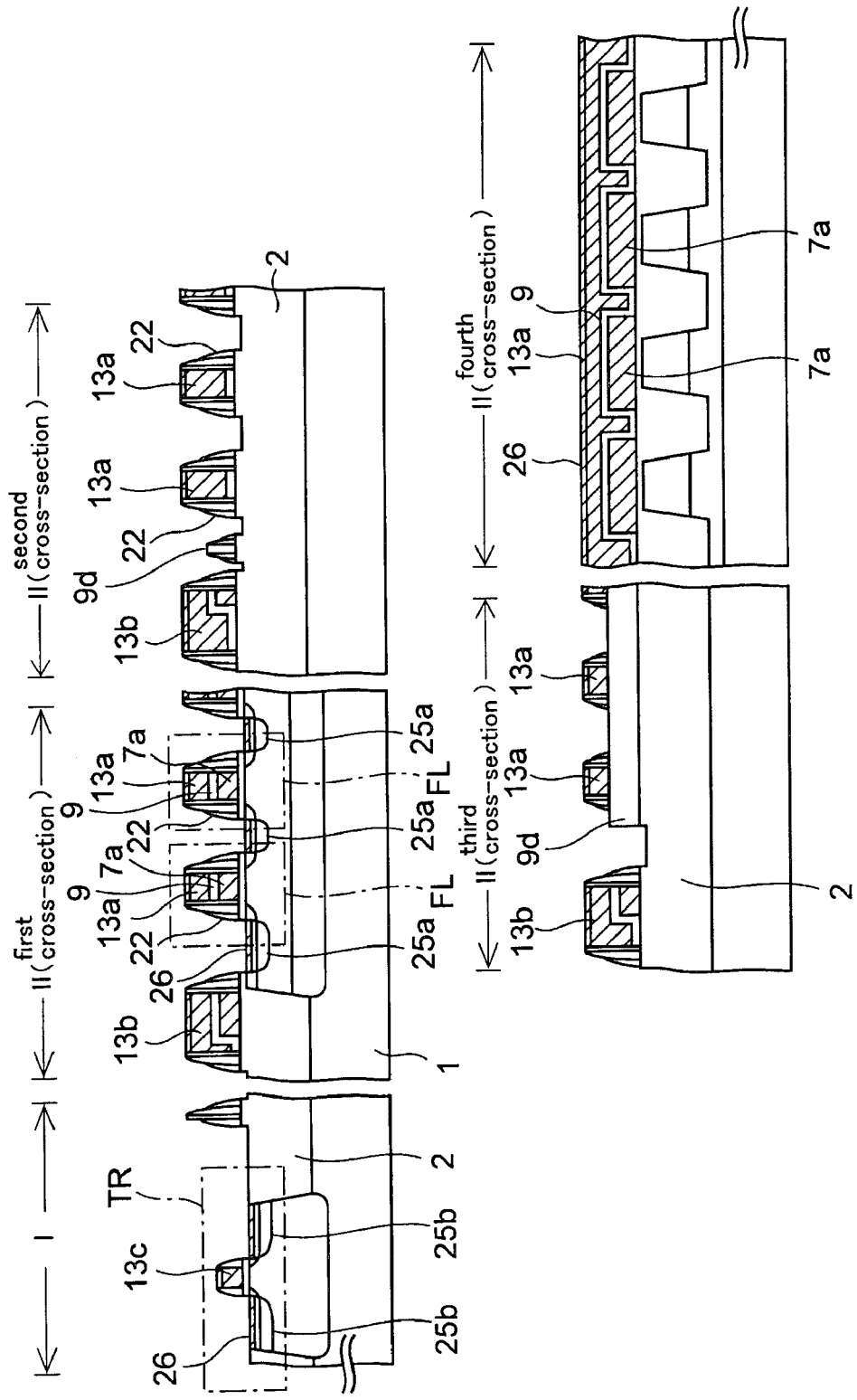
FIG. 10 is a plan view schematically showing conditions in which a focus margin is increased in the increasing order of the reticle described in the preliminary explanation (left side), a reticle provided with one step of a narrow width portion (center), and a reticle provided with two steps of a narrow width portion (right side).

FIG. 10 is a plan view schematically showing manner where the focus margin is enlarged. In FIG. 10, situations are shown for the case where the reticle 100 (left) explained in the preliminary explanation, the reticle 103 (center) having a single narrow width portion 104, and the reticle 105 (right) having two narrow width portions 104 are used. Note that in FIG. 10, the upper three figures show a theoretical planar layout, and the lower three figures show an actually obtained planar layout.

As described with reference to FIGS. 7 and 8, the reticle 105 provided with two narrow width portions is effective for increasing the focus margin in forming the first resist patterns 8. Accordingly, the reticle 105 is used in the embodiment described below.

Incidentally, the light-shielding pattern 102 of the reticle 105 is formed by patterning a light-shielding film made of MoSiN, which is formed on the transparent substrate 101 made of quartz, by a lithography using an EB (Electron Beam) patterning apparatus.

The EB patterning apparatus draws figures by deflecting an electron beam in x and y directions, which are perpendicular to each other in the surface of the transparent substrate 101. Therefore, it is easy for the EB patterning apparatus to draw a figure, whose outline is constructed from lines extending in x and y directions, like the light-shielding pattern 102.

In contrast, Japanese Patent Application Publication No. Hei 1-188857 proposes to obliquely cut the corner of a stripe-shaped exposure pattern. In this case, however, it is required that the oblique portions be drawn by slightly adjusting the deflection amount of electron beam in the x and y direction. Therefore, a significant amount of time is required for drawing the figures, and hence the manufacturing cost of the reticle increases.

Here, there are two types of OPC employable as the OPC for the light-shielding pattern 102 of the reticle 105 in FIG. 7 D One is an automatic OPC, in which the shape correction of the light-shielding pattern 102 is performed in a calculator. The other is a manual OPC, in which the above shape correction is performed by an operator.

In the present embodiment, any of the automatic OPC and the manual OPC may be used to provide the narrow width portion 104 for the light-shielding pattern 102.

However, in the current technology, it is difficult to apply the automatic OPC to a repeating stripe-shaped pattern, such as the light-shielding pattern 102. This is because the automatic OPC uses an OPC table constructed of a pair of a pattern interval and a width correction amount of a pattern, and it is difficult to create this OPC table for a repeating pattern such as the light-shielding pattern 102.

Therefore, under the present circumstances, the narrow width portion 104 is provided for the light-shielding pattern 102 by using the manual OPC.

However, when the technology is advanced in the future, the automatic OPC may of course be used to provide the narrow width portion 104.

(3) Second Embodiment

Figure 11A:
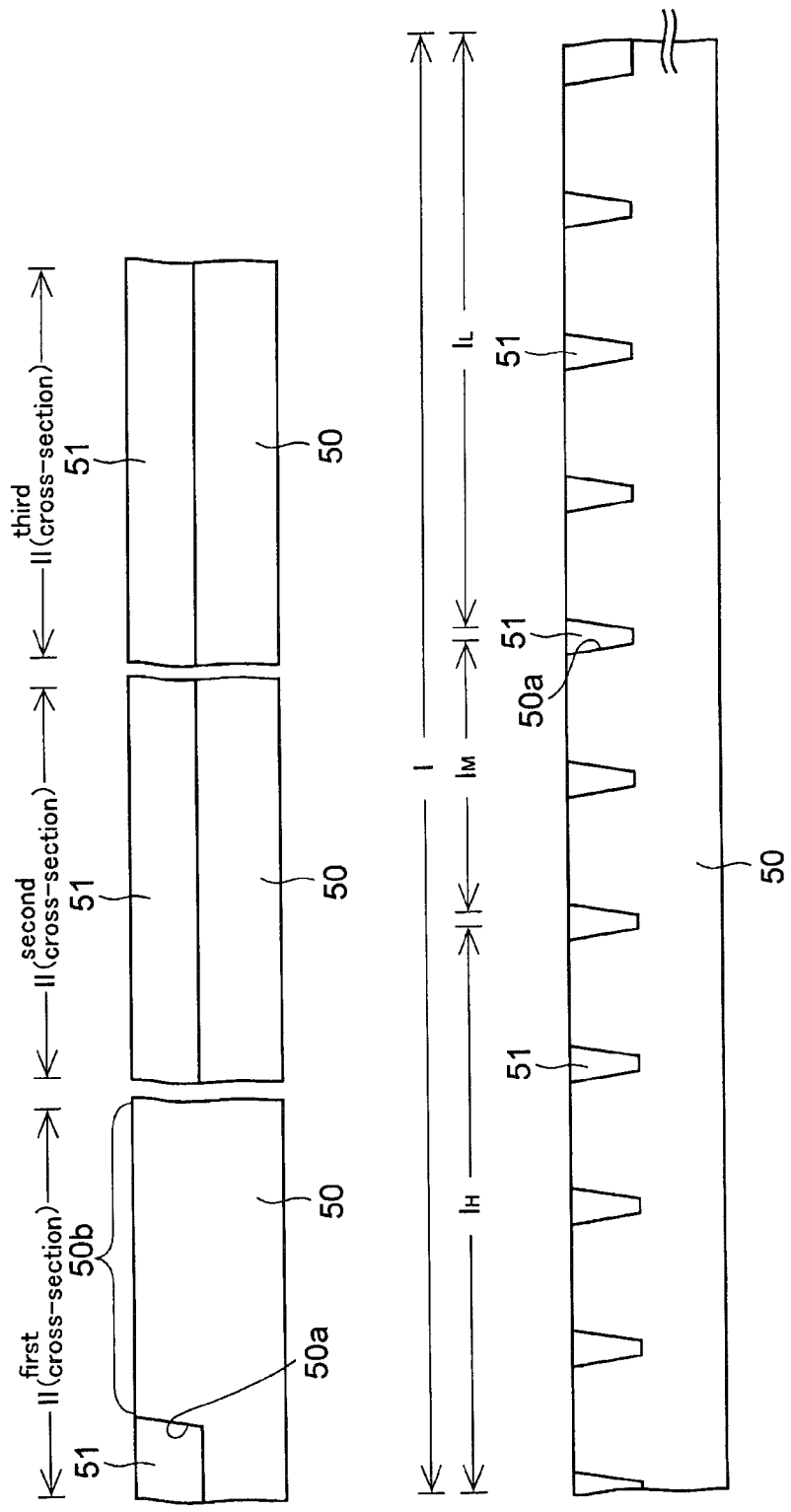
FIGS. 11A to 11T are cross-sectional views showing processes of manufacturing a semiconductor device of a second embodiment.
Figure 11B:
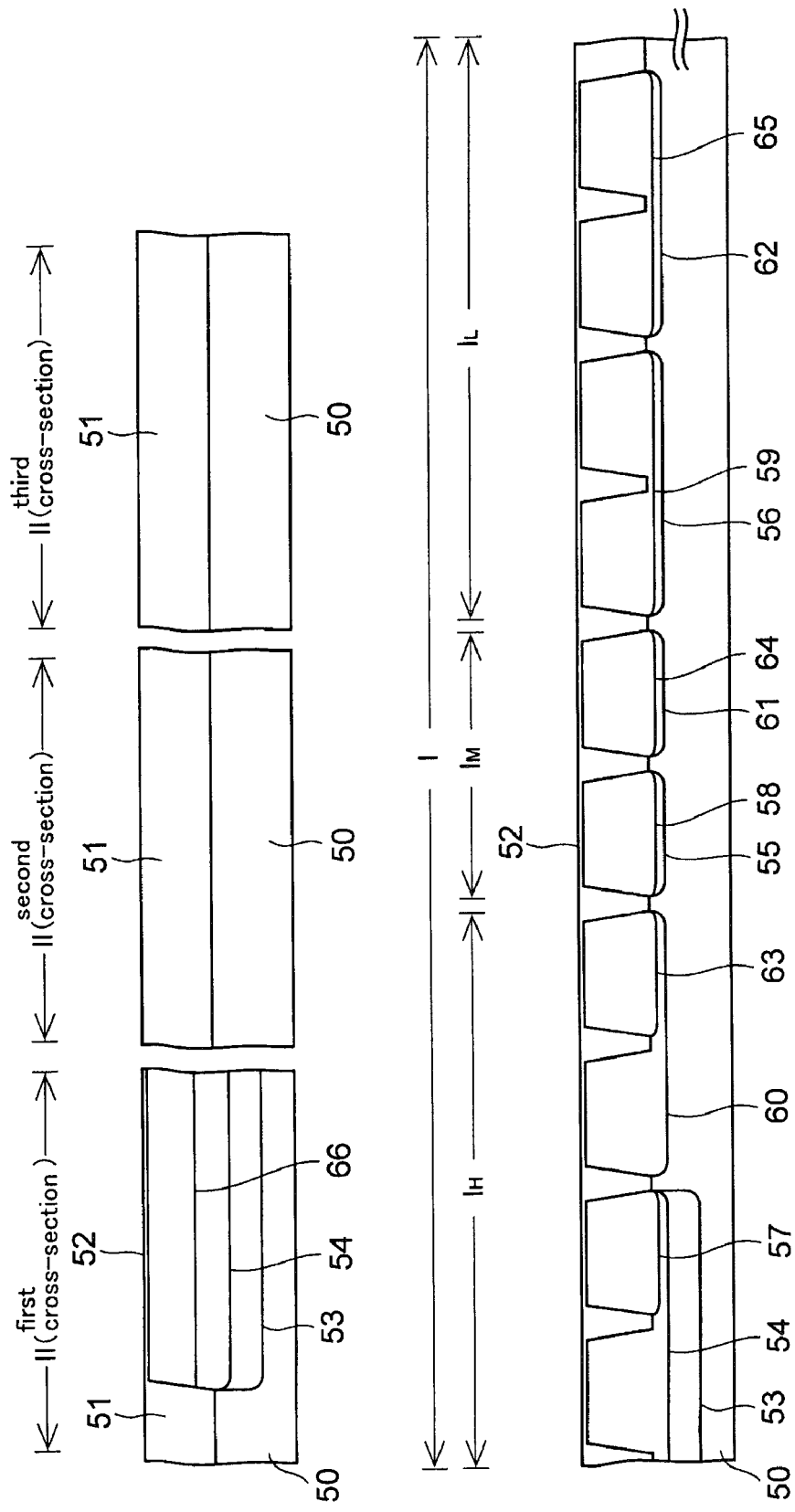
Figure 11C:
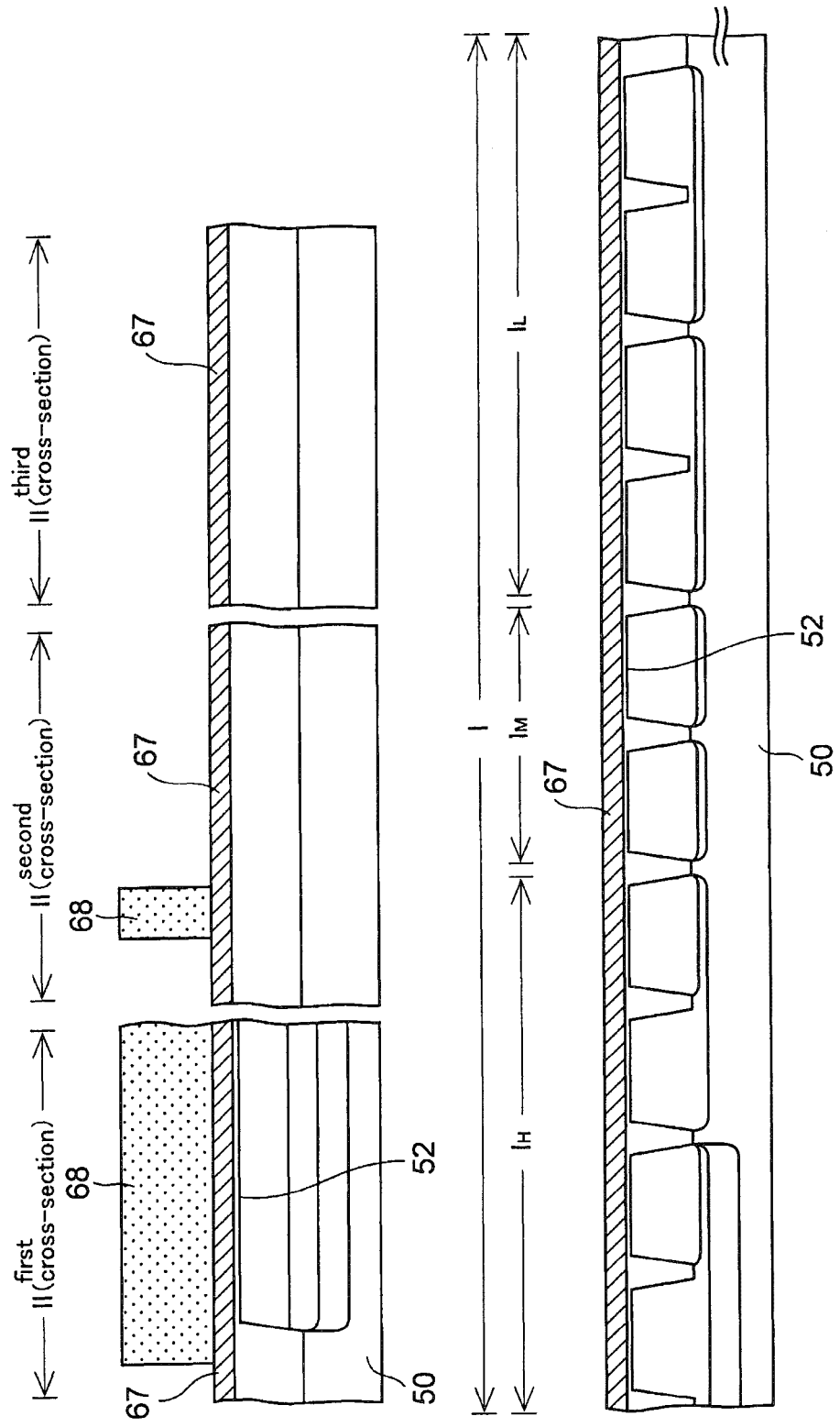
Figure 11D:
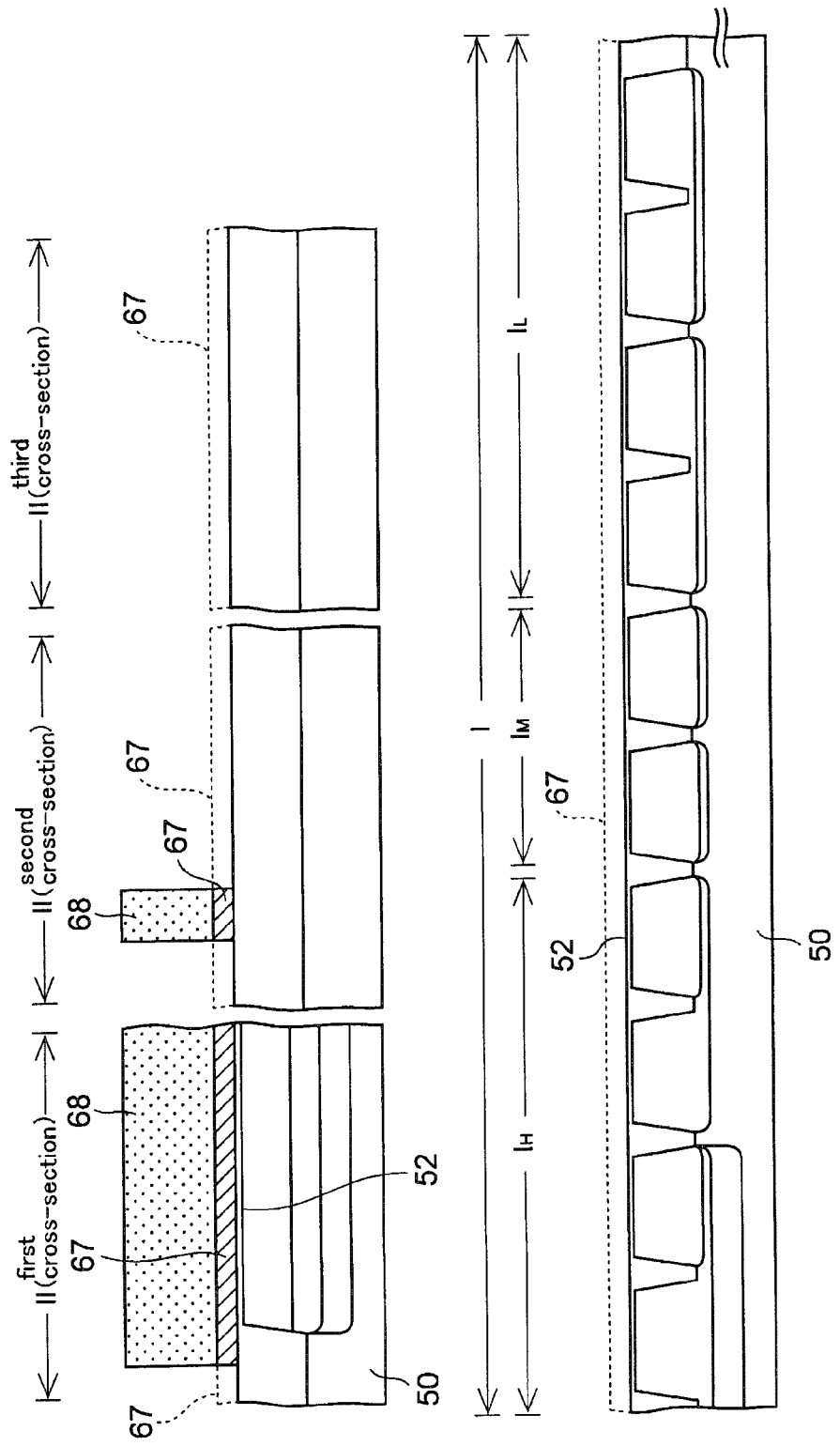
Figure 11E:
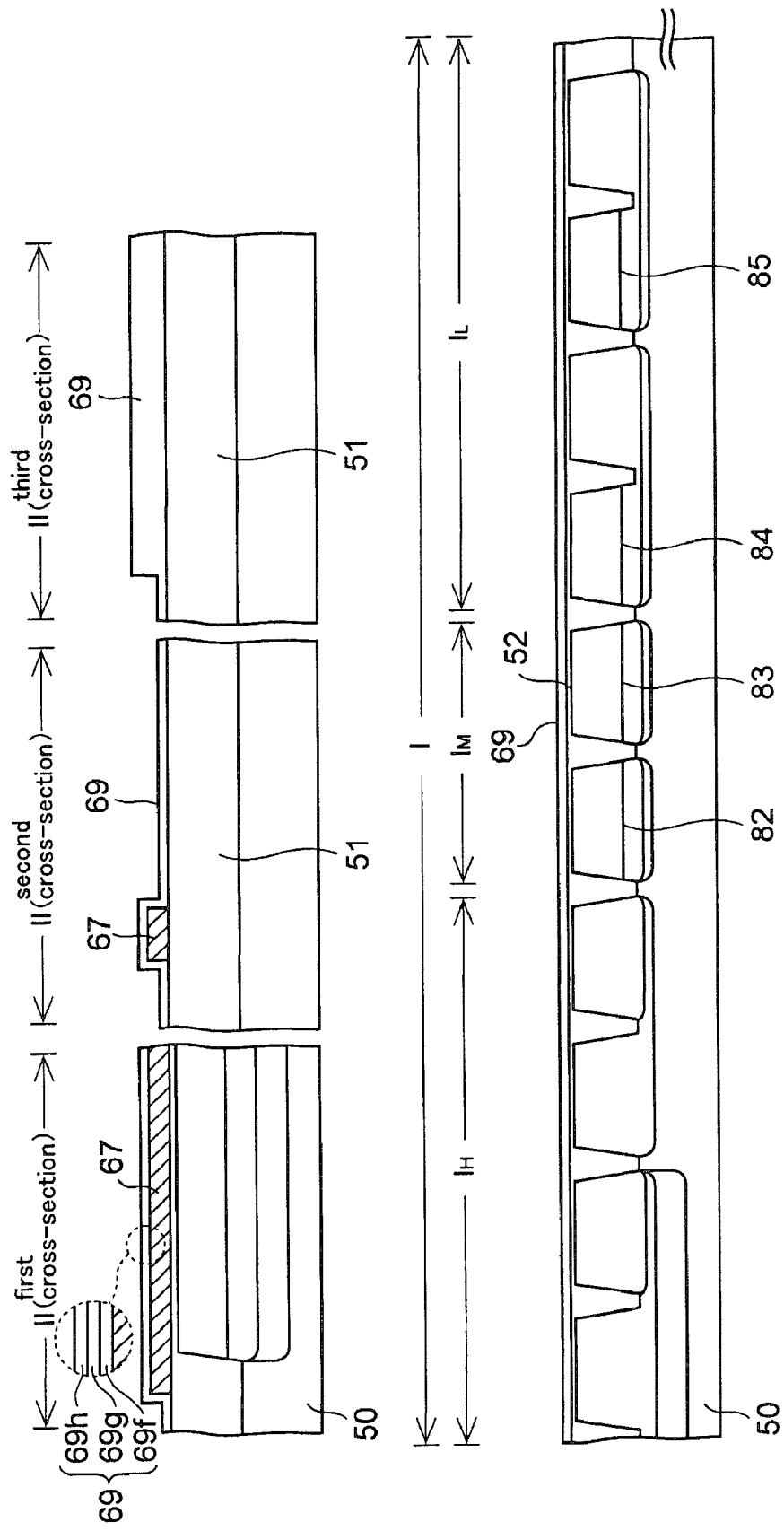
Figure 11F:
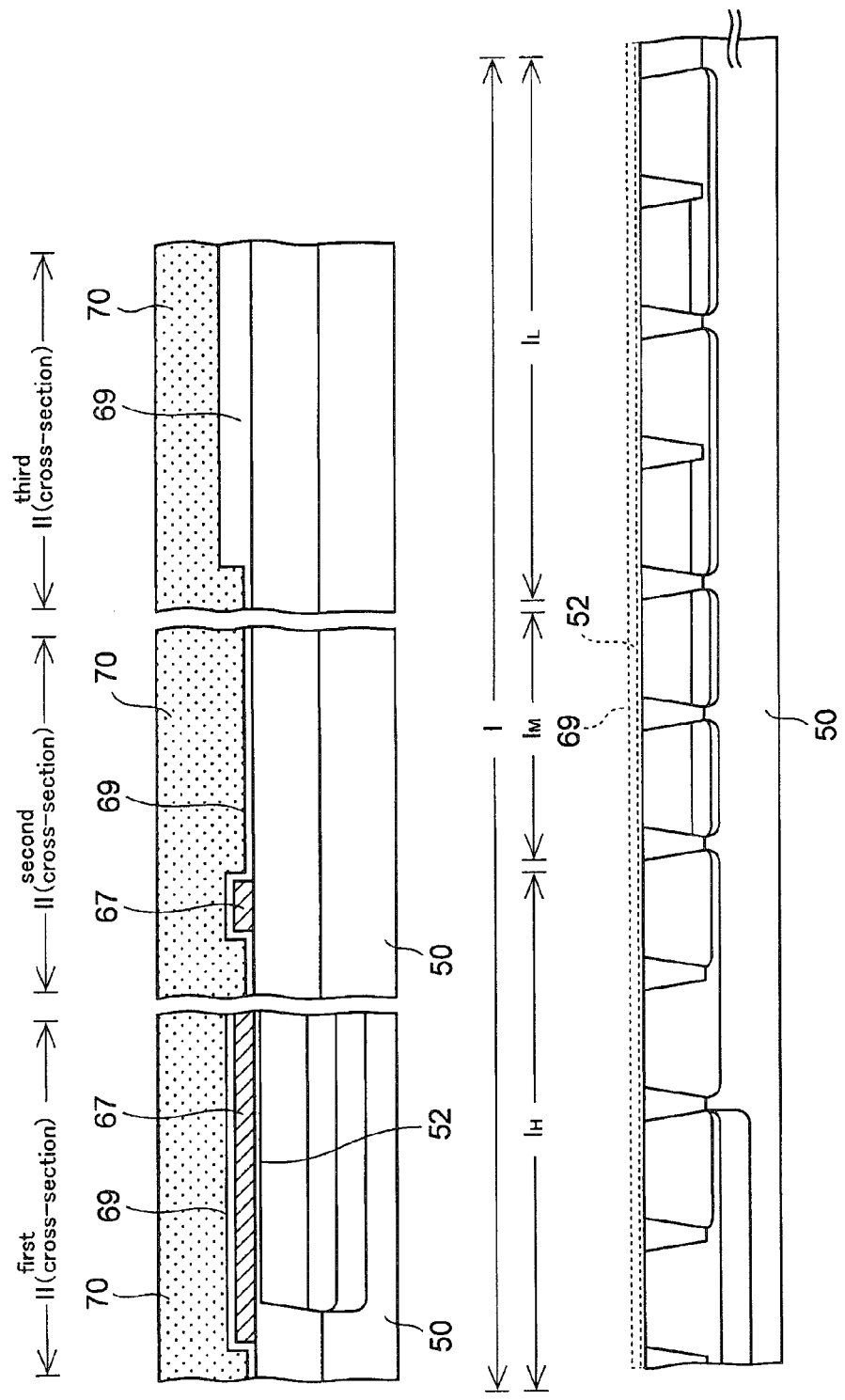
Figure 11G:
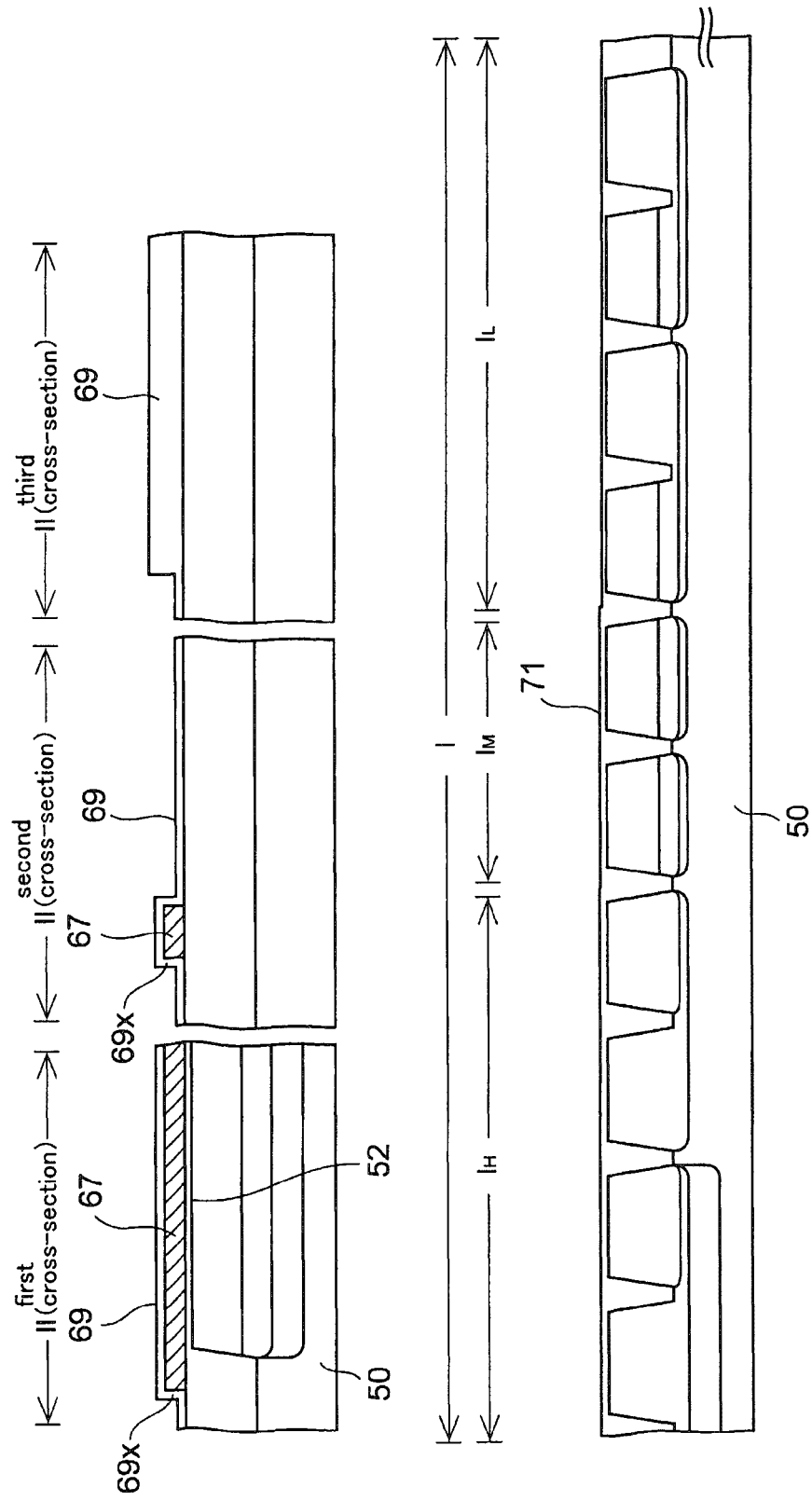
Figure 11H:
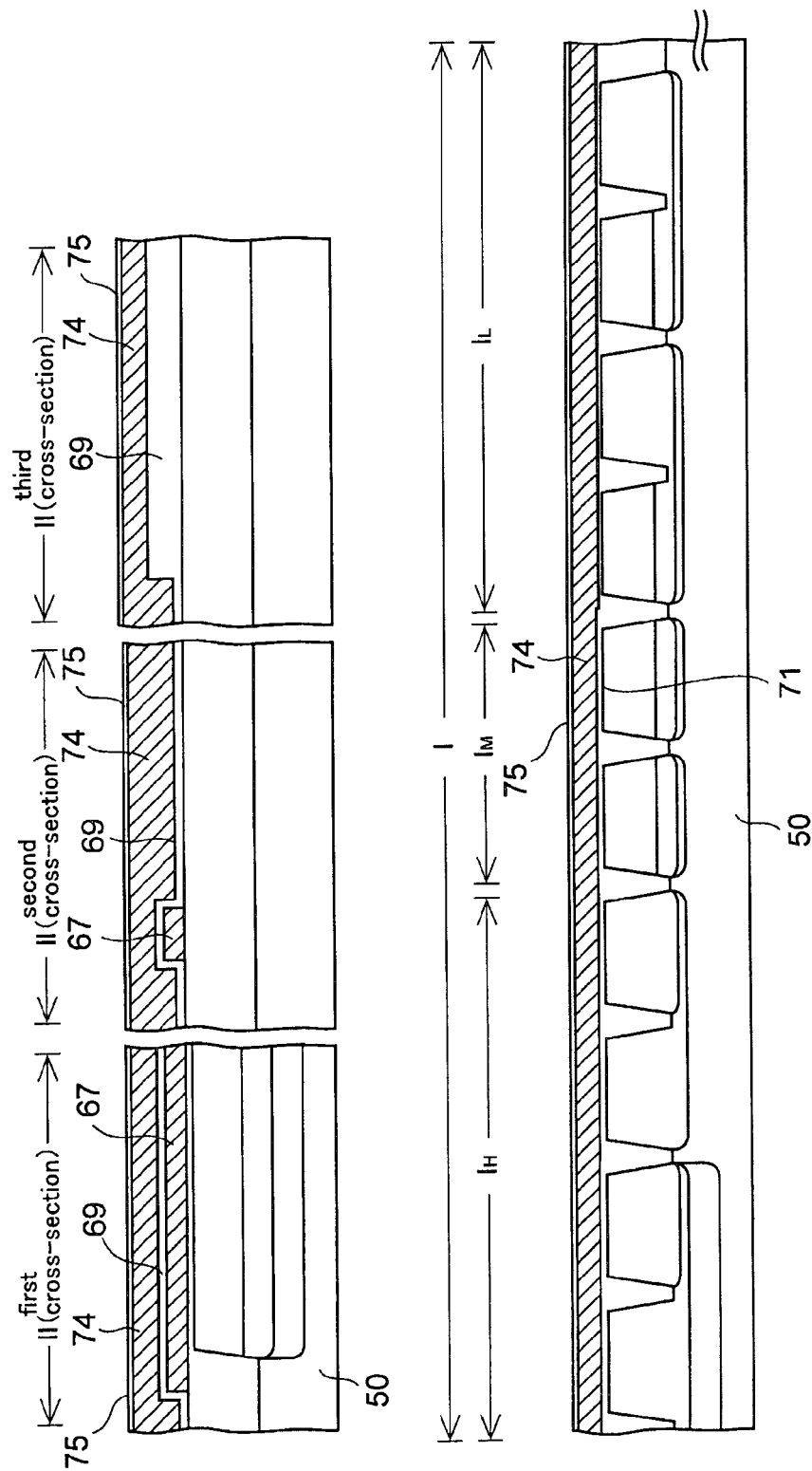
Figure 11I:
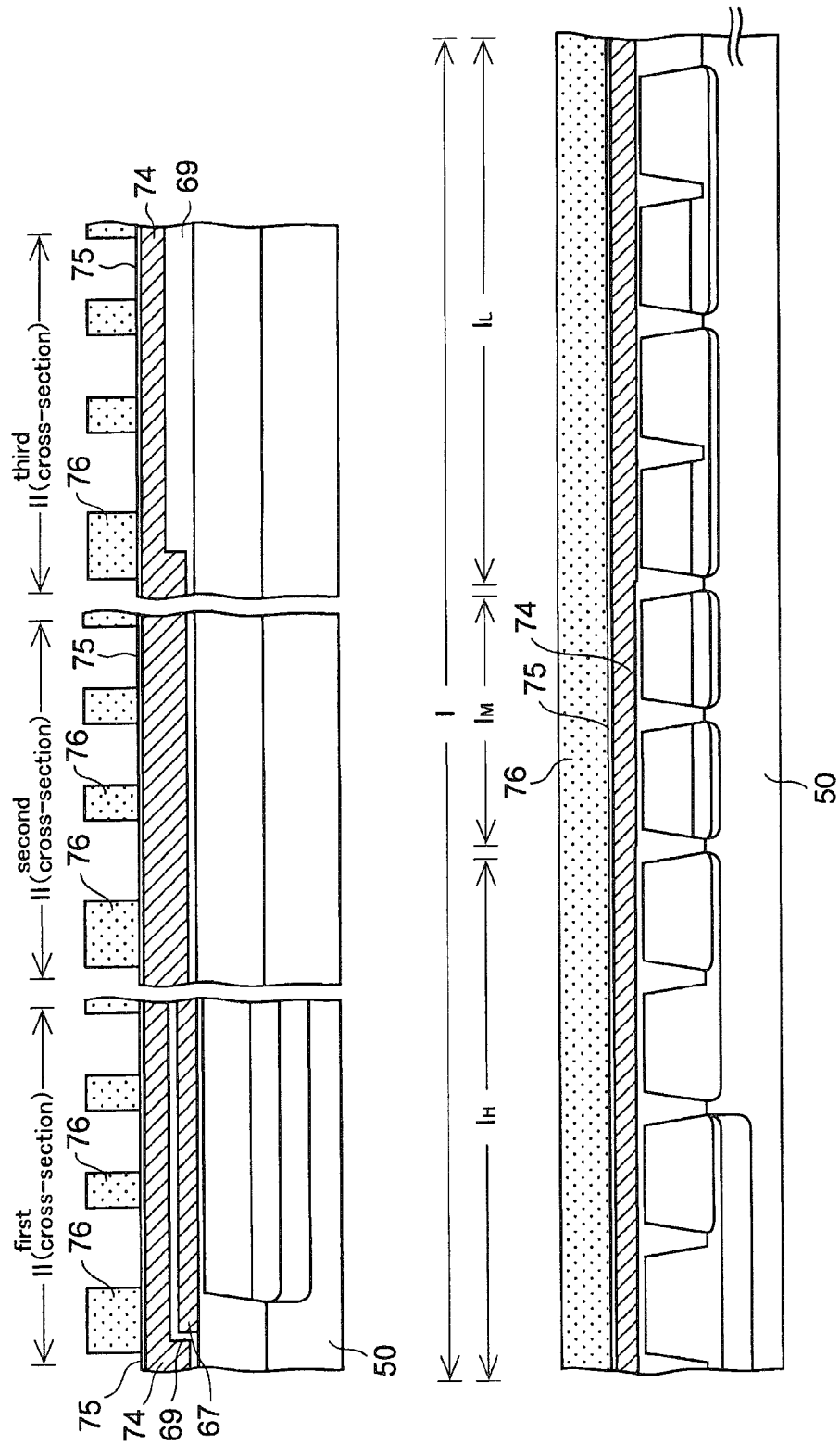
Figure 11J:
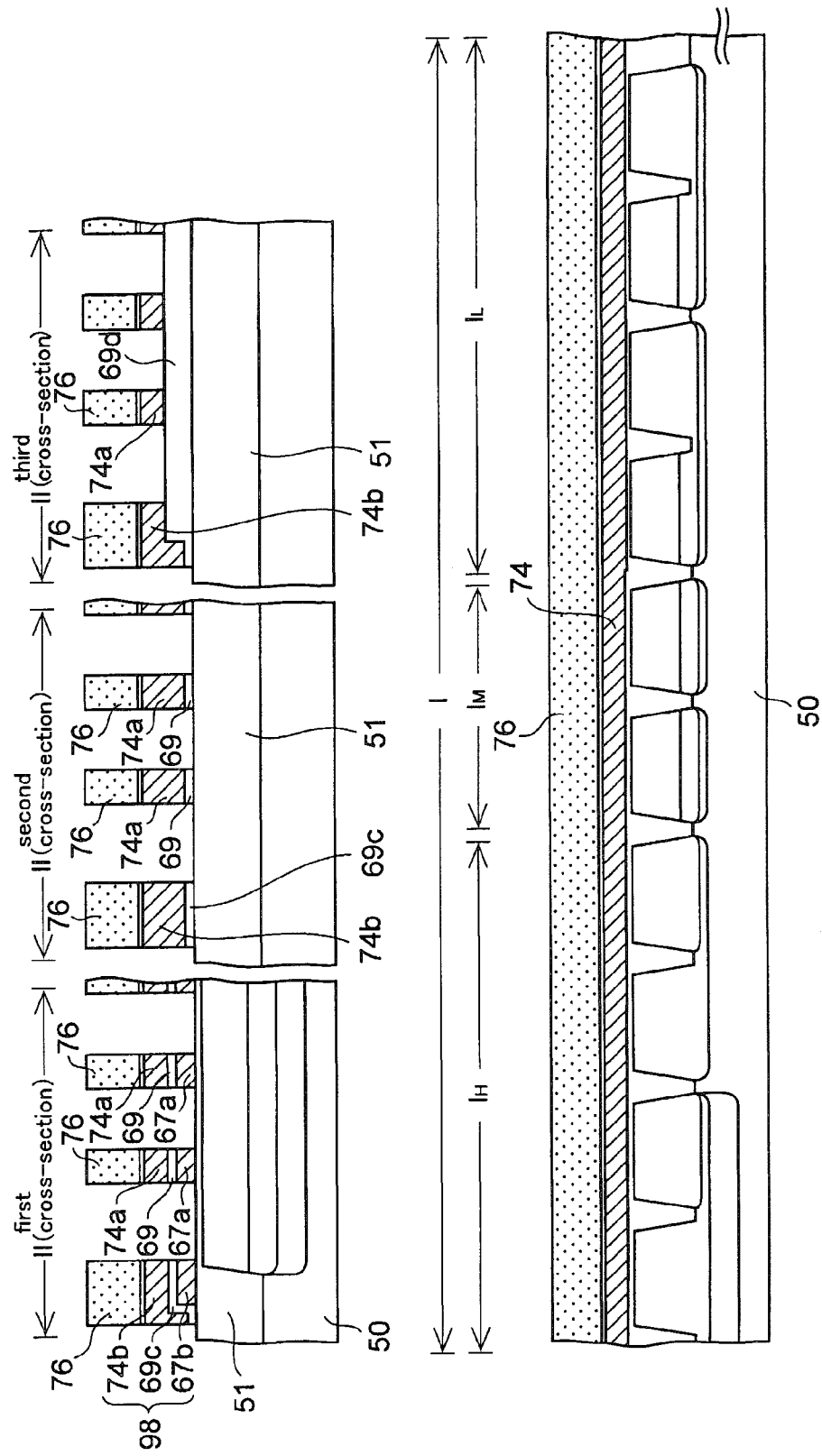
Figure 11K:
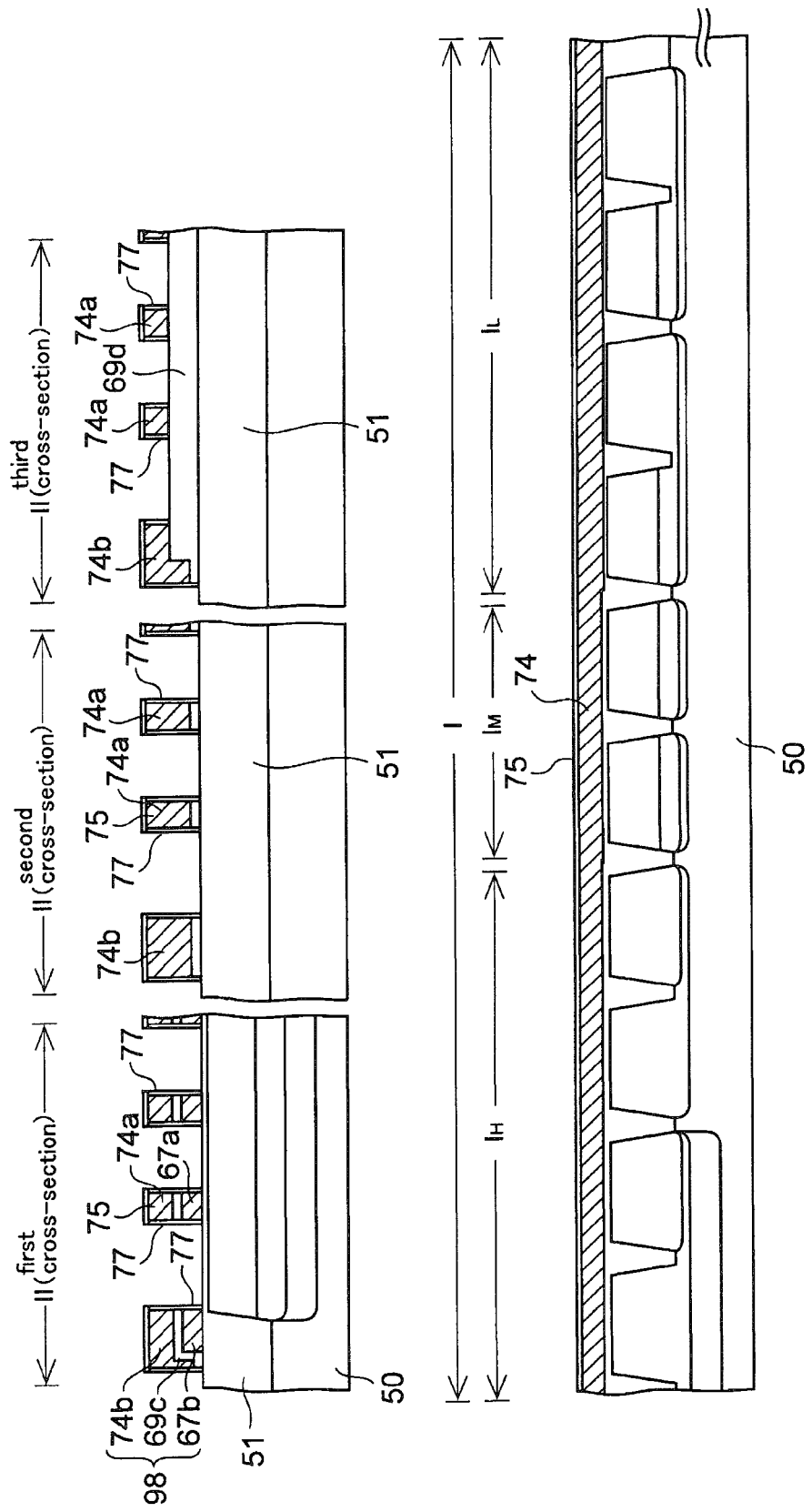
Figure 11L:
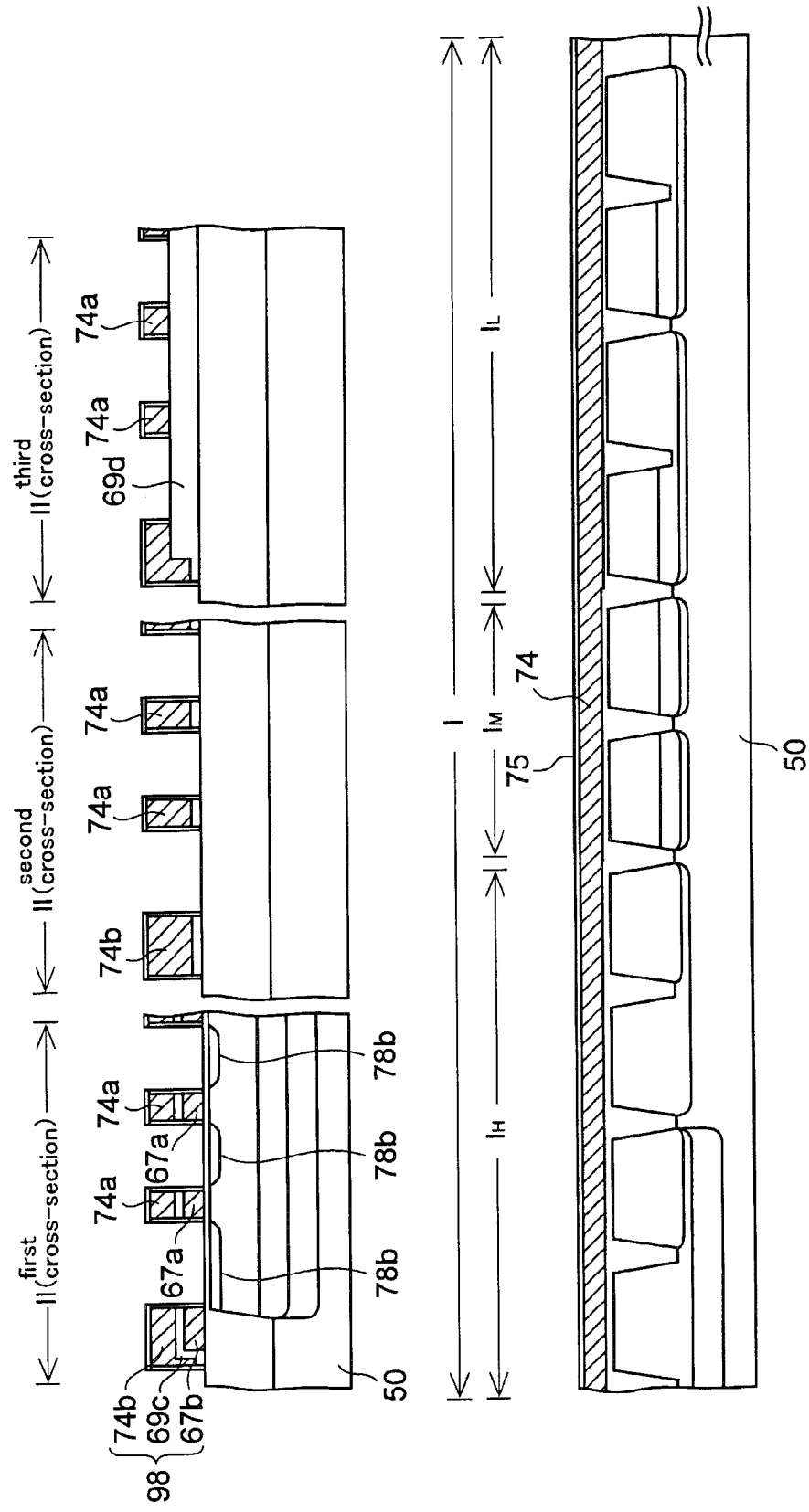
Figure 11M:
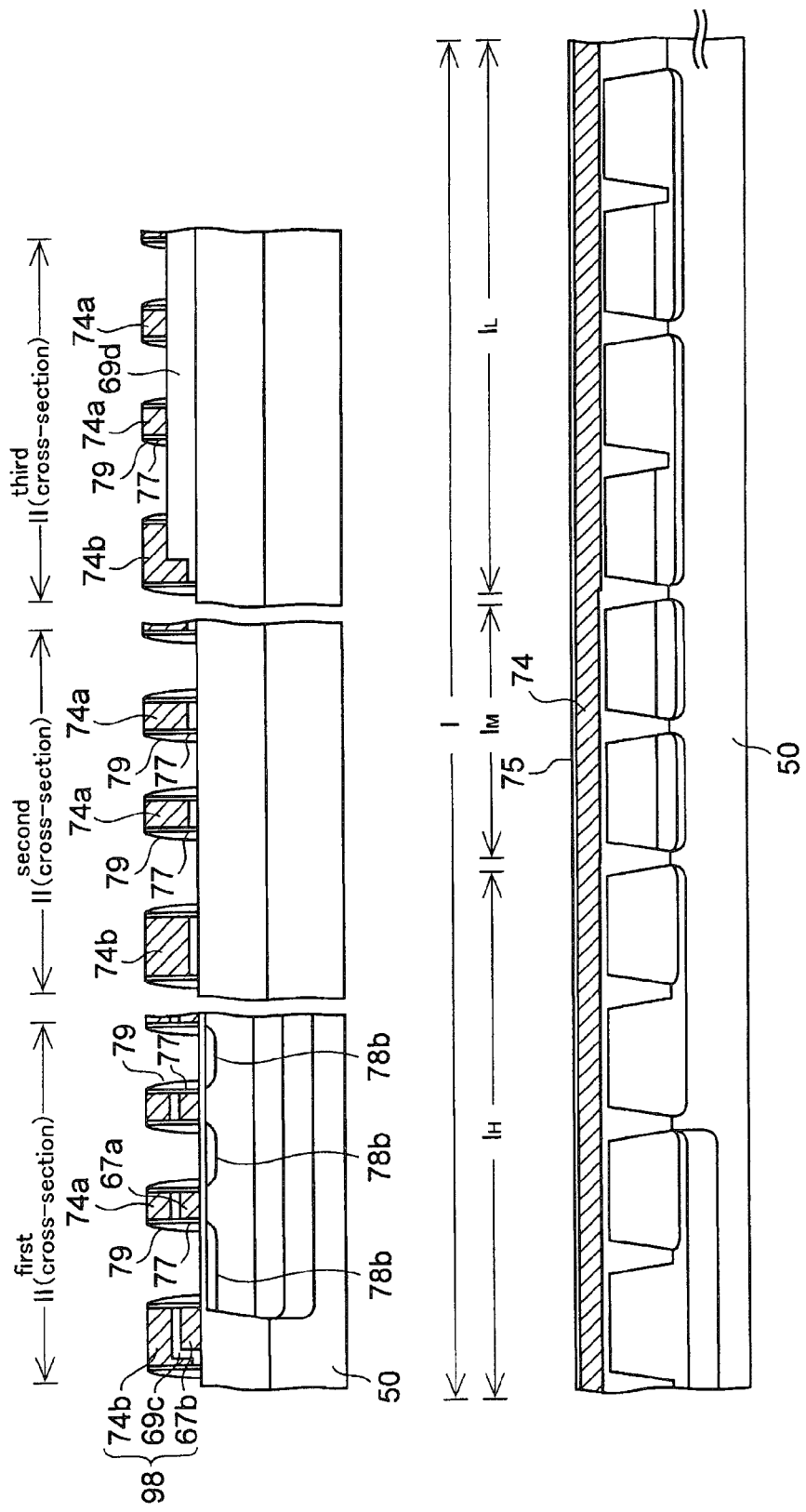
Figure 11N:
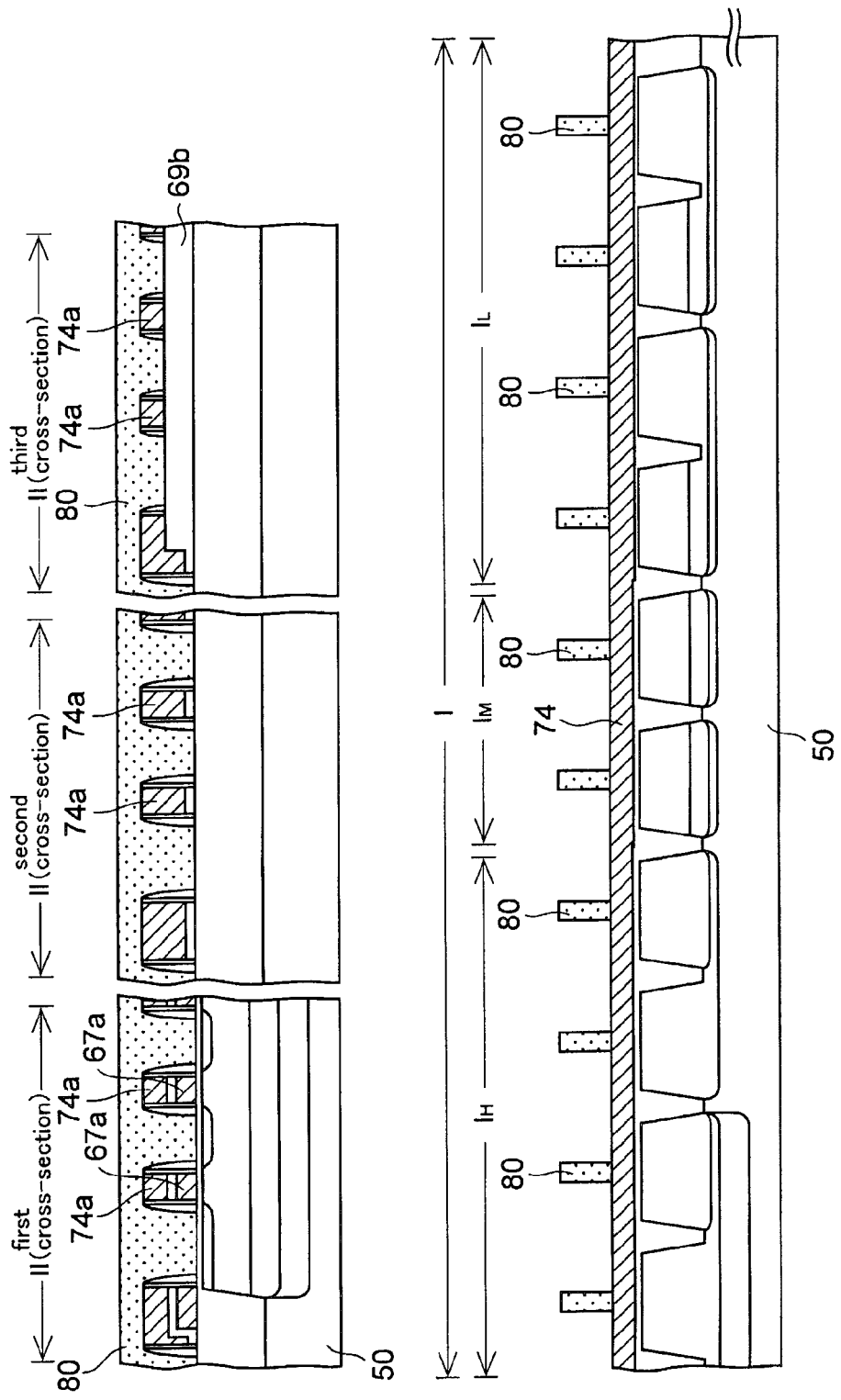
Figure 11O:
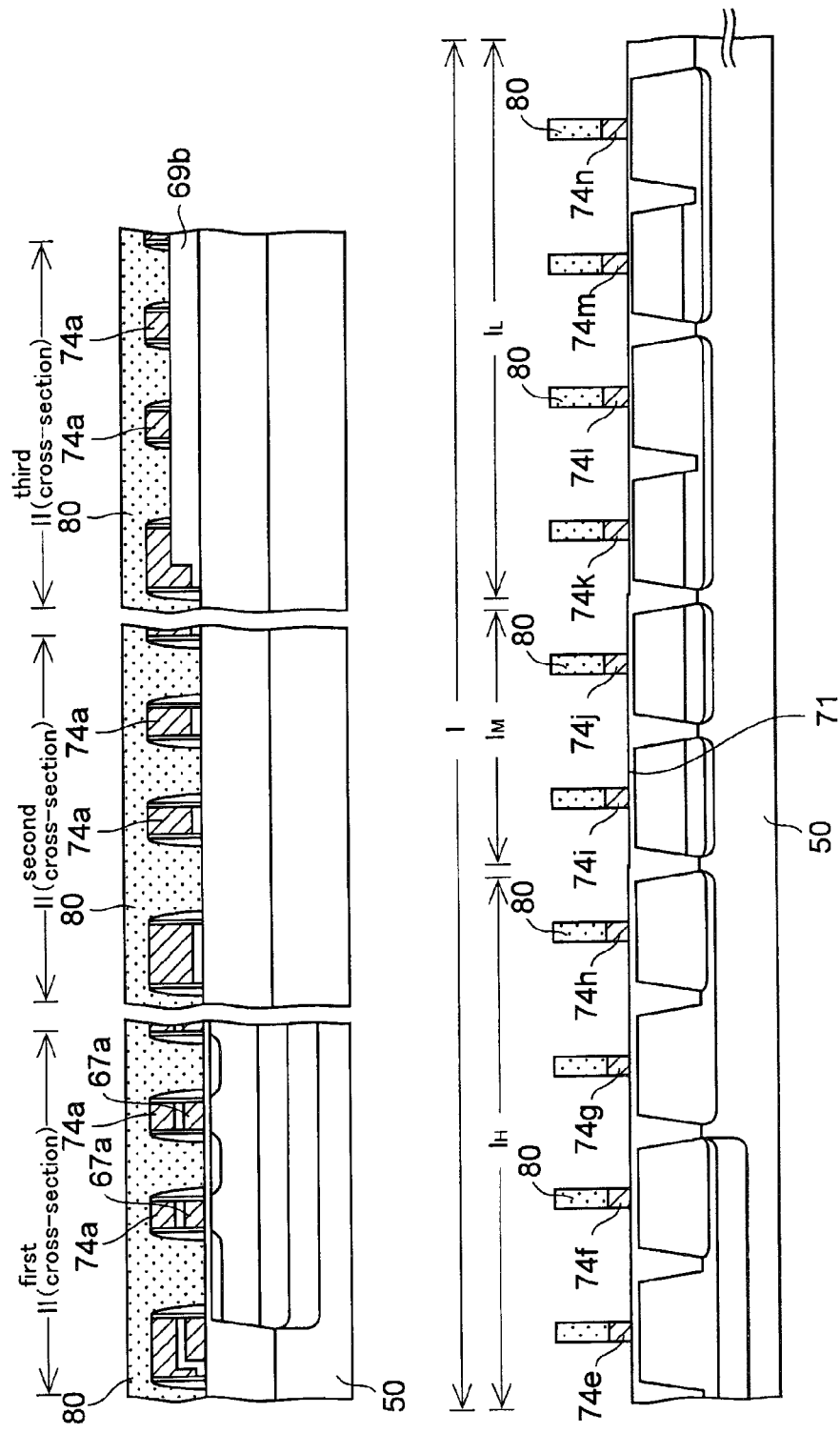
Figure 11P:
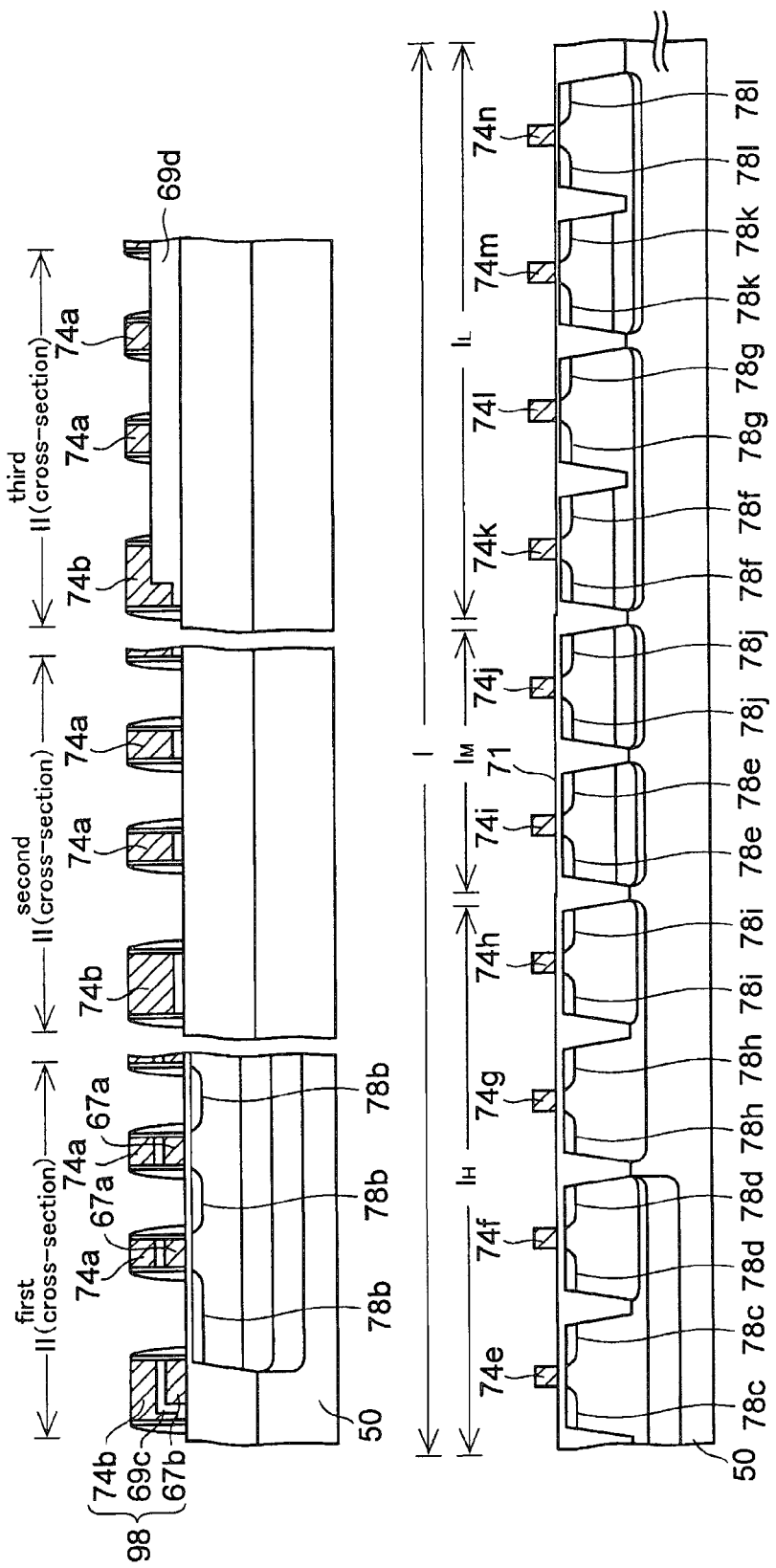
Figure 11Q:
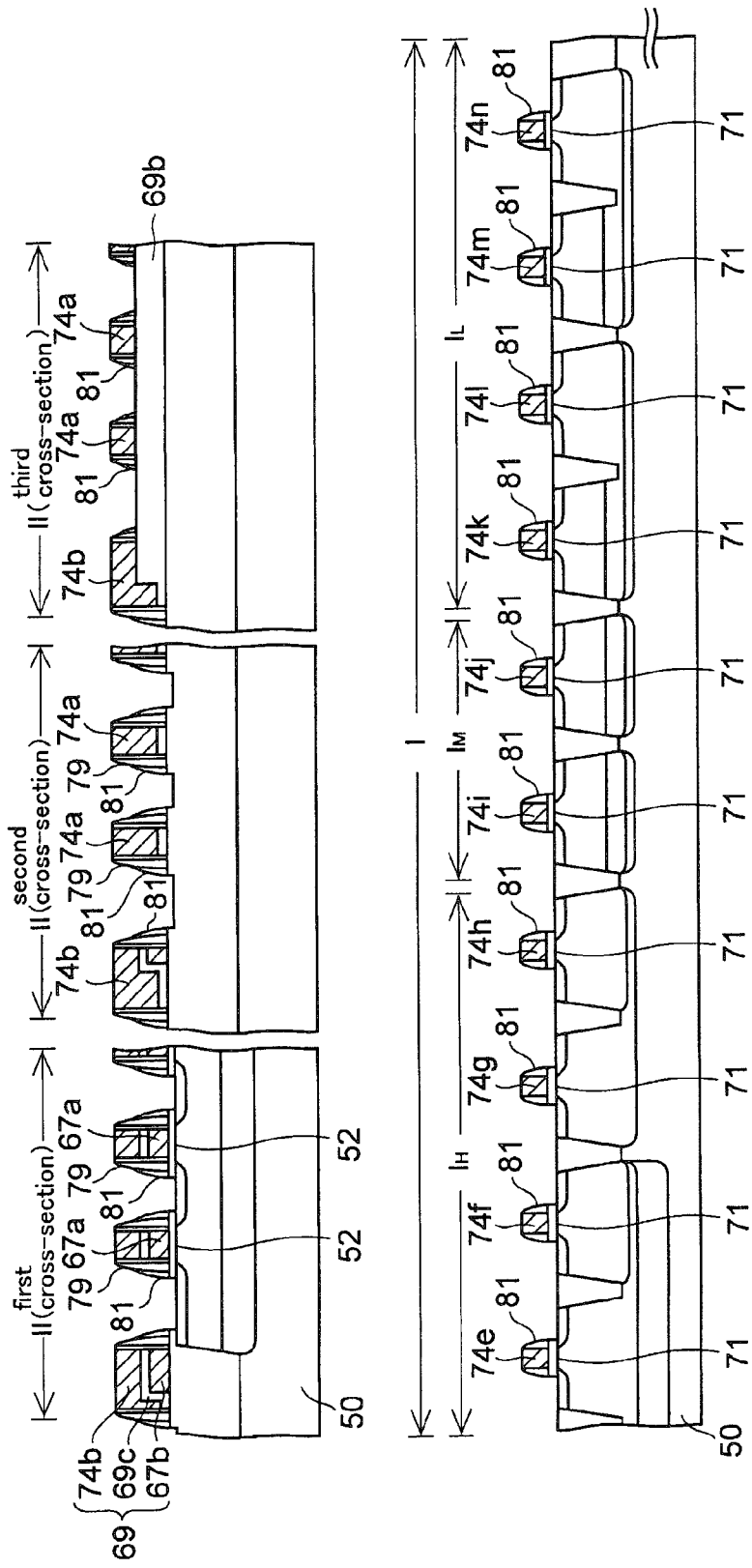
Figure 11R:
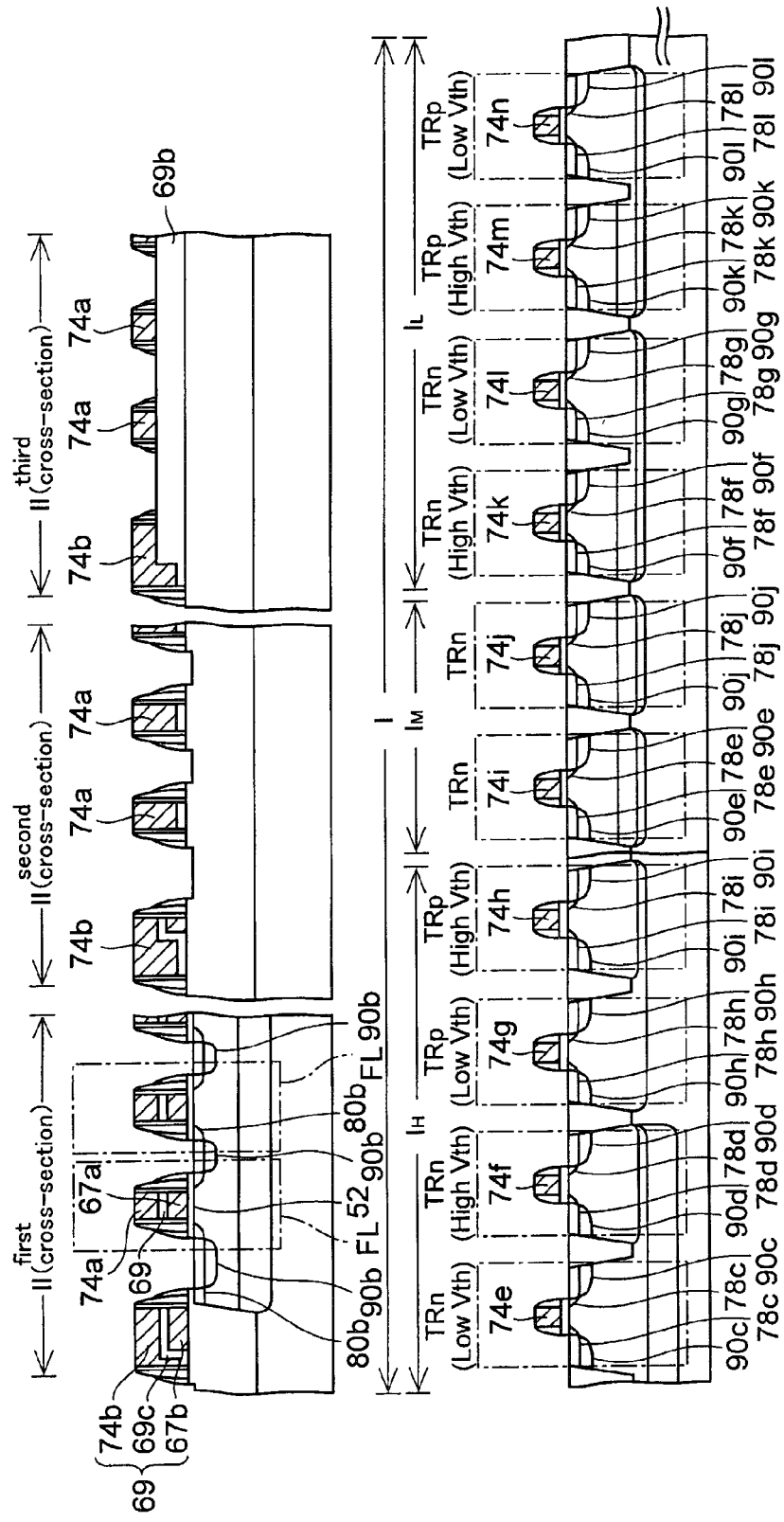
Figure 11S:
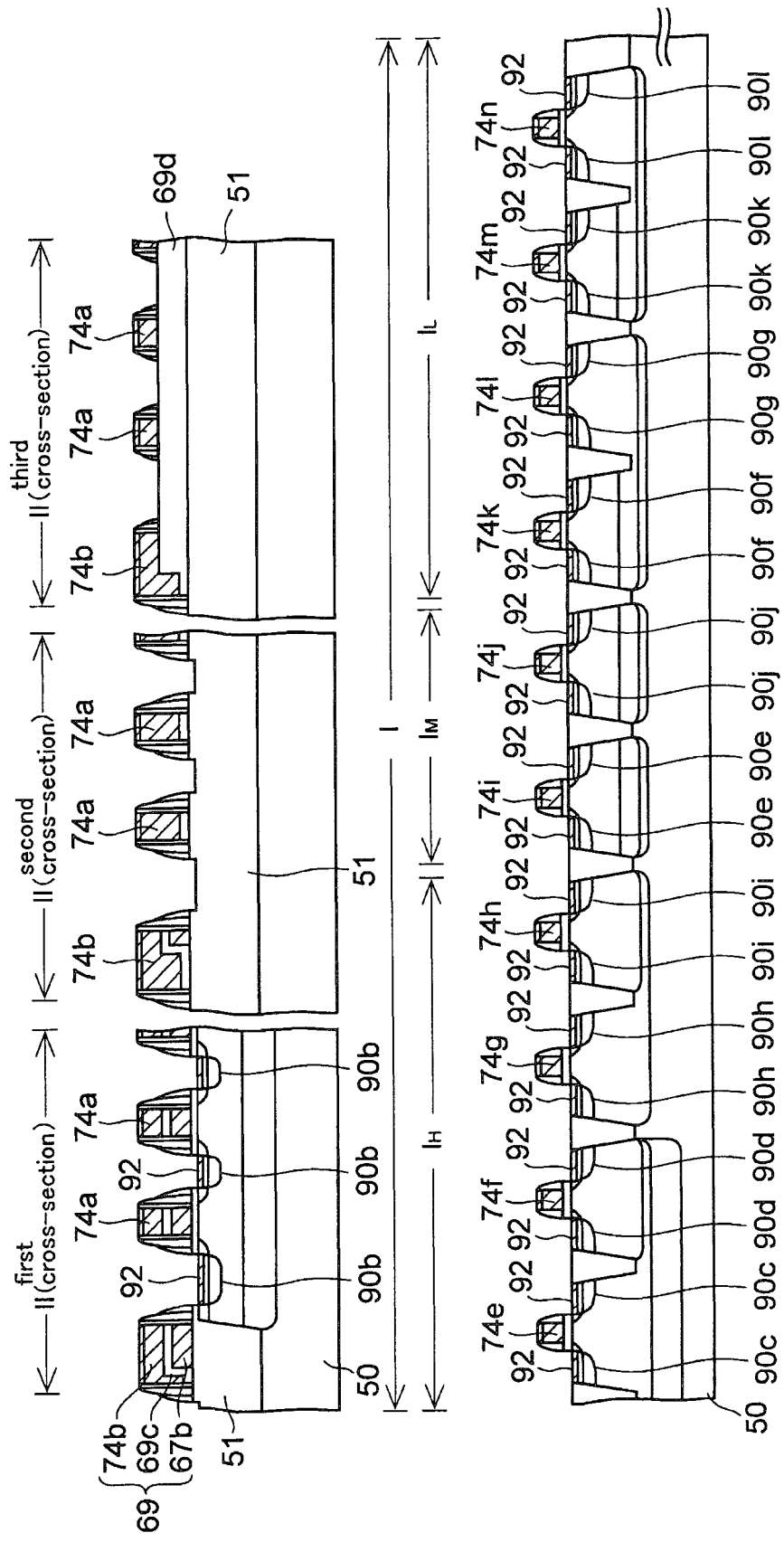
Figure 11T:
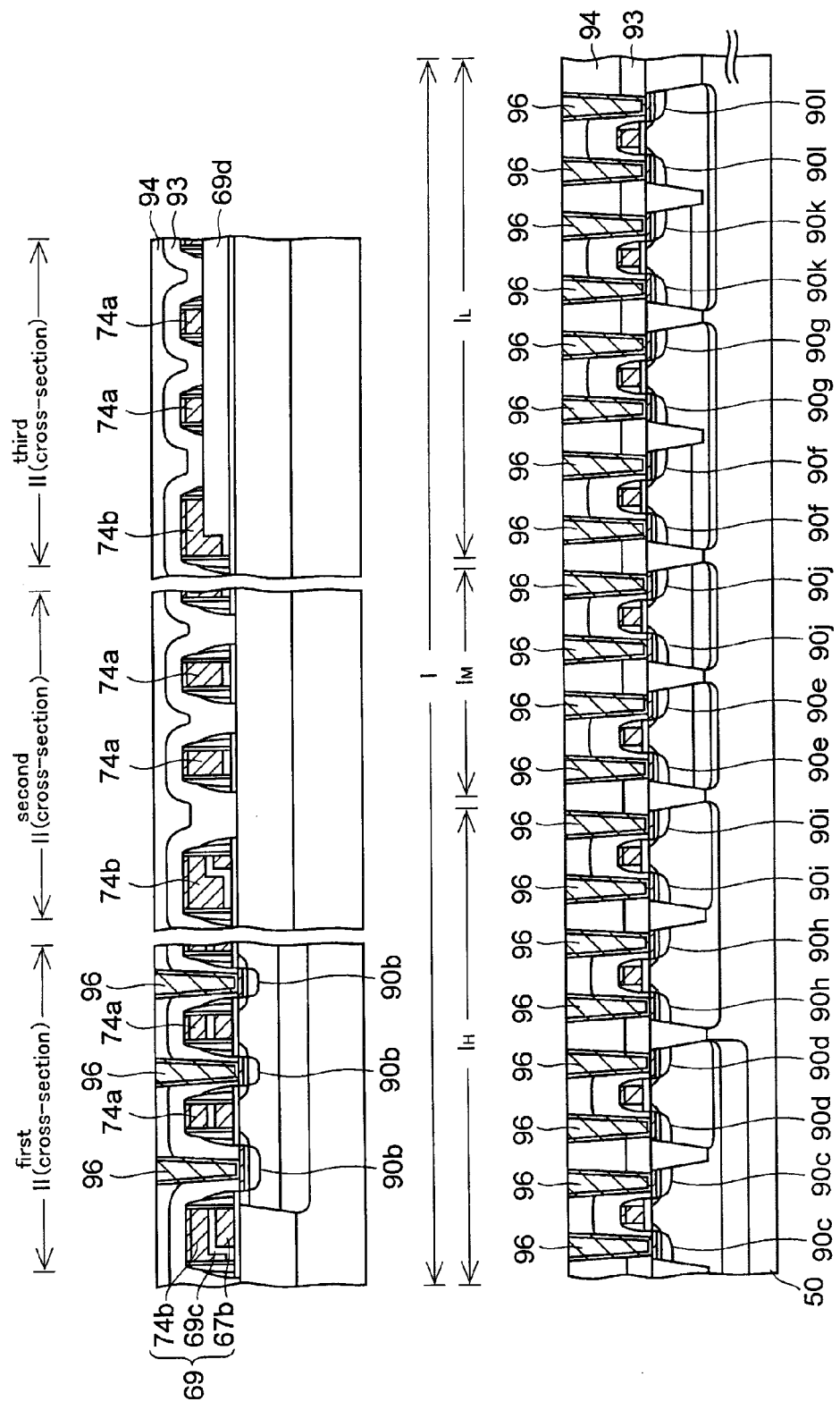

FIGS. 11A to 11T are cross-sectional views showing processes of manufacturing a semiconductor device according to the second embodiment, and FIGS. 12A to 12L are plan views thereof. In the present embodiment, a design rule under which a gate length is 0.13 µm is employed to manufacture a logic embedded memory such as FPGA (Field Programmable Gate Array).

First, as shown in FIG. 11A, a device isolation groove 50a for an STI is formed in a silicon substrate 50, in which a peripheral circuit region I and a cell region II are defined. Then, silicon oxide film is formed in the groove 50a as a device isolation insulating film 51. In place of the STI, the device isolation insulating film 51 may be formed by a LOCOS (Local Oxidation of Silicon) method.

The peripheral circuit region I of the silicon substrate 50 is further divided into a high voltage transistor formation region $I_H$, a medium voltage transistor formation region $I_M$, and a low voltage transistor formation region $I_L$.

FIG. 12A is a plan view obtained after the above processes are finished. The first to third cross-sections of the cell region II in FIG. 11A correspond to the cross-sections taken along the lines E1-E1, F1-F1, and G1-G1 of FIG. 12A, respectively. In addition, the cross-section of the peripheral circuit region I in FIG. 11A corresponds to the cross-section taken along the line H1-H1 of FIG. 12A. Ten MOS transistors are finally formed in the peripheral circuit region I. However, a portion of the peripheral circuit region I, in which a single MOS transistor is manufactured, is shown in FIG. 11A and the plan views provided below, for the purpose of simplicity of the drawings.

As shown in FIG. 12A, a plurality of stripe-shaped active regions 50b of the silicon substrate are formed in the cell region II. The active regions 50b are surrounded by the device isolation insulating film 51 and formed at a distance from each other.

Next, processes for obtaining a cross-sectional view shown in FIG. 11B will be described.

First, the entire upper surface of the silicon substrate 50 is thermally oxidized to form a sacrifice insulating film (not shown) with a thickness of approximately 15 nm.

Subsequently, $P^+$ ions serving as an n-type impurities are ion-implanted into the silicon substrate 50 to form a first n well 53 in the deep portion of the silicon substrate 50. The ion implantation conditions are not particularly limited. In the present embodiment, acceleration energy of 2 MeV and a dose amount of $2 \times 10^{13}$ cm$^{-2}$ are employed.

Then, $B^+$ ions serving as a p-type impurities are ion-implanted into the silicon substrate 50 through two steps ion implantation to form first to third p wells 54 to 56. The ion implantation conditions are, for example, acceleration energy of 420 KeV and a dose amount of $1.4 \times 10^{13}$ cm$^{-2}$ in the first step, and acceleration energy of 100 KeV and a dose amount of $3.6 \times 10^{12}$ cm$^{-2}$ in the second step.

An n-type MOS transistor having a high threshold voltage and an n-type MOS transistor having a low threshold voltage are formed in the high voltage transistor formation region $I_H$. Threshold voltage of the latter is controlled by the above-described first p well 54.

Furthermore, $B^+$ ions serving as a p-type impurities are ion-implanted into the silicon substrate 50 under conditions of acceleration energy of 100 KeV and a dose amount of $4.0 \times 10^{12}$ cm$^{-2}$ to form fourth to sixth p wells 57 to 59.

Among these wells, the fourth p well 57 controls the threshold voltage of the n-type MOS transistor having a high threshold voltage formed later in the high voltage transistor formation region $I_H$. On the other hand, the fifth and sixth p wells 58 and 59 have a function as a channel stop layer of an n-type MOS transistor formed later in the medium voltage transistor formation region $I_M$ and in the low voltage transistor formation region $I_L$.

Subsequently, $P^+$ ions serving as an n-type impurities are ion-implanted into the silicon substrate 50 through two steps ion implantation to form second to fourth n wells 60 to 62. In this ion implantation, conditions of acceleration energy of 600 KeV and a dose amount of $1.5 \times 10^{13}$ cm$^{-2}$ are employed in the first step, whereas conditions of acceleration energy of 240 KeV and a dose amount of $9.0 \times 10^{11}$ cm$^{-2}$ are employed in the second step.

In the high voltage transistor formation region $I_H$, a p-type MOS transistor having a high threshold voltage and a p-type MOS transistor having a low threshold voltage are formed. Threshold voltage of the latter is controlled by the above-described second p well 60.

Then, $P^+$ ions serving as an n-type impurities are ion-implanted into the silicon substrate 50 under conditions of acceleration energy of 240 KeV and a dose amount of $3.6 \times 10^{12}$ cm$^{-2}$ to form fifth to seventh n wells 63 to 65.

Among these wells, the fifth n well 63 controls the threshold voltage of the p-type MOS transistor having a high threshold voltage formed later in the high voltage transistor formation region $I_H$. On the other hand, the sixth and seventh n wells 64 and 65 have a function as a channel stop layer of a p-type MOS transistor formed later in the medium voltage transistor formation region $I_M$ and in the low voltage transistor formation region $I_L$.

Next, $B^+$ ions serving as a p-type impurities are ion-implanted into the silicon substrate 50 to form a first p-type impurity diffusion region 66 for controlling the threshold voltage of a flash memory formed later in the cell region II. As the ion implantation conditions, for example, acceleration energy of 40 KeV and a dose amount of $6 \times 10^{13}$ cm$^{-2}$ are employed.

In the above-described ion implantations, the firstly formed sacrifice insulating film is used as a through film, while the impurities are separately implanted by an unillustrated resist patterns on the sacrifice insulating film. The resist pattern is removed after all of the ion implantations are finished.

Thereafter, the sacrifice insulating film is removed by wet etching using a hydrofluoric acid solution to expose the clean surface of the silicon substrate 50. Then, a thermal oxidation film with a thickness of approximately 10 nm is formed on the silicon substrate 50 under the annealing conditions of, for example, a substrate temperature of 900° C. to 1050° C. and a processing time of 30 minutes. The thermal oxidation film thus formed is used as a tunnel insulating film 52.

Next, processes for obtaining a cross-sectional structure shown in FIG. 11C will be described.

First, a polysilicon film, doped with phosphorus with in-situ process, is formed with a thickness of approximately 90 nm on the tunnel insulating film 52 by a reduced pressure CVD method using $SiH_4$ and $PH_3$ as a reaction gas. The polysilicon film thus formed is used as a first conductive film 67.

Then, the first conductive film 67 is coated with a positive-type photoresist.

Subsequently, the photoresist is exposed in an exposure apparatus such as a stepper, in which the reticle 105 described in FIG. 7 of the first embodiment is used. In this exposing process, the focal point is set within a range of defocusing by which the projected images of the light-shielding patterns 102 of the reticle 105 shown in FIG. 7 are not connected with each other.

Thereafter, the photoresist is developed to form a first resist pattern 68 shown in the figure.

FIG. 12B is a plan view obtained after the first resist pattern 68 is formed in this manner. The first to third cross-sections of the cell region II in FIG. 11C correspond to cross-sections taken along the lines E2-E2, F2-F2, and G2-G2 of FIG. 12B, respectively. The cross-section of the peripheral circuit region I in FIG. 11C corresponds to a cross-section taken along the line H2-H2 of FIG. 12B.

As explained with referring to FIG. 7, the reticle 105 is capable of suppressing the reduction in the focus margin caused due to the optical proximity effect. Accordingly, projected images can be prevented from being connected with each other even if the focus of the exposure apparatus is slightly out of focus in the present exposing process. As a result, as shown in FIG. 12B, the multiple stripe-shaped first resist patterns 68 formed using the reticle 105 are formed without being connected with each other due to the optical proximity effect, and therefore are formed at a distance from each other.

Note that the extending direction of the stripe-shaped first resist pattern 68 is equal to a direction perpendicular to a word line. Moreover, the stripe-shaped first resist patterns 68 encompass the corresponding active regions 50b (see FIG. 12A).

Then, as shown in FIG. 11D, the first conductive film 67 is patterned by etching while using the first resist pattern 68 as a mask, so that the first conductive film 67 is removed from the peripheral circuit region I.

Thereafter, the first resist pattern 68 is removed.

Figure 12C:
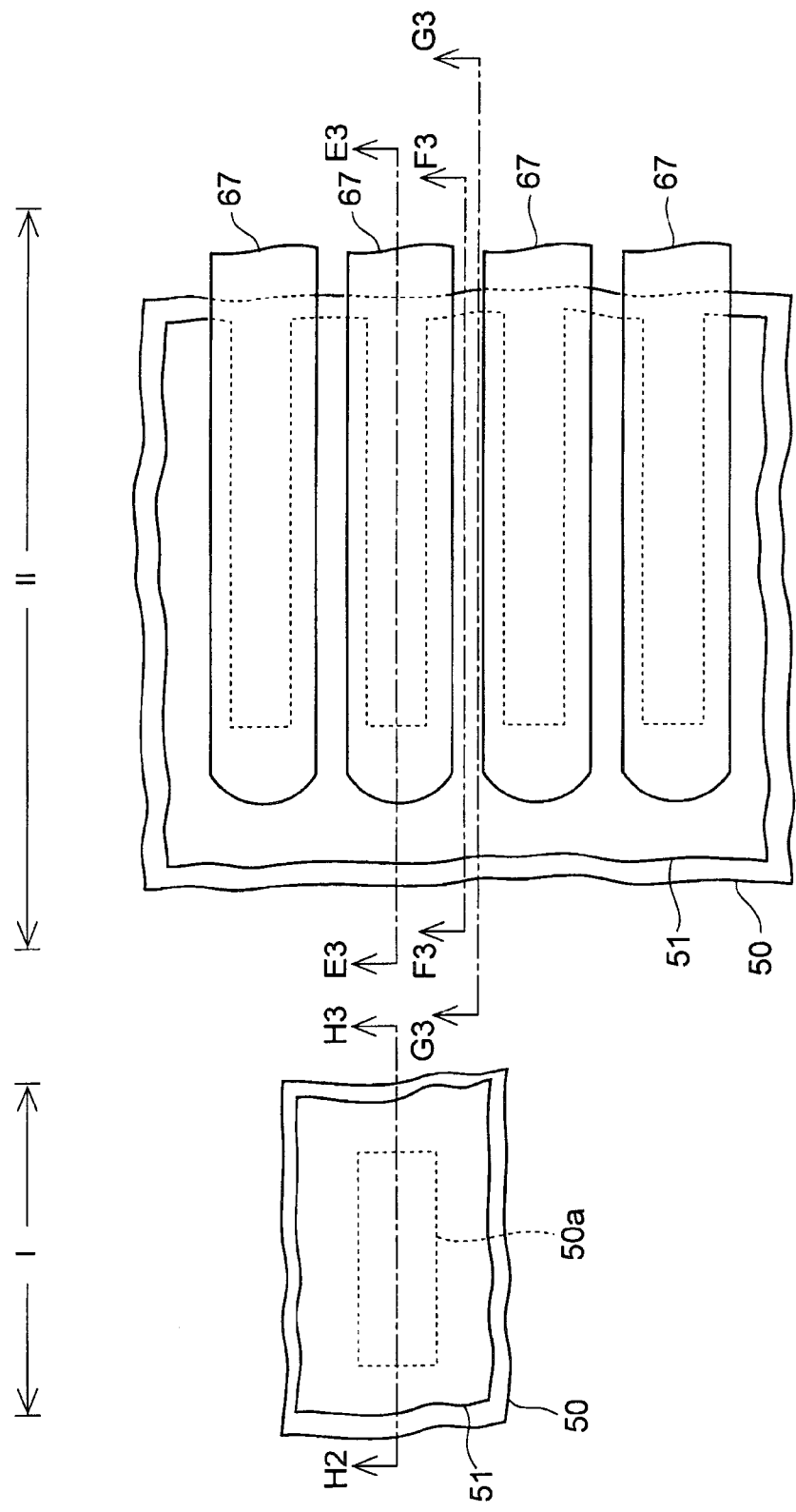

FIG. 12C is a plan view obtained after the above processes are finished. The first to third cross-sections of the cell region II in FIG. 11D correspond to the cross-sections taken along the lines E3-E3, F3-F3, and G3-G3 of FIG. 12C, respectively. The cross-sectional view of the peripheral circuit region I in FIG. 11D corresponds to the cross-sectional view taken along the line H3-H3 of FIG. 12C.

As shown in FIG. 12C, the first conductive film 67 is patterned into a plurality of stripes that are separated from each other and extending in a direction perpendicular to the word line. Such stripe patterns are obtained because the first resist patterns 68 (see FIG. 12B), which are separated from each other, is used in this patterning.

Next, processes for obtaining a cross-sectional structure shown in FIG. 11E will be described.

First, a silicon oxide film with a thickness of 5 nm and a silicon nitride film with a thickness of 8 nm are formed in this order on the first conductive film 67 and on the tunnel insulating film 52 in the peripheral circuit region I by using a reduced pressure CVD method. Furthermore, the surface of the silicon nitride film is thermally oxidized in a mixed gas atmosphere of Ar and $O_2$ under the annealing conditions of a substrate temperature of about 950° C. and a processing time of about 90 minutes, to form a silicon oxide film with a thickness of approximately 6 nm. Through the above processes, an ONO film formed by stacking a first silicon oxide film 69f, a silicon nitride film 69g, and a second silicon oxide film 69h in this order is formed as an intermediate insulating film 69 on the entire surface.

Note that the impurities in the wells formed in the silicon substrate 50 are diffused and consequently distributed in a broad range by annealing performed in oxidizing the silicon nitride film in the ONO film and in forming the tunnel insulating film 52 described in FIG. 11B.

Thereafter, $B^+$ ions serving as a p-type impurities are ion-implanted into the silicon substrate 50 while using insulating films 52 and 69 as a through film, to form the second p-type impurity diffusion region 82 for controlling the threshold voltage of an n-type MOS transistor in the medium voltage transistor formation region $I_M$. The ion implantation conditions are not particularly limited. In the present embodiment, conditions of acceleration energy of 15 KeV and a dose amount of $7.0 \times 10^{12}$ cm$^{-2}$ are employed.

Subsequently, $As^-$ ions serving as an n-type impurities are ion-implanted in the silicon substrate 50 while using insulating films 52 and 69 as a through film under conditions of acceleration energy of 150 KeV and a dose amount of $6.0 \times 10^{12}$ cm$^{-2}$, to form a first n-type impurity diffusion region 83 for controlling the threshold voltage of a p-type MOS transistor in the medium voltage transistor formation region $I_M$.

Then, $B^+$ ions serving as a p-type impurities are ion-implanted into the silicon substrate 50 under conditions of acceleration energy of 35 KeV and a dose amount of $4.5 \times 10^{12}$ cm$^{-2}$, to form a third p-type impurity diffusion region 84. Two n-type MOS transistors respectively having a high threshold voltage and a low threshold voltage, and two p-type MOS transistors respectively having a high threshold voltage and a low threshold voltage are formed later in the low voltage transistor formation region $I_L$. Among the transistors, the threshold voltage of the n-type MOS transistor having a high threshold voltage is controlled by the above-described third p-type impurity diffusion region 84.

Subsequently, $As^-$ ions serving as an n-type impurities are ion-implanted in the silicon substrate 50 to form a second n-type impurity diffusion region 85 for controlling the threshold voltage of a p-type MOS transistor having a high threshold voltage in the low voltage transistor formation region $I_L$. As the ion implantation conditions, for example, acceleration energy of 150 KeV and a dose amount of $2.0 \times 10^{12}$ cm$^{-2}$ are employed.

The ions are separately implanted into each of the above-described diffusion regions for controlling the threshold voltage, by using an unillustrated resist pattern formed on the intermediate insulating film 69. The resist pattern is removed after all of the diffusion regions are formed.

Figure 12D:
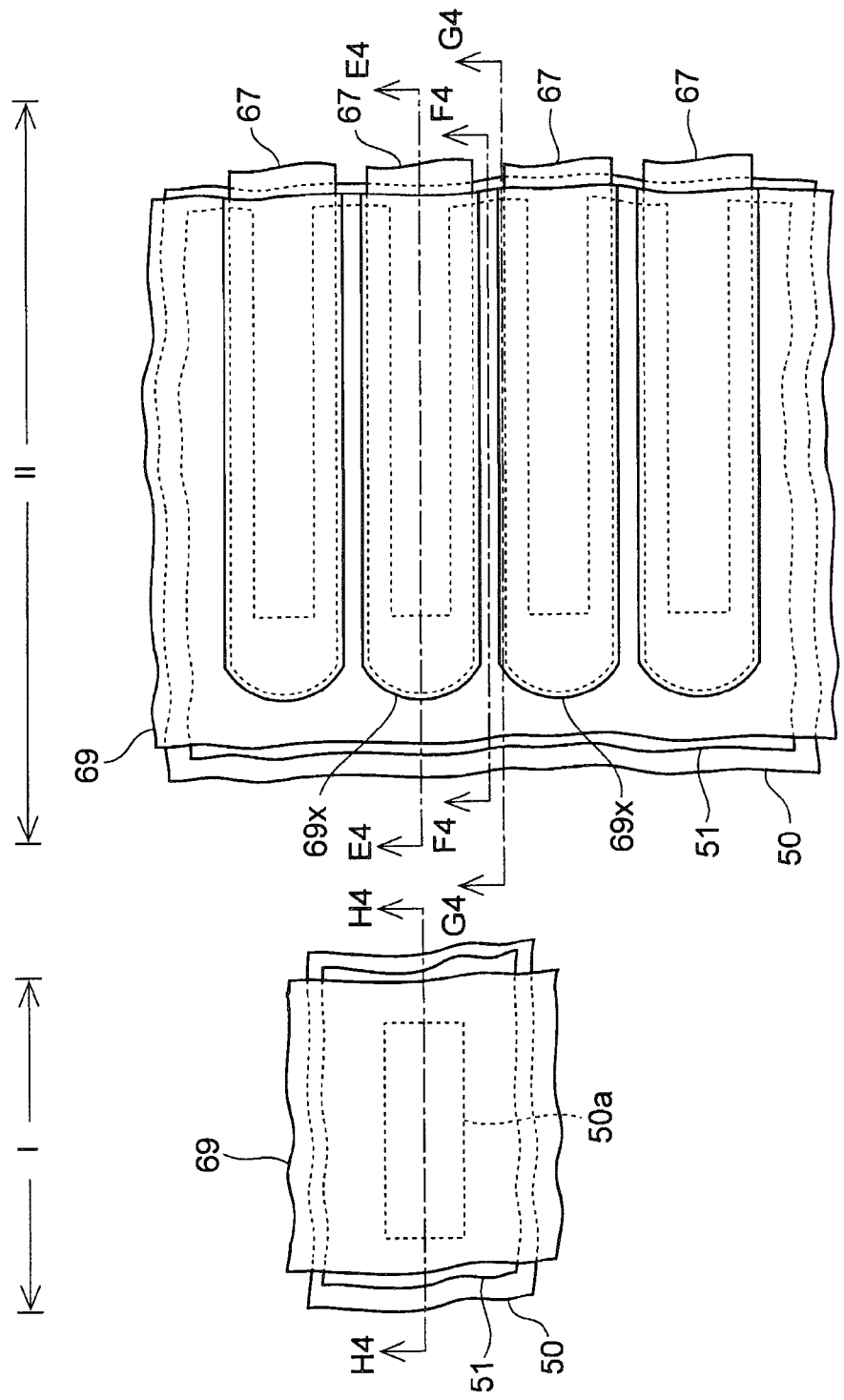

FIG. 12D is a plan view obtained after the above processes are finished. The first to third cross-sections of the cell region II in FIG. 11E correspond to the cross-sections taken along the lines E4-E4, F4-F4, and G4-G4 of FIG. 12D, respectively. The cross-sectional view of the peripheral circuit region I in FIG. 11E corresponds to the cross-sectional view taken along the line H4-H4 of FIG. 12D.

As shown in FIG. 11E, the formation of the diffusion regions 82 to 85 for controlling the threshold voltage of the transistor in the peripheral circuit region I is finished through the processes performed so far. Accordingly, the insulating films 52 and 69 in the peripheral circuit region I, which are used as the through film in forming these diffusion regions 82 to 85 by an ion implantation, become unnecessary in subsequent processes.

Therefore, in the next process shown in FIG. 11F, a second resist pattern 70 covering the cell region II is formed on the intermediate insulating film 69 in order to selectively remove the insulating films 52 and 69 in the peripheral circuit region I.

Then, the insulating films 52 and 69 are removed by selectively etching by a plasma etching using a gas mixture of $C_4F_8$, Ar, CO, and $O_2$ as an etching gas while using the second resist pattern 70 as a mask. As a result, the surface of the silicon substrate 50 in the peripheral circuit region I is exposed.

Figure 12E:
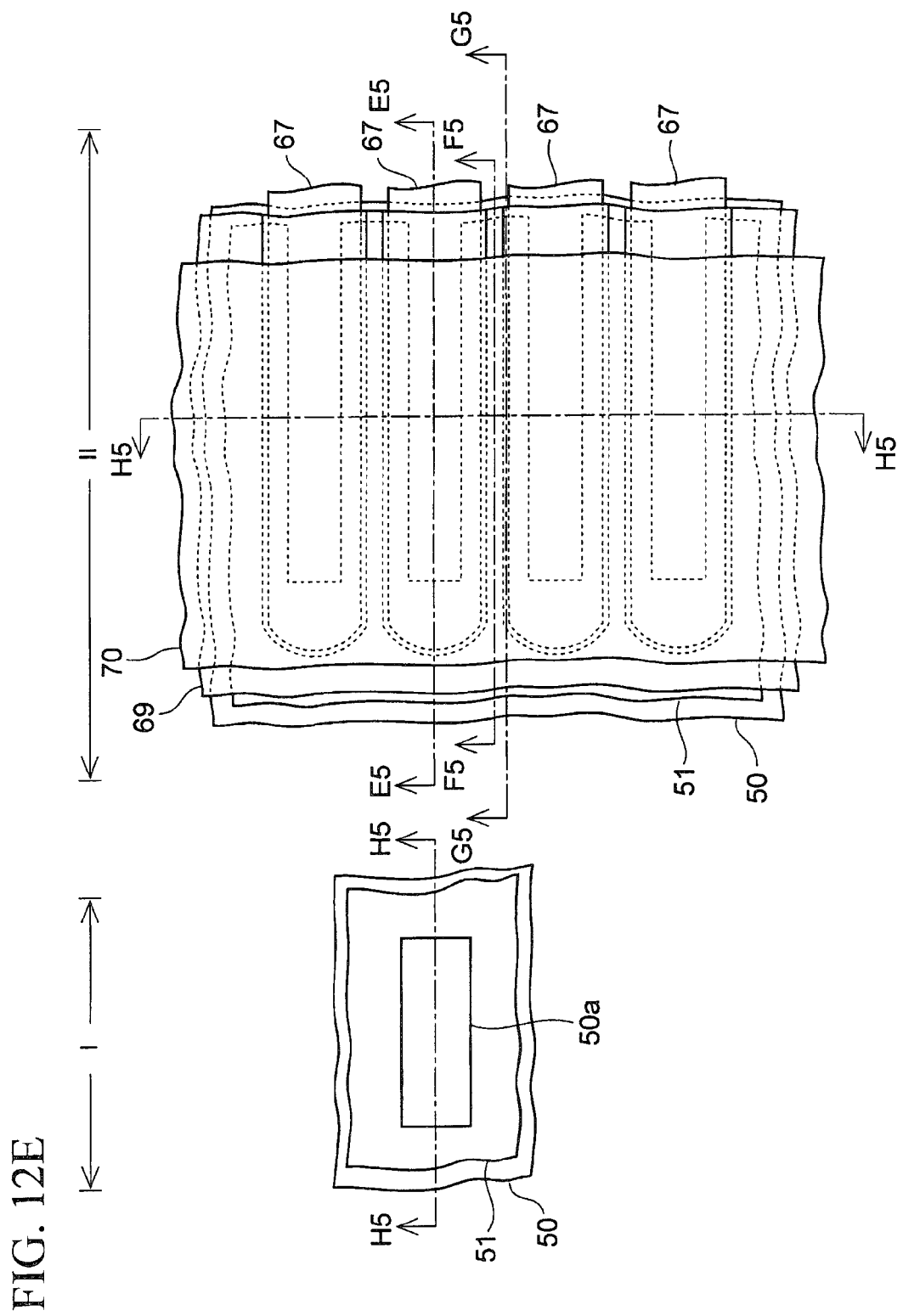

FIG. 12E is a plan view obtained after the above processes are finished. The first to third cross-sections of the cell region II in FIG. 11F correspond to the cross-sections taken along the lines E5-E5, F5-F5, and G5-G5 of FIG. 12E, respectively. The cross-sectional view of the peripheral circuit region I in FIG. 11F corresponds to the cross-sectional view taken along the line H5-H5 of FIG. 12E.

Then, the second resist pattern 70 is removed by an oxygen asking. Thereafter, the surface of the silicon substrate 50 is washed by a wet processing.

Next, processes for obtaining a cross-sectional structure shown in FIG. 11G will be described.

First, the surface of the silicon substrate 50 exposed in the peripheral circuit region I is thermally oxidized by employing oxidizing conditions of a substrate temperature of 850° C. and a processing time of 40 minutes to form a thermal oxidation film with a thickness of approximately 12 nm. Thereafter, an unillustrated resist pattern is formed on the cell region II and on the high voltage transistor formation region $I_H$. Then, while using the resist pattern as a mask, the thermal oxidation film formed on the medium voltage transistor formation region $I_M$ and the low voltage transistor formation region $I_L$ is etched and removed. As a result, the thermal oxidation film is left only in the high voltage transistor formation region $I_H$.

Furthermore, the surfaces of the silicon substrate 50 exposed in the medium voltage transistor formation region $I_M$ and in the low voltage transistor formation region $I_L$ are thermally oxidized to form a thermal oxidation film with a thickness of approximately 70 nm in these regions. As the oxidizing conditions, for example, a substrate temperature of 800° C. to 900° C. and a processing time of 10 minutes are employed. Then, an unillustrated resist pattern is formed on the cell region II, the high voltage transistor formation region $I_H$, and medium voltage transistor formation region $I_M$. The resist pattern is then used as a mask to etch and remove the thermal oxidation film from the low voltage transistor formation region $I_L$. Thereby, the surface of the silicon substrate 50 in the low voltage transistor formation region $I_L$ is exposed. Thereafter, the resist pattern used as a mask is removed.

Subsequently, a thermal oxidation film is formed on the surface of the silicon substrate 50 exposed in the low voltage transistor formation region $I_L$, while employing oxidizing conditions of a substrate temperature of about 700° C. to 800° C. and a processing time of about 5 minutes in an oxygen atmosphere. The thickness of the thermal oxidation film is not particularly limited. In the present embodiment, the thermal oxidation film is set to be about 2.2 nm.

By these three times thermal oxidations, gate insulating film 71 made of the thermal oxidation films are formed. The gate insulating film 71 have a final film thickness of 16 nm, 7.5 nm, and 2.2 nm in the high voltage transistor formation region $I_H$, in the medium voltage transistor formation region $I_M$, and in the low voltage transistor formation region $I_L$, respectively.

After that, as shown in FIG. 11H, a polysilicon film with a thickness of 180 nm is formed as a second conductive film 74 on the insulating films 69 and 71. The second conductive film 74 is formed by a reduced pressure CVD method using $SiH_4$ and $PH_3$ as a reaction gas, and in-situ phosphorus is doped in the second conductive film 74. Furthermore, a silicon nitride film with a thickness of approximately 30 nm is formed on the second conductive film 74 by a plasma CVD method as an antireflection film 75.

Figure 12F:
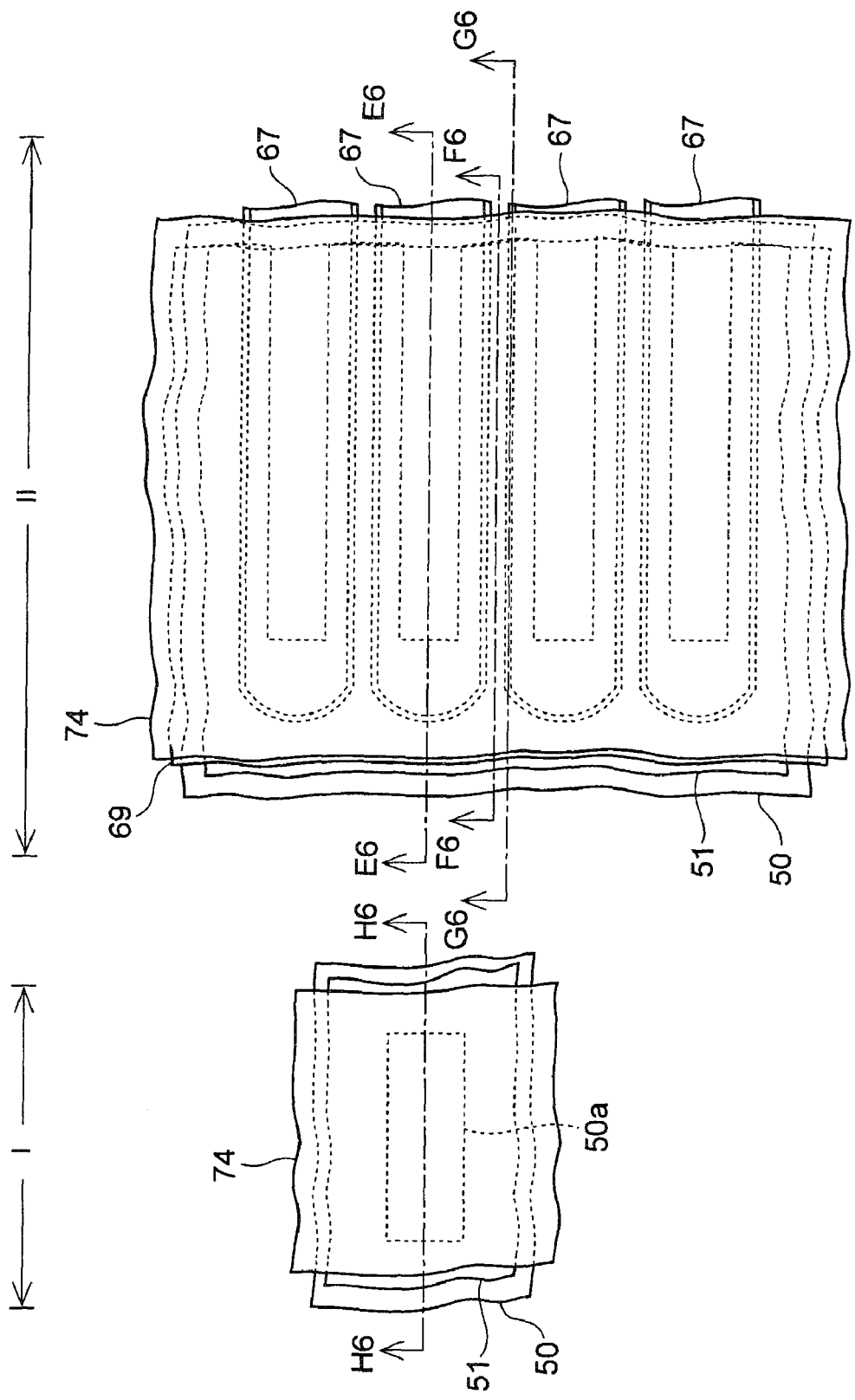

FIG. 12F is a plan view obtained after the above processes are finished. The first to third cross-sections of the cell region II in FIG. 11H correspond to the cross-sections taken along the lines E6-E6, F6-F6, and G6-G6 of FIG. 12E, respectively. The cross-sectional view of the peripheral circuit region I in FIG. 11H corresponds to the cross-sectional view taken along the line H6-H6 of FIG. 12F.

Note that the antireflection film 75 is omitted in FIG. 12F for the sake of simplification.

As shown in FIG. 12F, a step portion 69x reflecting the underlying first conductive film 67 is formed in the intermediate insulating film 69.

Then, as shown in FIG. 11I, the antireflection film 75 is coated with a photoresist. Then, the photoresist is exposed, and then developed to form a third resist pattern 76.

FIG. 12G is a plan view obtained after the above processes are finished. The first to third cross-sections of the cell region II in FIG. 11I correspond to the cross-sections taken along the lines E7-E7, F7-F7, and G7-G7 of FIG. 12G, respectively. The cross-sectional view of the peripheral circuit region I in FIG. 11I corresponds to the cross-sectional view taken along the line H7-H7 of FIG. 12G.

As shown in FIG. 12G, the third resist pattern 76 has a word line shape in the cell region II.

Next, as shown in FIG. 11J, while using the third resist pattern 76 as an etching mask, the first and second conductive films 67 and 74 as well as the intermediate insulating film 69 are patterned.

As a result of such patterning, the first and second conductive films 67 and 74 in the cell region II are made into floating gates 67a and control gates 74a respectively, while the second conductive film 74 is left in the peripheral circuit region I.

Moreover, a dummy control gate (dummy conductor pattern) 74b formed by patterning the second conductor pattern 74 is formed on the device isolation insulating film 51 at the end of the cell region II. A segment 69c of the intermediate insulating film 69 left unpatterned at the end of the cell region II, and a lower conductor pattern 67b formed by patterning the first conductive film 67 are covered with the dummy control gate 74b.

At the end of the cell region II, a structure formed by stacking the above-described lower conductor pattern 67b, segment 69c, and dummy control gate 74b in this order is formed.

The above-described patterning is performed, for example, in a plasma etching chamber by a three-step etchings.

In the first etching step, a portion of the second conductive film 74, which is not patterned into to either the control gate 74a or the dummy control gate 74b, is selectively etched to be removed by using a gas mixture of $Cl_2$ and $O_2$ as an etching gas.

In the second etching step, the intermediate insulating film 69 formed on the upper surface of the first conductive film 67 between the control gate 74a and the dummy control gate 74b is selectively etched to be removed by using a gas mixture of $CH_3F$ and $O_2$ as an etching gas.

In the third etching step, the first conductive film 67 between the control gate 74a and the dummy control gate 74b is selectively etched to be removed by using a gas mixture of $Cl_2$ and $O_2$ as an etching gas (etchant).

The third resist pattern 76 is removed after this patterning is finished.

Figure 12H:
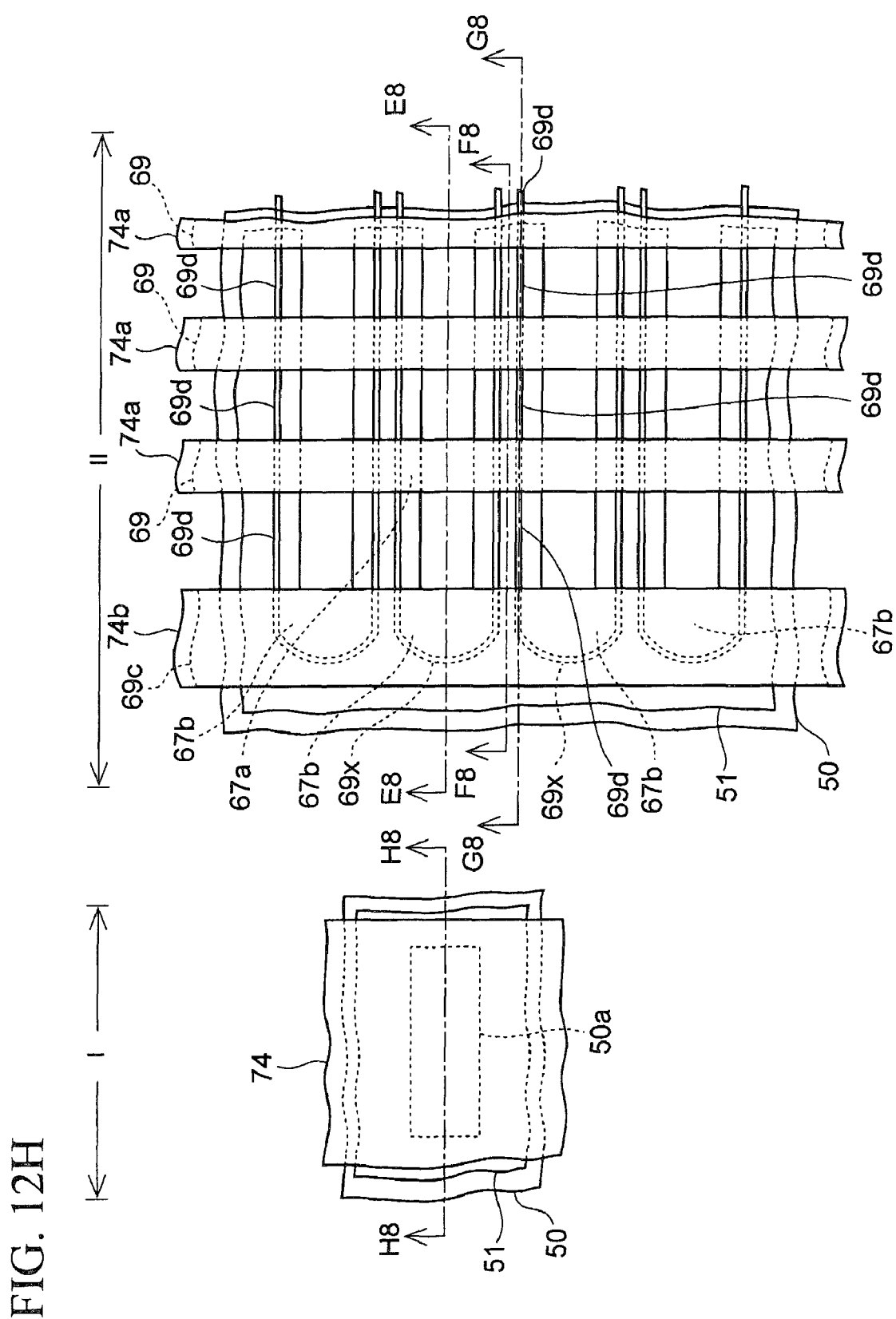

FIG. 12H is a plan view obtained after the above processes are finished. The first to third cross-sections of the cell region II in FIG. 11J correspond to the cross-sections taken along the lines E8-E8, F8-F8, and G8-G8 of FIG. 12H, respectively. The cross-sectional view of the peripheral circuit region I in FIG. 11J corresponds to the cross-sectional view taken along the line H8-H8 of FIG. 12H.

As shown in FIG. 12H, the stripe-shaped control gate 74a and dummy control gate 74b extend in parallel to each other in the direction perpendicular to the direction in which the active region 50b (see FIG. 12A) extends.

Moreover, in the space between the control gates 74a, the intermediate insulating film 69 formed on the upper surface of the first conductive film 67 (see FIG. 12G) is etched to be removed in the above-described second etching step.

However, the intermediate insulating film 69, which is formed on the side surface of the first conductive film 67, is formed as thick as the thickness of the first conductive film 67 in the thickness direction of the silicon substrate 50, and is therefore left as a fence 69d without being etched in the second etching step.

Note that the etching rate of the intermediate insulating film 69 is lower than that of the first conductive film 67 for the gas mixture of $CH_3F$ and $O_2$ used as an etching gas in the second etching step. This is also one of the factors promoting the formation of the fence 69d.

On the device isolation insulating film 51, the fence 69d extends along the active region 50b (see FIG. 12A) from the side surface of the floating gate 67a to the lower conductor pattern 67b Note that before this patterning is performed, the first conductive pattern 67 was separated into stripes. Therefore, in this patterning, the lower conductor pattern 67b is patterned into islands that are separated from each other. Furthermore, the segment 69c of the intermediate insulating film 69 is formed in a stripe-shaped pattern parallel to the control gate 74a, and is shared by each of the island-like lower conductor patterns 67b.

Moreover, the dummy control gate 74b is formed so as to include the above-described lower conductor pattern 67b when viewed from above.

Figure 13:
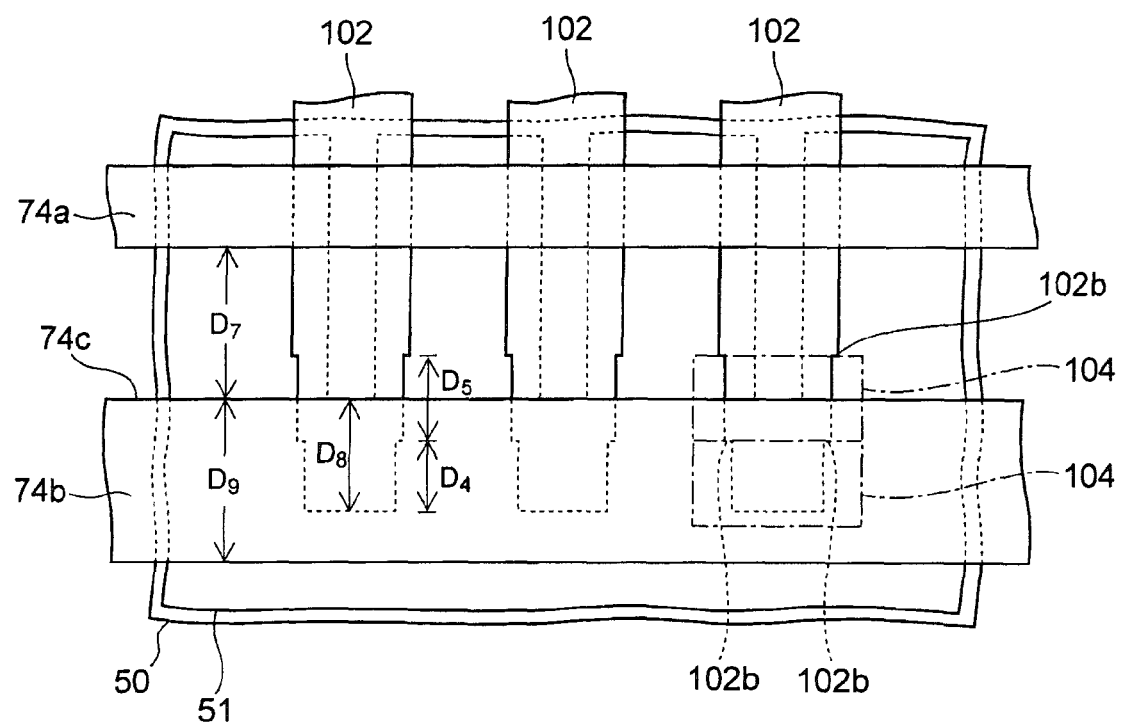
FIG. 13 is an enlarged plan view showing the positional relationship in design between the reticle described in FIG. 7 and a dummy control gate.

FIG. 13 is an enlarged plan view showing the designed positional relationship between the light-shielding pattern 102 of the reticle 105 described in FIG. 7 and the dummy control gate 74b.

Note in FIG. 13 that the light-shielding pattern 102 and the dummy control gate 74b are shown in the same figure for the clarity of the design layout. In the actual device, however, the light-shielding pattern 102 in FIG. 13 corresponds to the patterned first conductive film 67 (see FIG. 12C).

As shown in FIG. 13, in the present embodiment, a long side 74c of the dummy control gate 74b near the control gate 74a is formed at the position in which the long side 74c intersects a narrow width portion 104 of the light-shielding pattern 102.

Distances $D_4$ and $D_5$ shown in FIG. 13 are the same as those shown in FIG. 7. On the other hand, distances $D_7$ to $D_9$ in FIG. 13 are set, for example, as follows:

$D_7$=710 nm
$D_8$=200 nm
$D_9$=450 nm.

Subsequently, as shown in FIG. 11K, side surfaces of the floating gates 67a and the control gates 74a are thermally oxidized to form a thermal oxidation film 77 with a thickness of about 10 nm. The thermal oxidation film 77 plays a role to improve the retention characteristics of a flash memory cell finally formed.

The thermal oxidation film 77 is also formed on the side surfaces of the dummy control gate 74b and the lower conductor pattern 67b.

Thereafter, as shown in FIG. 11L, an unillustrated resist pattern covering the peripheral circuit region I is formed. Then, the As ions serving as an n-type impurities are ion-implanted into the silicon substrate 50 using the resist pattern as a mask. The ion implantation conditions are not particularly limited. In the present embodiment, the conditions are, for example, acceleration energy of 50 KeV and a dose amount of $6.0 \times 10^{14}$ $cm^{-2}$. As a result of such ion-implantation, first n-type source/drain extensions 78b are formed in the silicon substrate 50 beside the floating gates 67a.

Thereafter, the resist pattern is removed.

Figure 12I:
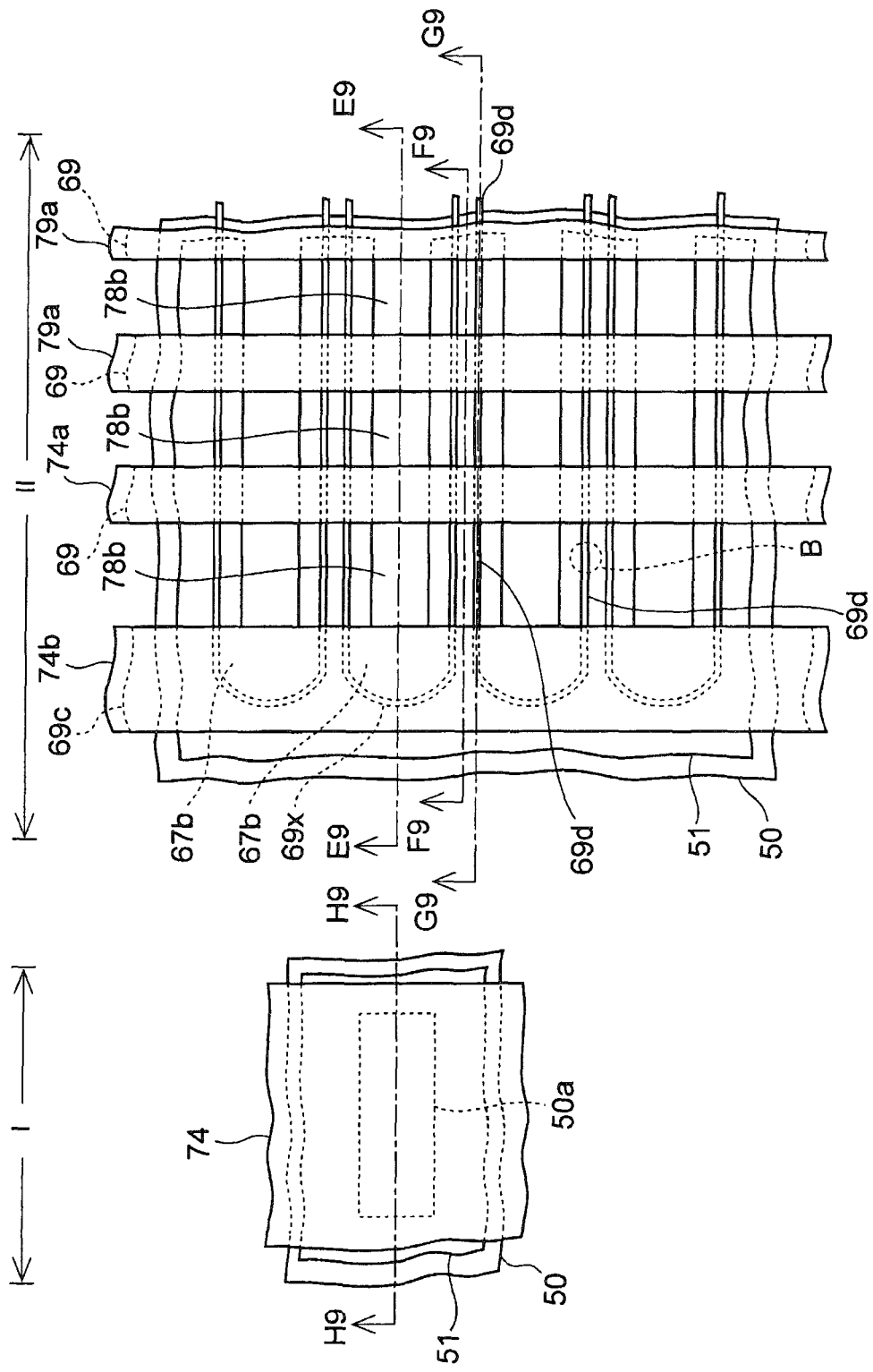

FIG. 12I is a plan view obtained after the above processes are finished. The first to third cross-sections of the cell region II in FIG. 11L correspond to the cross-sections taken along the lines E9-E9, F9-F9, and G9-G9 of FIG. 12I, respectively. The cross-sectional view of the peripheral circuit region I in FIG. 11L corresponds to the cross-sectional view taken along the line H9-H9 of FIG. 12I.

Next, processes for obtaining a cross-sectional structure shown in FIG. 11M will be described.

First, side surfaces of the floating gates 67a and the control gates 74a are thermally oxidized again to increase the film thickness of the thermal oxidation film 77 by 9.5 nm. Thereafter, a silicon nitride film is formed in both of the regions I and II by a plasma CVD method so that the thickness thereof on the flat surface of the silicon substrate 50 becomes about 115 nm. Then, the silicon nitride film is etched back by an RIE to be left, as a first insulating side walls 79, on the side surfaces of the dummy control gates 74b and the floating gates 67a.

Next, as shown in FIG. 11N, the entire upper surface of the silicon substrate 50 is coated with a photoresist. Then, the photoresist is exposed, and then developed to form a fourth resist pattern 80 having an electrode-like planar shape in the peripheral circuit region I.

Next, as shown in FIG. 11O, by an etching using the fourth resist pattern 80 as a mask, the second conductive films 74 in the peripheral circuit region I are patterned into first to tenth gate electrodes 74e to 74n for a peripheral transistor. Such an etching is performed by an RIE using, for example, a gas mixture of $Cl_2$ and $O_2$ as an etching gas.

Figure 12J:
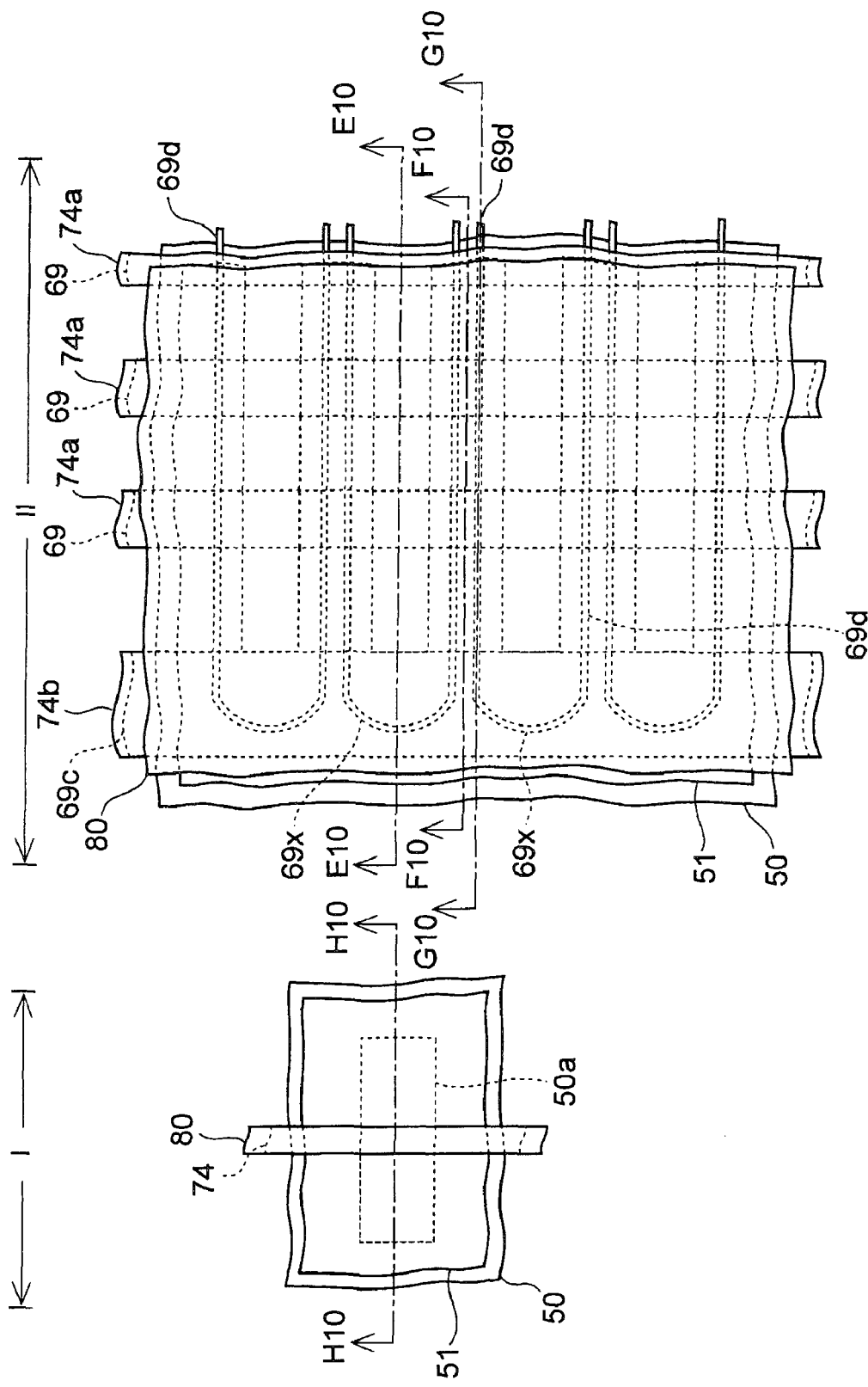

FIG. 12J is a plan view obtained after the above processes are finished. The first to third cross-sections of the cell region II in FIG. 11O correspond to the cross-sections taken along the lines E10-E10, F10-F10, and G10-G10 of FIG. 12J, respectively. The cross-sectional view of the peripheral circuit region I in FIG. 11O corresponds to the cross-sectional view taken along the line H10-H10 of FIG. 12J.

Thereafter, the fourth resist pattern 80 is removed.

Subsequently, as shown in FIG. 11P, an n-type impurity such as As or P is ion-implanted into the silicon substrate 50 using the first to tenth gate electrodes 74e to 74n as a mask, to form second to eighth n-type source/drain extension 78c to 78g. In the same way, a p-type impurity such as $BF_2$ is subsequently ion-implanted into the silicon substrate 50 to form first to fifth p-type source/drain extensions 78h to 78l. In this ion-implantation, the n-type impurity and the p-type impurity are separately implanted while using unillustrated resist patterns. This resist pattern is removed after all of the ion-implantations are finished.

Next, processes for obtaining a cross-sectional structure shown in FIG. 11Q will be described.

First, a silicon oxide film is formed on the entire upper surface by a CVD method using TEOS as a reaction gas so that the thickness thereof on the flat surface of the silicon substrate 50 becomes 100 nm. Thereafter, the silicon oxide film is etched back to form second insulating side walls 81 on the side surfaces of the first insulating side wall 79 and the first to tenth gate electrodes 74e to 74n.

In this etching back, the second insulating side walls 81 serves as a mask, so that the tunnel insulating film 52 is patterned. Thus, the tunnel insulating film 52 is left only under the floating gates 67a.

Furthermore, in the peripheral circuit region I, a portion of the gate insulating film 71 uncovered with the first to tenth gate electrodes 74e to 74n is removed.

Subsequently, as shown in FIG. 11R, first to sixth n-type source/drain regions 90b to 90g and first to fifth p-type source/drain regions 90h to 90l are formed by ion-implantation. In this ion-implantation, the second insulating side walls 81, the control gates 74a and the first to tenth gate electrodes 74e to 74n are used as masks. Furthermore, the n-type impurity and the p-type impurity are separately implanted by using unillustrated resist patterns in this ion-implantation. This resist pattern is removed after the ion-implantations are finished.

The ion-implantation conditions are not particularly limited. In the present embodiment, a $p^+$ ion is employed as an n-type impurity, and is ion-implanted under the conditions of acceleration energy of 10 KeV and a dose amount of $6.0 \times 10^{15}$ $cm^{-2}$. Furthermore, a $B^+$ ion is employed as an p-type impurity, and is ion-implanted under the conditions of acceleration energy of 5 KeV and a dose amount of $4.0 \times 10^{15}$ $cm^{-2}$. In this ion-implantation, the $B^+$ ions are introduced into the gate electrodes (the third, fourth, sixth, ninth, and tenth gate electrodes 74g, 74h, 74j, 74m, and 74n) of a p-type MOS transistor to cause the conductivity of these electrodes to p-type.

By the processes described so far, an n-type MOS transistor $TR_n$ (Low Vth), $TR_n$ (High Vth), a p-type MOS transistor $TR_p$ (Low Vth), and $TR_p$ (High Vth), which constitute a logic circuit such as a sense amplifier, are formed respectively in the high voltage transistor formation region $I_H$ and the low voltage transistor formation region $I_L$. "Low Vth" and "High Vth" given to the transistors indicate the level of the threshold voltage of the transistor.

The use of such a mixed system of high and low threshold voltage transistors allows a circuit to be operated at a high speed by using a low threshold voltage transistor, and also prevents a current from leaking in a stand-by state by getting the low threshold voltage transistor turned off and by alternatively using a high threshold voltage transistor.

Among the above transistors, the one formed in the high voltage transistor formation region $I_H$ is to be used as a high voltage transistor in which 5V is applied to the gate electrode, whereas the one formed in the low voltage transistor formation region $I_L$ is to be used as a low voltage transistor in which 1.2V is applied.

Moreover, in the medium voltage transistor formation region $I_M$, an n-type MOS transistor TR, and a p-type MOS transistor $TR_p$ in which 3.3V is applied to their gate electrodes are formed.

On the other hand, in the cell region II, a flash memory cell FL constructed from the control gate 74a, the intermediate insulating film 69, the floating gate 67a, the tunnel insulating film 52, and the first n-type source/drain region 90b is formed.

In the present embodiment, ten MOS transistors formed in the peripheral circuit region I configure the main module of a logic circuit. The input-output in the cell region II is controlled by these transistors.

Figure 12K:
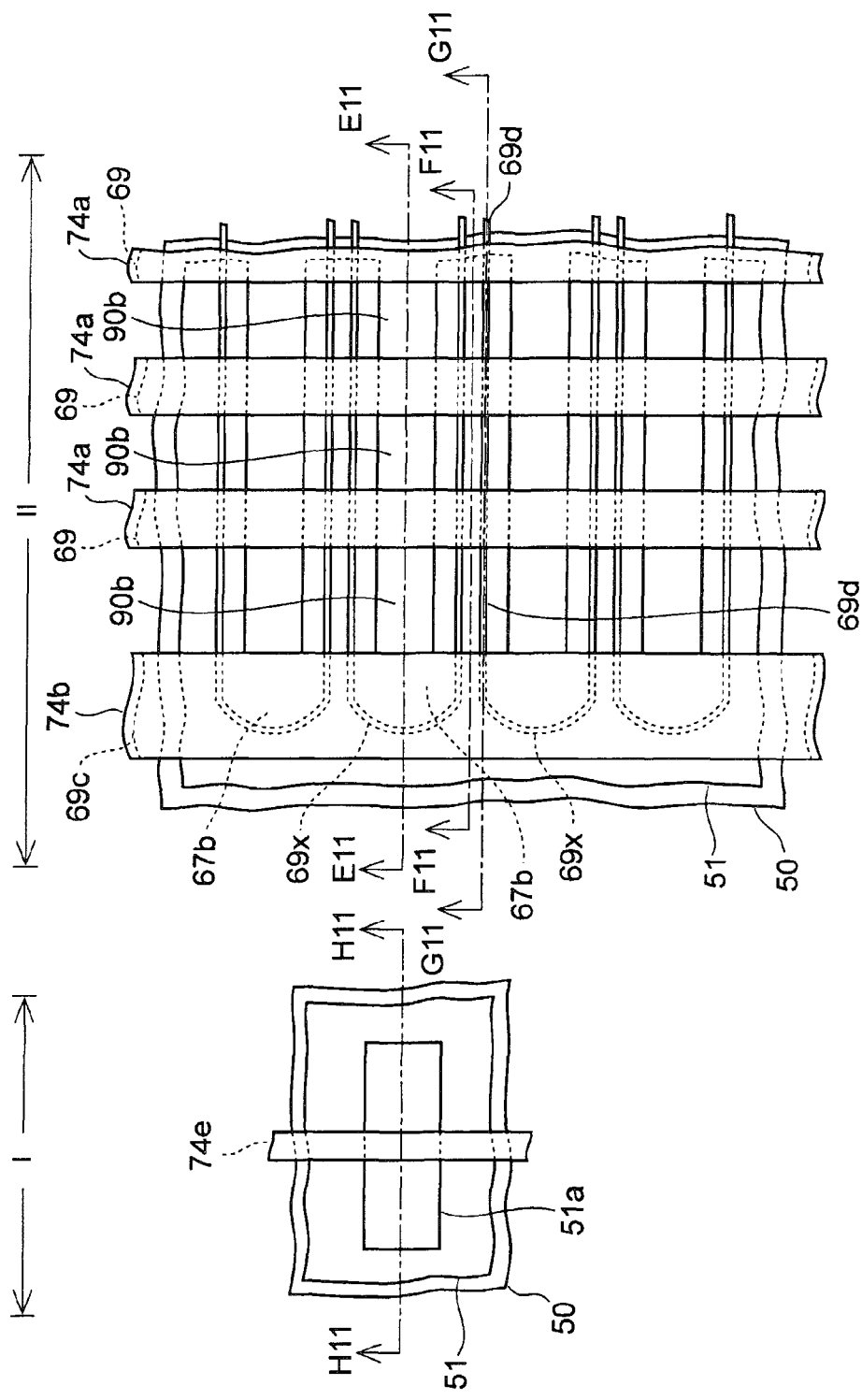

FIG. 12K is a plan view obtained after the above processes are finished. The first to third cross-sections of the cell region II in FIG. 11R correspond to the cross-sections taken along the lines E11-E11, F11-F11, and G11-G11 of FIG. 12K, respectively. The cross-sectional view of the peripheral circuit region I in FIG. 11R corresponds to the cross-sectional view taken along the line H11-H11 of FIG. 12K.

Next, processes for obtaining a cross-sectional structure shown in FIG. 11S will be described.

Firstly, a cobalt film with a thickness of 8 nm and a titanium nitride (TiN) film with a thickness of 10 nm are formed in this order on the entire upper surface of the silicon substrate 50 by a sputtering method. Subsequently, the cobalt film and the titanium nitride film are annealed to be reacted with silicon by an RTA (Rapid Thermal Anneal), by employing the annealing conditions of a substrate temperature of about 550° C. and a processing time of about 0.5 minutes. Then, the cobalt film and titanium nitride film left unreacted on the device isolation insulating film 51 and the like are wet-etched to be removed using a mixture solution of an APM and an SPM as an etching solution. As a result, a cobalt silicide layer 92 is left on the surface layer of the silicon substrate 50. The above-described APM means a mixture solution of pure water, hydrogen peroxide solution, and $NH_4OH$, whereas the SPM means a mixture solution of sulfuric acid and hydrogen peroxide solution.

The cobalt silicide layer 92 is also formed on the upper surfaces of the first to tenth gate electrodes 74e to 74n. Consequently, the first to tenth gate electrodes 74e to 74n have a salicide structure.

Thereafter, the cobalt silicide layer 92 is annealed again by an RTA method, so that the resistance of the cobalt silicide layer 92 is lowered. The RTA processing conditions are not particularly limited. In this embodiment, a substrate temperature of 800° C. and a processing time of 0.5 minutes are employed.

Note that another refractory silicide layer such as a nickel silicide layer may be formed in place of the cobalt silicide layer 92.

Next, processes for obtaining a cross-sectional structure shown in FIG. 11T will be described.

First, a silicon nitride film with a thickness of approximately 70 nm is formed on the entire upper surface of the silicon substrate 50 by a CVD method. The silicon nitride film thus formed is used as an etching stopper film 93. Subsequently, a silicon oxide film as an interlayer insulating film 94 is formed on the etching stopper film 93 by the CVD method.

Thereafter, the upper surface of the interlayer insulating film 94 is polished to be planarized by a CMP (Chemical Mechanical Polishing) method. As a result of the planarization, the total thickness of the etching stopper film 93 and the interlayer insulating film 94 is about 600 nm on the flat surface of the silicon substrate 50. Thereafter, the interlayer insulating film 94 and the etching stopper film 93 are patterned by photolithography to form a contact hole in each of the source/drain regions 90b to 90l.

This photolithography is performed by two steps. In the first step, the interlayer insulating film 94 is selectively etched using the etching stopper film 93 as a stopper. In the second step, the etching stopper film 93 is selectively etched by changing the etching gas from that of the first step, while the cobalt silicide layer 92 (see FIG. 11P) is used as a stopper.

Then, a Ti film and a TiN film are formed in this order as a glue film on the inner surfaces of the contact holes and on the upper surface of the interlayer insulating film 94 by a sputtering method. Next, a W (tungsten) film is formed on the glue film by the CVD method using tungsten hexafluoride as a reaction gas to completely fill the contact holes. The excessive W film and glue film which are formed on the upper surface of the interlayer insulating film 94 are then removed by the CMP method to be left only in the contact holes as conductive plugs 96.

Figure 12L:
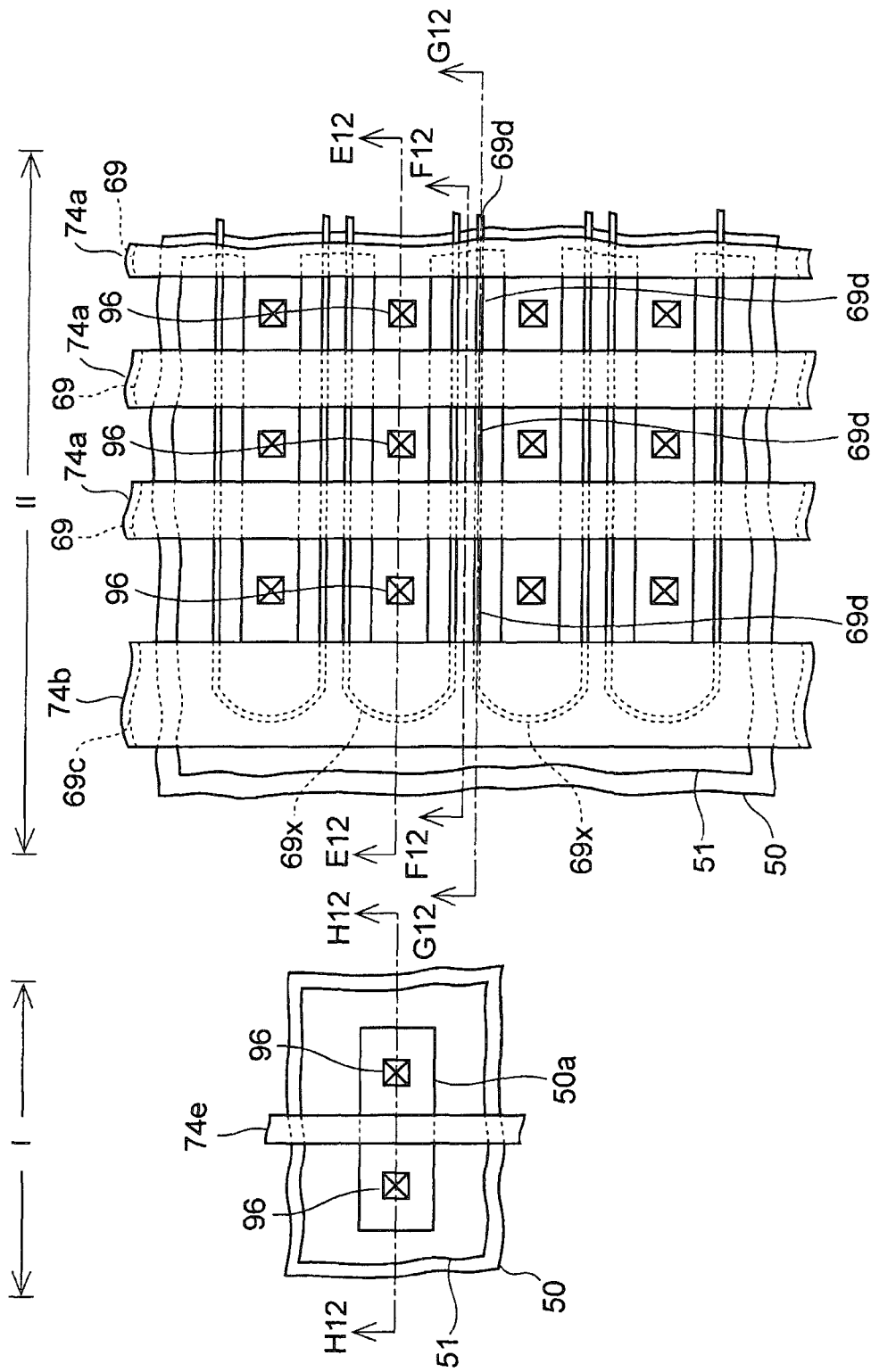

FIG. 12L is a plan view obtained after the above processes are finished. The first to third cross-sections of the cell region II in FIG. 11T correspond to the cross-sections taken along the lines E12-E12, F12-F12, and G12-G12 of FIG. 12L, respectively. The cross-sectional view of the peripheral circuit region I in FIG. 11T corresponds to the cross-sectional view taken along the line H12-H12 of FIG. 12L.

Thereafter, the process proceeds to a step in which a first layer metal wiring is formed on the interlayer insulating film 94 (see FIG. 11T). The detailed description thereof is omitted here. Of metal wirings formed in such a manner, the one electrically connected with the two first n-type source/drains 90b of the flash memory cell FL functions as a bit line (BL) and a source line (SL) respectively of a NAND type flash memory, for example.

By the processes described so far, the basic structure of the semiconductor device according to the present embodiment is completed.

According to the present embodiment, the photoresist is exposed using the reticle 105 described in FIG. 7 to form the first resist pattern 68 having a planar shape shown in FIG. 12B.

As described in FIG. 7, the reticle 105 has two narrow width portions 104, the widths of which become smaller in a stepwise fashion toward the end. This allows an amount of deformation of the projected image of the light-shielding pattern 102 due to the optical proximity effect to be smaller. Consequently, a focus margin in an exposing apparatus can be increased. In other words, a defocusing, by which the projected images are independent of each other without being connected with each other, can be increased.

Therefore, as shown in FIG. 12B, even when the focus is somewhat defocused in the above exposing apparatus, the multiple first resist patterns 68 formed using the reticle 105 are independently formed at a distance from each other. Accordingly, the first conductive films 67 (see FIG. 12C), which are patterned using the first resist patterns 68 as a mask, are also spaced apart from each other.

As a result, as shown in FIG. 12I, the planar shape of the fence 69d of the interlayer insulating film 69 is approximately linear between the dummy control gate 74b and the real control gate 13a, i.e., in a dotted-line circle B of FIG. 12I. Consequently, a transition from a straight line to a curved line shown in the dotted-line circle A of FIG. 2K is not formed in the fence 69d.

As described in the preliminary explanation, the presence of the transition from a straight line to a curved line in the fence 69d raises a problem that the fence 69d in the above area is easily peeled off.

In contrast, in the present embodiment, such a transition part is not present. Therefore, the fence 69d can effectively be prevented from being peeled off in the process. Accordingly, a trouble, such as a pattern defect seen when the fence 69d is peeled off, can be prevented from occurring, resulting in the increase in the production yield of a semiconductor device.

Furthermore, in the present embodiment, as shown in FIG. 12I, the step portion 69x of the segment 69c rounded due to the optical proximity effect is covered with the dummy control gate 74b.

According to this, the dummy control gate 74b functions as an etching mask in patterning the intermediate insulating film 69 in the step of FIG. 11J. Therefore, the step portion 69x does not become a fence. Accordingly, a curved fence which tends to be peeled off is not formed at the end of the cell region II.

Consequently, reduction in the production yield of a semiconductor device due to the fence can further be prevented.

Although the embodiments are described above in detail, the present invention is not limited to the above embodiments.

For example, in FIGS. 3, 5, and 7, the half tone type reticles 100, 103 and 105 are described. However, a binary type reticle having a light-shielding film made of chromium and the like may be used in place of these reticles.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:

defining a plurality of stripe-shaped active regions, which are arranged in parallel with each other in the semiconductor substrate, by forming a device isolation insulating film on the semiconductor substrate, the active regions being formed at a distance from each other;

forming a tunnel insulating film on the semiconductor substrate in the active region;

forming a first conductive film on the tunnel insulating film and the device isolation insulating film;

coating a photoresist on the first conductive film;

exposing the photoresist by using an exposure mask in which a plurality of stripe-shaped light-shielding patterns are formed on a transparent substrate, where the light-shielding patterns being formed in parallel with each other, and the light-shielding patterns having two or more narrow width portions that becomes smaller in a stepwise fashion toward an end;

developing the photoresist to form a plurality of stripe-shaped resist patterns, the resist patterns being formed at a distance from each other, and the resist pattern encompassing the corresponding active region;

selectively etching the first conductive film using the resist patterns as a mask;

removing the resist pattern;

forming an intermediate insulating film on the device isolation insulating film and the first conductive film after removing the resist pattern;

forming a second conductive film on the intermediate insulating film; and patterning the first conductive film, the intermediate insulating film, and the second conductive film to form a flash memory cell that is made by forming the tunnel insulating film, a floating gate, the intermediate insulating film, and control gate in this order on the active region, and to form a structure that is made by forming the island-like lower conductor pattern, a segment of the intermediate insulating film, and a dummy conductor pattern in this order on the device isolation insulating film at an end of the active region.

2. The method of manufacturing a semiconductor device according to claim 1, wherein the formation of the flash memory cell and the structure comprises:

a first etching of selectively etching and removing a portion of the second conductive film which is not to be patterned into the control gate and the dummy conductor pattern;

a second etching of selectively etching and removing the intermediate insulating film formed on the upper surface of the first conductive film between the control gate and the dummy conductor pattern; and a third etching of selectively etching and removing the first conductive film between the control gate and the dummy conductor pattern after the intermediate insulating film is etched, the third etching being performed using an etchant by which an etching rate of the intermediate insulating film becomes slower than an etching rate of the second conductive film.

3. The method of manufacturing a semiconductor device according to claim 2, wherein a gas mixture of $Cl_2$ and $O_2$ is used as the etchant used in the third etching;

a polysilicon film is employed as the first conductive film; and an ONO film is employed as the intermediate insulating film.

4. The method of manufacturing a semiconductor device according to claim 1, wherein, when forming the flash memory cell and the structure, the control gate and the dummy conductor pattern are formed in a stripe shape extending in parallel with each other in the direction perpendicular to a direction in which the active region extend.

5. The method of manufacturing a semiconductor device according to claim 4, wherein, when forming the flash memory cell and the structure, the dummy conductor pattern is formed so that the long side thereof near the control gate is positioned to intersect the narrow width portion of the light-shielding pattern.

6. The method of manufacturing a semiconductor device according to claim 1, wherein, when forming the flash memory cell and the structure, the dummy conductor pattern is formed so as to encompass the lower conductor patterns.

7. The method of manufacturing a semiconductor device according to claim 1, wherein, when exposing the photoresist, a focus in an exposure apparatus is set within a range of defocusing which does not allow the projected images of the light-shielding pattern to be connected with each other.

8. The method of manufacturing a semiconductor device according to claim 1, wherein a polysilicon film is employed as the first conductive film.

* * * * *